(12) United States Patent
Ohmi et al.

(10) Patent No.: US 6,949,478 B2
(45) Date of Patent: Sep. 27, 2005

(54) OXIDE FILM FORMING METHOD

(76) Inventors: Tadahiro Ohmi, 1-14-301,
Komegabukuro, Aoba-ku, Sendai-shi,
Miyagi-ken 980 (JP); Takashi Imaoka,
c/o Department of Electronics Faculty
of Engineering Tohoku University,
Aza-Aoba, Aramaki, Aoba-ku,
Miyagi-ken 980 (JP); **Hisayuki
Shimada**, c/o Department of Electronics
Faculty of Engineering Tohoku
University, Aza-Aoba, Aramaki,
Aoba-ku, Sendai-shi, Miyagi-ken 980
(JP); Nobuhiro Konishi, c/o
Department of Electronics Faculty of
Engineering Tohoku University,
Aza-Aoba, Aramaki, Aoba-ku,
Sendai-shi, Miyagi-ken 980 (JP);
Mizuho Morita, c/o Department of
Electronics Faculty of Engineering
Tohoku University, Aza-Aoba, Aramaki,
Aoba-ku, Sendai-shi, Miyagi-ken 980
(JP); Takeo Yamashita, c/o Department
of Electronics Faculty of Engineering
Tohoku University, Aza-Aoba, Aramaki,
Aoba-ku, Sendai-shi, Miyagi-ken 980
(JP); Tadashi Shibata, 5-2, Nihondaira,
Taihaku-ku, Sendai-shi, Miyagi-ken 980
(JP); Hidetoshi Wakamatsu, c/o
Department of Electronics Faculty of
Engineering Tohoku University,
Aza-Aoba, Aramaki, Aoba-ku,
Sendai-shi, Miyagi-ken 980 (JP); **Jinzo
Watanabe**, c/o Department of
Electronics Facultyof Engineering
Tohoku University, Aza-Aoba, Aramaki,
Aoba-ku, Sendai-shi, Miyagi-ken 980
(JP); Shintaro Aoyama, c/o Department
of Electronics Faculty of Engineering
Tohoku University, Aza-Aoba, Aramaki,
Aoba-ku, Sendai-shi, Miyagi-ken 980
(JP); Masakazu Nakamura, c/o
Department of Electronics Faculty of
Engineering Tohoku University,
Aza-Aoba, Aramaki, Aobu-ku,
Sendai-shi, Miyagi-ken 980 (JP)

( * ) Notice: Subject to any disclaimer, the term of this patent is extended or adjusted under 35 U.S.C. 154(b) by 0 days.

(21) Appl. No.: 10/120,628

(22) Filed: Apr. 11, 2002

(65) Prior Publication Data

US 2003/0073278 A1 Apr. 17, 2003

Related U.S. Application Data

(63) Continuation of application No. 08/196,235, filed on Mar. 23, 1994, now abandoned.

(30) Foreign Application Priority Data

| Aug. 19, 1991 | (JP) | 3-230939 |
| Aug. 20, 1991 | (JP) | 3-232271 |
| Aug. 20, 1991 | (JP) | 3-232272 |
| Aug. 20, 1991 | (JP) | 3-232273 |
| Aug. 20, 1991 | (JP) | 3-232274 |
| Aug. 20, 1991 | (JP) | 3-232275 |
| Aug. 20, 1991 | (JP) | 3-232276 |
| Aug. 20, 1991 | (JP) | 3-232277 |
| Aug. 20, 1991 | (JP) | 3-232278 |
| Aug. 20, 1991 | (JP) | 3-232279 |
| Aug. 20, 1991 | (JP) | 3-232280 |
| Aug. 26, 1991 | (JP) | 3-238646 |

(51) Int. Cl.$^7$ ............................................. H01L 21/31
(52) U.S. Cl. ...................... 438/774; 438/799; 438/903
(58) Field of Search ................................. 438/773, 774, 438/795, 798, 799, 903

(56) References Cited

U.S. PATENT DOCUMENTS

| 3,652,331 A | 3/1972 | Yamasaki | 438/903 |
| 4,104,086 A | 8/1978 | Bonour et al. | 438/978 |
| 4,149,905 A | 4/1979 | Levinstein et al. | 438/477 |
| 4,409,260 A | 10/1983 | Pastor et al. | 438/774 |
| 4,526,629 A | 7/1985 | Latta et al. | 438/785 |

| | | | | | |
|---|---|---|---|---|---|
| 4,894,353 A | 1/1990 | Ibok ............................ 438/774 | JP | 1-49004 | 10/1989 |
| 4,901,133 A | 2/1990 | Curran et al. ................ 257/637 | JP | 3-122514 | 5/1991 |
| 6,146,135 A | 11/2000 | Watanabe et al. ............ 432/221 | JP | 3-133044 | 6/1991 |
| | | | JP | 5195574 | 6/1993 |

FOREIGN PATENT DOCUMENTS

| | | |
|---|---|---|
| JP | 38-19828 | 9/1963 |
| JP | 52-77792 | 6/1977 |
| JP | 0102676 | 9/1978 |
| JP | 3-125428 | 5/1981 |
| JP | 58-158930 | 9/1983 |
| JP | 59-110784 | 6/1984 |
| JP | 60-3121 | 1/1985 |
| JP | 53388-1984 | 11/1985 |
| JP | 61-160943 | 7/1986 |
| JP | 61-216318 | 9/1986 |
| JP | 61-141144 | 12/1986 |
| JP | 62-22527 | 5/1987 |
| JP | 63-72877 | 4/1988 |
| JP | 63-124423 | 5/1988 |
| JP | 63-177425 | 7/1988 |
| JP | 1-150328 | 6/1989 |
| JP | 1-195630 | 8/1989 |

OTHER PUBLICATIONS

Wolf, "Silicon Processing for VLSI Era", 1986, vol. 1, pp. 166–167.*

* cited by examiner

*Primary Examiner*—Chandra Chaudhari
(74) *Attorney, Agent, or Firm*—Randall J. Kluth

(57) ABSTRACT

A method of forming an oxide film having high insularity capability is performed within an ultra clean environment, using charged particles.

18 Claims, 47 Drawing Sheets

PRIOR ART

PRIOR ART

Fig 3-4
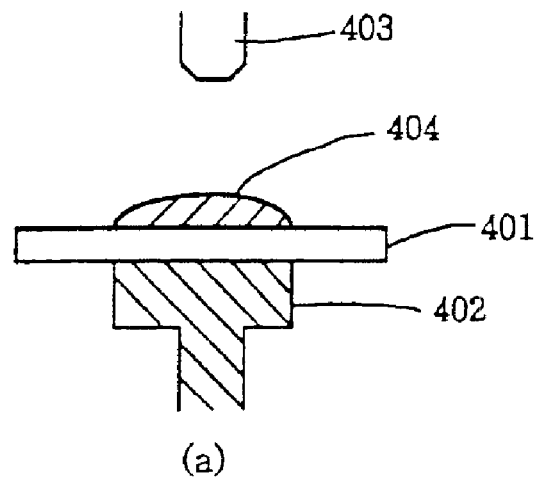
(a)
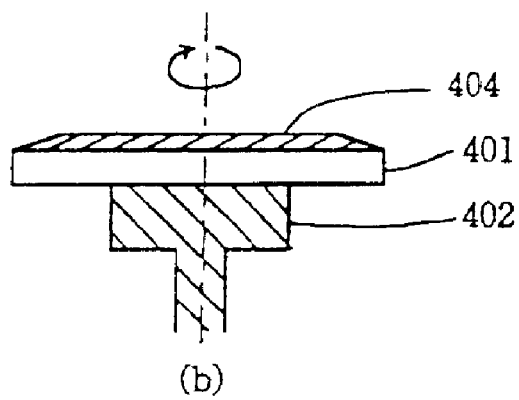
(b)
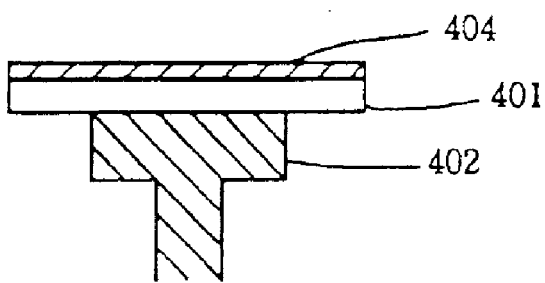
(c)

PRIOR ART

Dielectrically Broken in the Electric Field (MV/cm)

PRIOR ART

PRIOR ART

PRIOR ART

PRIOR ART

PRIOR ART

OXIDE FILM FORMING METHOD

RELATED APPLICATIONS

This is a continuation application of U.S. application Ser. No. 08/196,235 filed Mar. 23, 1994 now abandoned.

BACKGROUND OF THE INVENTION

1. Field of the Invention.

The present invention relates to an oxide film forming method, a gas drier, a rotating coater, a vacuum treatment apparatus, a heat treatment apparatus, a charged particle flow irradiating apparatus, a plasma treatment apparatus, an electrostatic absorber, an interatomic force microscope, an X-ray irradiating apparatus, and a clearing equipment.

2. Description of the Related Art.

(Oxide Film Forming Method)

Reference is made to the prior art in this field, in particular, to the use of silicon substrates as the substrate body.

As one of the methods of forming an oxide film on a surface of a silicon substrate, the so-called thermally oxidizing method has been known.

In this method, after a natural oxide film is removed by contacting fluoric acid solution to a silicon substrate, the silicon substrate is cleaned with ultra pure water and dried, and then dry oxygen or dry oxygen mixed with an inert gas is contacted to the silicon substrate to form an oxide film.

In this method, which involves a process to heat a silicon substrate from a room temperature to a specified temperature required for oxidization, for instance, from 800° C. to 1000° C., an oxide film having a thickness, for instance, from 1.5 to 3.5 nm is formed. The oxide film formed in the heating process, however, is not fine. For this reason, as a percentage of a thickness of oxide film (formed until the silicon substrate is heated up to a specified temperature) against the total thickness of an oxide film (finally formed through all processing steps) is high, an oxide film having an excellent insulating capability is not formed, which is a deficiency needing to be overcome. A discussion is made hereinafter of the importance of an oxide film having a high insulating capability with reference to a case of forming a MOSLSI oxide film.

Progress in the field of LSI technology is very fast, and a DRAM having a storage capacity of 4M bit or more has been put into practical use. In order to manufacture such a high performance electronic device, namely a device having an ultra high degree of integrity, it is desirable to employ a high performance manufacturing process having a high degree of process controllability that is little affected by uncertain factors. One such example of a high performance manufacturing process is the ultra clean process.

For instance, cleaning the process atmosphere is required to form an oxide film having a high insulating capability for forming an oxide film only at a specified temperature, while suppressing formation of an oxide film while the silicon substrate is being heated for the purpose to form an oxide film having a high insulating capability. An inert gas or a bulk gas atmosphere without moisture or oxygen is required.

Also, cleaning the process atmosphere is required to reduce impurities taken into an oxide film when the oxide film is being formed. When a clean process atmosphere is used, a lap density in the oxide film and on an interface between the oxide film and the silicon is reduced, as well as realizing an electrically stable semiconductor device.

As described above, cleaning the process atmosphere is indispensable for realization of an ultra fine LSI.

It is an object of the present invention to provide an oxide film forming method enabling formation of an oxide film having a high insulating capability on a surface of a substrate body.

(Gas Drier)

Conventionally, the first to third technologies as described below are driers known to have been used to dry this type of object.

The first technology provides a spin drier, which dries an object needing to be dried by rotating the object at a high rotating speed for blowing away liquid adhered to a surface of the object. With this technology, it is possible to dry an object by also blowing away liquid deposited in very fine concave sections or a surface of the object, and it is also possible to prevent a natural oxide film from growing on a surface of the object (for instance, a silicon wafer) during the drying process by purging the inside of the device with nitrogen. Also, it is possible to prevent generation of static electricity due to a high speed rotation of an object being dried as well as to prevent minute particles from depositing on the object due to static electricity. Such prevention can be achieved by installing inside the device an ionizer with the electrode section coated with a ceramic material.

The second technology relates to an IPA vapor drier, which dries an object needing to be dried by heating IPA (Isopropyl Alcohol) inside the device to generate IPA vapor and replacing liquid (for instance, ultra pure water) deposited on a surface of the object being dried with the IPA which has a high volatility. As the IPA vapor can easily go into very fine concave sections on a surface of the object, it is possible to completely dry even the inside of very fine concave sections on a surface of the object. Also, the IPA has a function to remove static electricity. It not only removes static electricity on a surface of the object, but also suppresses generation of static electricity. As such, it is possible to suppress deposition due to static electricity of minute particles onto a surface of the object being dried.

The third technology relates to a non-reactive gas drier, which dries an object by blowing a gas not reacting with the object, onto a surface of the object to blow off liquid (for instance, ultra pure water) deposited on the surface. By reducing a quantity of moisture contained in a gas to an extremely small quantity (for instance, 1 ppb or below), it is possible to effectively remove residual absorptive molecules (for instance, water molecules) remaining on a surface of the object being dried. Also, by sealing the device against the external air and supplying an inert atmosphere gas into the device, it is possible to prevent a natural oxide film from being generated on a surface of the object (for instance, a silicon wafer) during such a process.

However, each of the conventional technologies described above has the following problems, respectively.

In the first technology, after liquid (for instance, ultra pure water) is blown off from a surface of an object to be dried, molecules of the liquid still remains on the surface of the object to be dried or have been absorbed into the object itself.

In the second technology described above, after liquid (for instance, ultra-pure water) deposited on a surface of an object to be dried has been replaced with the IPA vapor, IPA molecules and liquid molecules (for instance, molecules of water) remain on the surface of the object to be dried.

In the third technology above, static electricity is generated on a surface of an object to be dried due to friction between a surface of the object to be dried and a dry gas, and fine particles are easily deposited on that object surface.

It is an object of the present invention to provide a drier which can dry an object without leaving any remaining liquid, without causing a charge in quality such as growth of a natural oxide film on a surface of the object, and also without allowing generation of static electricity and deposition of fine particles on a surface of the object.

(Rotating Coater)

Conventionally, for instance, in a process to manufacture semiconductors, a technology to homogeneously spread various types of materials on a wafer surface by spreading a liquid material on a Si wafer and then removing the solvent by means of heating has been used in a wide range of applications. For instance, the photo resist used in a lithography process is the representative one. Also, such thin films as a $SiO_2$ film, PSG film, and AsSG film are formed by spreading each material dissolved in an inorganic or an organic solvent through rotation on a wafer and depositing the material on a surface of the wafer. In this process, a thin film such as a $SiO_2$ film can be formed at a low temperature, and this thin film has been used as an interlayer insulating film for multi-layered wiring or as an etching mask in a multi-layered photo resist process.

Next detailed are problems in the prior art, taking up a resist spreading process as an example, with reference to FIG. 3-3, and FIG. 3-4. FIG. 3 is a block diagram of a conventional type of rotating coater. The conventional type of resist spreader comprises a wafer holder 302 based on, for instance, a vacuum absorbing system to hold a sample 301 such as, for instance, a Si wafer, a nozzle 303 (a means for supplying a liquid material or a material behaving as a liquid to be spread) having a function to drip resist, and a vessel 304 with the above components provided therein. Herein, the wafer holder 302 has also a rotational function.

FIG. 3-4 shows a process to spread resist. Resist is dripped onto a surface of a wafer from a nozzle (a means for supplying a liquid or liquid like material to be spread) 403 (step a). The wafer holder 402 rotates, and resist 404 is spread due to the centrifugal force (step b). Furthermore, solvent in the resist is evaporated, and a homogeneous resist film is formed (step c). Then, a film thickness of the resist is decided according to such factors as r.p.m. of the wafer holder 402 and/or viscosity of the resist. If a resist having a viscosity of, for instance, 25 cp is dripped on a Si wafer and the Si wafer is rotated at the rotating speed of 4000 rpm for 40 sec, a film thickness of the resist becomes 1.25 $\mu$m. Also, in the conventional type of technology for spreading resist through rotation, the resist temperature, environmental temperature as well as environmental humidity inside the device is controlled to achieve homogeneity in the resist film thickness.

Generally, humidity in the device is from 40 to 50% like that in a clean room.

In the conventional type of device, however, particles are deposited on a wafer, in and on resist. Also, if resist is spread through rotation on an insulating material such as an oxide film, sometimes unevenness in spreading occurs, and the resist is not spread in some sections. This phenomenon occurs in spreading not only resist, but also $SiO_2$, PSG, and AsSG to form a thin film. So the present inventor investigates why the unevenness in spreading occurs on such a thin film as a resist film. As a result, the inventor obtained several reasons to guess that the unevenness in spreading may occur because a wafer is locally electrified due to friction between the wafer rotating at a high rotating speed of several thousand rpm and the resist and/or a gas inside a vessel and a repelling force is resultingly generated between the electrified portion of the wafer and the resist.

Real reasons for unevenness in spreading have not been found yet, and for this reason any countermeasures to prevent electrification in spreading resist through rotation to form, for instance, a resist film have not been taken at all.

The present invention was made in the light of the circumstances as described above, and it is an object of the present invention to provide a rotating spreader which can form a spread film with any particle deposited thereon and without generating unevenness in spreading on a surface of a sample.

(Vacuum Treatment Apparatus)

FIG. 4-4 shows configuration of a general vacuum carrier/treatment apparatus.

In FIG. 4-4, designated at the reference numeral 401 is a load/lock chamber, at 402 a carrier chamber, and at 403 a reaction chamber. These three chambers 401–403 are connected to each other in a form of chain. In an actual process, at first a wafer is put in a holder such as a cassette, then a door 404 is opened for setting under the atmospheric pressure, and then the door is closed. Then, air in the load/lock chamber 401 is discharged by a vacuum pump 405 to realize a vacuum of around $10^{-6}$ Torr therein. Then, also air in the carrier chamber 402 is discharged by a vacuum pump 408 to realize vacuum of around $10^{-8}$ Torr therein. A gate valve 407 provided between the load/lock chamber 401 and the carrier chamber 402 is then opened, the wafer is carried therethrough, and then the gate valve 407 is closed. Then, air in the reaction chamber 403 is discharged by a vacuum pump 408 to realize vacuum of around $10^{-10}$ Torr therein, a gate valve 409 provided between the carrier room 402 and the reaction chamber 403 is opened, and a wafer is carried therethrough. With the operations described above, the load/lock chamber 401 and the reaction chamber 403 in which the vacuum degree has been dropped relative to the atmospheric pressure are not directly exposed to the same atmosphere during transfer of a wafer, and a high vacuum degree can always be maintained in the reaction chamber 403. When a wafer is carried up to the reaction chamber 403, the gate valve 407 is closed, the reaction chamber 403 is sealed, and air in the reaction chamber is furthermore discharged by a vacuum chamber. In the state as described above, a specified gas is introduced into the reaction chamber 403 through, for instance, a gas pipe 410, to carry out processing.

When the process if finished, again the gate valve 409 is opened, and the wafer is carried to the carrier chamber 402. Then, after the gate valve 409 is closed to shut off the reaction chamber 403, the gate valve 407 is opener and the wafer is carried to the load/lock chamber 401.

After the wafer is carried to the load/lock chamber, the gate valve 407 is closed to shut off the carrier chamber 402 from the load/lock chamber 401. Then, a gas is introduced through a gas inlet port 411, air in the load/lock chamber 401 is leaked in to decrease the vacuum degree therein relative to the atmospheric pressure, and the wafer is taken out under the atmospheric pressure. Thus, when taking out a wafer from the load/lock chamber, a gas such as dry nitrogen gas or argon gas is introduced via leaking into the chamber.

In the conventional technology as described above, however, there is a big problem relating to leakage in the load/lock chamber. Namely, when, for instance, a dry nitrogen gas is introduced from a gas inlet port, particles rise up in the load/lock chamber and fall onto a wafer; and/or a wafer is electrified due to such causes as static electricity generated because of the nitrogen gas flow, and a large quantity of particles deposit on the wafer. For these reasons, in the conventional type of load/lock chamber, a wafer can be contaminated by deposited particles, and the yield caused to go down. It should be noted that, although various countermeasures such as decreasing a flow rate of nitrogen gas used for leaking in a chamber have been proposed to solve, for instance, such problems as electrification, electrification of a wafer is too effective for causing deposition of particles thereon. As such, the countermeasures have not been shown to be adequately effective.

(Heat Treatment Apparatus)

Conventionally, for instance, in a thermally oxidizing furnace, a gas mixture of oxygen, inert gas, or other gases is introduced into a furnace tube comprising a quartz tube heated by means of electric resistance heating method, and the gas mixture is brought into contact with a heated silicon substrate.

In this case, in order to form an oxide film having a high reliability, a furnace tube itself, in which an oxidizing reaction process is executed, must not be contaminated by particles, and the tube is required to be cleaned as much as possible.

Also, in order to manufacture electrically stable semiconductor devices by reducing defects of an interface between an oxide film and a silicon substrate, it is necessary to reduce a number of particles deposited on the silicon substrate as much as possible.

Thus, ultra cleaning in the atmosphere for a heat treatment process is indispensable for realization of ultra fine LSI.

In the conventional type of apparatus, however, gas introduced therein flows, contacting a quartz tube, which is an insulating body, and a quartz susceptor holding a silicon substrate. The quartz tube and the quartz susceptor are electrified, and a number of particles are deposited thereon. Such particles can potentially contaminate the silicon substrate. Also, when a silicon substrate is carried into or out from the furnace tube, or during a reaction, the silicon substrate itself contacts the gas, so that particles may easily deposit on the silicon substrate.

The present invention was made in the light of the circumstance described above, and it is an object of the present invention to provide heat treatment apparatus which can form an oxide film having a high reliability and execute such processings as an oxidizing reaction.

(Charged-particle Flow Irradiating Apparatus)

The technology of irradiating charged particles such as electrons or ions onto a surface of a sample has been widely used for such purposes as analysis of the sample or production of semiconductors. For instance, as a device for irradiating electrons, a scanning electron microscope (SEM) or an electron beam direct drawing apparatus (EB) has been known.

The former is an analyzer used to observe a state of a sample's surface in detail, while the latter is a device for forming fine patterns with resist.

Description is made for a SEM based on the conventional configuration with reference to FIG. 6-4. In this figure, the reference numeral 401 indicates an electron gun, and electrons generated therein form an electron beam 402, which is a flow of charged particles. These electrons are accelerated to about 50 KeV, being irradiated onto a sample.

When the electron beam 402 is irradiated onto a surface of a sample, secondary electrons 402 are released from a surface of the sample 404. The secondary electrons are detected by a detector 407. As the efficiency of releasing the secondary electrons changes according to irregularity of the surface of the sample 404, so it is possible to observe a state of the sample's surface.

Next a description is made for an ion implanter having a conventional configuration.

FIG. 6-5 is a cross sectional view of a MOS transistor, illustrating a state where a source 502 and a drain 503 for MOSFET is formed by implanting As ions 501 by means of ion implantation.

The ion beam is also applied to a gate electrode 504, but the gate electrode 504 is separated with a gate insulating material 505 from a silicon substrate 506, so that an electric charge can not escape therefrom.

In a SEM having the configuration as described above, electrons each having a negative charge are irradiated onto a surface of a sample, so the sample is electrified. This electrification disadvantageously gives effects over the incoming electrons or the secondary electrons.

As a result, various problems occur, and a resolution of an insulating body can not be raised in a SEM, and also high pattern precision can not be obtained in an electronic beam exposing apparatus. For instance, if the sample 403 is a Si wafer, and the surface 404 is a $SiO_2$ film having a thickness of 1000 Å, negative electric charge 408 is accumulated on a surface of the $SiO_2$ film when the electron beam 402 is applied to the surface. As the $SiO_2$ film is an insulating film, the negative electric charge generates a new electric line of force on the sample's surface 404. Various effects, including a curved orbit trail of the incoming electrons 402 or secondary electrons 405, occur due to the influence by this electric line of force (electric field). When electrification as described above occurs, a precision of observable images remarkably drops. Concretely, a phenomenon that an object pattern looks blurred and white occurs on a screen.

Conventionally, as a means to overcome the problems as described above, such a method as thin depositing metal such as gold (Au) on a surface of an insulating material sample has been employed, but in this case what is observed is not a surface of the sample itself, but that of the gold thin film. Accordingly, observation at a high precision is difficult. As gold acts as an impurity to a wafer in process, the material can not be used after being treated with gold.

However, as the substrate 506 is directly grounded, a large electric field is generated in the gate insulating film 506, which causes such problems as breakage of insulation or deterioration of characteristics of the insulating material.

When taking into consideration that the field of ultra LSIs is becoming increasingly fine and minute, this problem is very serious. The method of using gold deposition to prevent this phenomenon can not be employed because the gold seriously contaminates of the wafers.

This problem caused by electrification occurs in an apparatus in which an electron beam is used, such as a scanning electron microscope (SEM) or an electron beam direct drawing apparatus (EB), or in an apparatus, in which an ion beam is used, such as an ion implanter or a secondary ion mass analyzer.

The present invention was made in the light of the circumstances as described above, and it is an object of the present invention to provide a charged particle flow irradiating apparatus which can prevent electrification of a surface of an insulating material sample.

(Plasma Treatment Apparatus)

In recent years, the degree of integration in LSI has been becoming higher and higher, and active efforts are now made to realize a chip having a size of 1 μm to 0.5 μm or below.

In order to precisely control dimensions of fine chips and to improve the characteristics as well as reliability of the chip as much as possible, it is very important to improve not only the fine manufacturing technology, but also to upgrade various types of materials (such as semiconductor wafers, insulating materials, and metallic thin films) used for production of semiconductor devices.

For this reason, in a process to manufacture ultra LSIs, the importance of using such a thin film forming as etching using electric discharge such as a RIE (reactive Ion Etching) method, a bias sputtering method, or a plasma CVD (Chemical Vapor Deposition) method has increased. A feature of these processes consists in a fact that ions are accelerated by making use of a voltage difference generated between plasma and a wafer and are then irradiated onto a wafer surface. The directivity in etching or qualitative improvement of a grown film is realized by making use of the associated kinetic energy. For this reason, the most important factors in the process as described above include not only a voltage difference between a plasma and a wafer when the plasma is stable but also a voltage in the wafer immediately after the voltage difference between a plasma just generated and a wafer and the plasma has disappeared. A key in the process is to accurately and precisely control these factors.

However, in a currently available process making use of plasma, control over a voltage difference between plasma and a wafer immediately after plasma is generated and control of wafer voltage immediate after the plasma disappeared are extremely inadequate.

Next, a description is made for problems generated when a semiconductor wafer produced by using the conventional technology hereinafter, taking up a case where a silicon thin film is grown by means of the bias sputtering technology.

FIG. 7-3 as a schematic drawing of a bias sputtering device based on a combination of RF and DC. A feature of this device is that argon gas is set in a range from a couple of cc/min to 1000 cc/min and introduced therein through the gas inlet port 302 into the depressurizable vessel 301 to which a vacuum evacuating device having an evacuating speed of 1000 l/sec is connected. In this process, a pressure in the vessel 301 is maintained in a range of several mTorr to 30 mTorr. Plasma is generated by supplying a high-frequency power in a range from several watts to 300 watts and causing argon gas introduced into the vessel 301 to efficiently discharge electricity. To form the Si thin film 309, argon ions (Ar⁻ ions), generated by plasma making use of a voltage difference between a plasma and the target 306, are irradiated onto silicon (Si) target 306 held on the upper electrode 305, and the target 306 is sputtered by making use of the kinetic energy. Si atoms, generated by means of sputtering, run onto a surface of the Si substrate 308 held on the lower electrode and are absorbed in the Si substrate because of the voltage difference generated between the plasma and the silicon substrate.

Resultingly, the silicon thin film 309 is grown. Voltage in the target can be set to an arbitrary value by the DC power source 310, and the target 306 is sputtered efficiently, in practice, by setting the voltage in a range from several V to 1000 V. Also, a voltage in the Si substrate 308 can be set and adjusted by a DC current source 311, a surface of the Si thin film 309 can be sputtered with Ar⁻ ions again by adjusting the voltage in the Si substrate in an appropriate positive value to a negative value, according to the necessity.

However, there are the following problems relating to the conventional technology described above.

As a preprocessing for forming a silicon thin film on a silicon substrate, when a surface of a silicon substrate is cleaned by making use of plasma, it is necessary to maintain a pressure of Ar gas in a depressurizable vessel, for instance, at 5 mTorr and to generate a plasma by setting a high-frequency power with a 100 MHz high-frequency power source. Then a voltage difference between the plasma and the Si substrate is, for instance, 10 V, and a voltage difference between the plasma and the target is, for instance, 40 V.

Under the lower pressure and lower power as conditions for generating plasma, plasma is not generated easily. For this reason, it is necessary to change the initial conditions for generating plasma. If the Ar gas pressure in the depressurizable vessel is raised up to, for instance, 10 mTorr and moreover the high-frequency power is raised up to, for instance, 50 watts, then plasma is easily generated. Then, a voltage difference between the plasma and the Si substrate is, for instance, 30 V, and a voltage difference between the plasma and the target is, for instance, 70 V. When plasma is generated, the initial conditions of Ar gas pressure of 5 mTorr and high-frequency power of 10 watts, which are conditions for cleaning the surface, are immediately restored. As described above, under the initial conditions including a lower pressure and a lower power for generating plasma, plasma is hardly generated.

As such, it is necessary to change the conditions to those under which plasma is easily generated and then return the conditions to the original ones after plasma is generated. In a plasma, if a high-frequency electric field exists between opposing electrodes in a depressurizable vessel into which Ar gas has been introduced, an extremely small number of electrically charged particles existing in the peripheral gas (i.e., Ar gas) are accelerated, execute reciprocal movement between the electrodes, and repeat collision and electrolytic dissociation with neutral atoms or molecules in the gas, so that a number of charged particles rapidly increases, eventually dielectric breakdown occurs, and electric discharge is executed, resulting in a plasma being generated.

When the gas pressure is low, an average free travel of, for instance, electrons in the gas becomes longer, and acceleration in the electric field becomes large. As times of electrons' collisions between the electrodes decrease, so that collision and electrolytic dissociation become are not performed so actively, an electric discharge is hardly generated. For this reason, if a pressure and a power, both of which are conditions for generating plasma, are low, it is required to temporally raise the pressure as well as the power to a high level. When plasma is generated as described above, it is impossible to remove impurities (such as a natural oxide film, oxygen, carbon, and heavy metal) absorbed in or deposited on a surface of a Si substrate. Also, plasma damages are created on the surface of the Si substrate, which in turn results in degradation of a Si thin film's quality. Also, for instance, in case of such a device as a sheet treatment apparatus, a long time is required for processing each sheet, and it is hard to raise the throughput. Further, if a semiconductor device is produced with a Si thin film having a poor quality and a Si substrate with plasma damages therein, a LSI requiring a high speed operation can not work at a required high speed, and also the reliability drops.

Additionally, if plasma processing is executed under a low pressure, space distribution of a plasma becomes more homogeneous, and also an average free travel of ions becomes longer, so reproducibility of homogeneity in film quality becomes higher when producing a thin film. Also, it becomes possible to carry out homogeneous etching with high aspect ratio in isotropic etching by means of the RIE method. However, when a plasma is generated under a low pressure, as the plasma is generated only for a short period of time, if the pressure is raised to a higher level for processing, the plasma space distribution becomes nonhomogeneous. Consequently, a high quality thin film can not be produced, nor can etching be reproduced with high homogeneity. Furthermore, if the Si substrate, itself held on an electrode in a depressurizable vessel, has been electrified before a plasma is generated, once a plasma is generated, a voltage difference between the plasma and the Si substrate is not adjusted to a constant value which is equal to a sum of a DC voltage supplied from the outside and the plasma voltage. As a result, a quality of the Si thin film may become poor.

Also, if a Si film is formed on a Si substrate under certain desirable conditions for plasma generation, when a supply of high-frequency power is stopped and a plasma is caused to disappear after a Si thin film has been formed, a surface of the Si thin film would have been electrified by ions cr electrons in the plasma, and plasma damages would have been generated due to this electrification and the plasma damages would remain in the formed Si thin film.

Additionally, if a surface of the Si thin film has been electrified, particles generated in a vessel while a plasma is generated are deposited on a surface of the Si thin film, etching residue would be generated n a subsequent process such as, for instance, an etching process, and a pattern notch or a pattern bridge would be generated in a photolithographic process, and a pattern would not be able to be produced according to the mask.

The present invention was made in the circumstances as described above, and it is an object of the present invention to provide a plasma treatment apparatus which can prevent deposition of particles.

(Electrostatic Absorber)

Conventionally, technologies for separating absorbed materials in an electrostatic absorber are classified to those in which the absorbed materials are forcefully separated by a mechanical means and those in which the residual charge is deleted by an electric means.

Representative ones of the means are as follows.

(1) Mechanism for separation by a mechanical means:

(1-1) Mechanism for forceful separation by a means for giving a mechanical separating force such as a pin which can be thrust out from an absorbing electrode or a piston;

(1-2) Mechanism in which a piezoelectric chip or a ultrasonic vibrator is buried in a surface of an absorbing electrode, with vibration of these chips being used as a means for supplying a separating force; and.

(1-3) Mechanism in which a high pressure gas is filled in a space between an absorbing electrode and a material to be absorbed, with an expanding force generated by the gas pressure being used as a means for creating a separating force; and (2) Mechanism for separation by an electric means:

(2-1) Mechanism in which an absorbing force is caused to disappear by inverting polarity of voltage loaded to an absorbing electrode and a material absorbed thereto to delete residual charge in an insulating body provided between the two above; and (2-2) Mechanism in which voltages in an absorbing electrode and a material absorbed to the electrode are adjusted to the ground voltage to delete an absorbing force.

However, as a principle or practical matter there are the following problems in any of the conventional technologies as describe above.

(1) Problems in forceful separation by a mechanical means:

(1-1) A mechanical mechanism using a pin which can thrust out or using a piston therein needs a control section for the pin or piston, so that construction of an electrostatic absorber becomes very complicated Additionally, a mechanically movable section and a sliding section become sources of particles (e.g., minute dust particles), and if the electrostatic absorber is used in a vacuum together with a lubricant, materials absorbed to the electrode such as a silicon wafer can be heavily contaminated. For this reason it has been undesirable to apply this type of electrostatic absorber in a high performance semiconductor manufacturing apparatus.

(1-2) When a piezoelectric chip or a ultrasonic vibrator is buried in an absorbing electrode, an effective absorbing area of the electrode decreases, and it is difficult to finish places where the piezoelectric chip or the ultrasonic vibrator is buried to the same place as an absorbing surface of the electrode and maintain the state. In addition, the capability of absorbing and supporting is impeded when the electrode is heated or cooled, which may sometimes lower reliability of the apparatus.

(1-3) When an absorbed material is separated against an absorbing force of residual charge by an expanding force due to the gas pressure, if the material is a body having a light weight like that of a silicon wafer, the material can be blown up due to transitional expansion of gas immediately when the material is separated, and heavy damages can disadvantageously can be incurred by the material. On the other hand, if the gas pressure is suppressed to a low level to evade the phenomenon as described above, a long time is required until separation is completed, which is an obstacle to be overcome in the practical operation.

Problems in deletion of residual charge by an electric means:

(2-1) When it is tried to delete residual charge in an insulating body by means of inverting polarity of loaded voltage, it is extremely difficult to completely delete the residual charge by executing inversion of the polarity only once. To overcome this problem, a process in which polarity of a loaded voltage is inverted repeatedly to gradually make the value smaller and eventually proceed to zero is indispensable. With this type of polarity inversion method as described above, it is impossible to execute separation instantly, and always a time of a couple of seconds is required.

(2-2) Adjusting voltages in all section relating to electrostatic absorption to the ground voltage is naturally desirable, but in this method a discharge current, which flows for a certain period from the instant of grounding, and also so-called an absorption current are generated. For this reason, 3 to 5 seconds are required before a Coulomb force completely disappears after the voltage in the apparatus reaches the ground voltage.

As there are the problems as described above in both the mechanical means and electric means, a means in which the two technologies above are combined to make up for shortcomings of each technology was once proposed. However, in this case construction of an electrostatic absorber becomes more complicated with the size also becoming larger, which in turn results in higher production cost.

This invention was made in the light of the circumstances described above, and it is an object of the present invention to provide an electrostatic absorber working at a high speed with a simple construction which is applicable to the manufacture of a high performance semiconductor manufacturing apparatus.

(Interatomic Force Microscope)

The following technology is known as an interatomic force microscope.

In this technology, the device for detecting a very minute interatomic force generated between atoms constitutes a probe. Those forces in a surface of a sample, when scanning, are measured with the probe held closer to a surface of the sample (a material to be measured). For instance, a fine surface topography of a metallic sample or an insulating body sample is observed at a high resolution, so that irregularity of a sample's surface can be measured. A principle of an interatomic force microscope is as described below. The reference numeral 401 in FIG. 9-4 denotes a probe having a sharp tip with a full length of several microns, which is made of such a material as silicon nitrate. This probe is formed monolithically with a thin spring 402. The reference numeral 403 denotes a sample which is a material to be measured, which is, for instance, a metallic piece, an insulating body, or a semiconductor. The force working between the probe 401 and the sample 403 changes, as shown by a graph in FIG. 9-5, when a distance between the probe 401 and the sample 403 is changed. In this figure, the X axis shows a distance between the probe 401 and the sample 403 with a point where the force is reduced to zero, as the origin and the direction in which the samples get afar as the positive one. On the other hand, the Y axis shows a force working between the probe 401 and the sample 403. The force, relative to the Y axis, working in the positive direction is a repelling force, while the force working in the negative direction is an attractive force. When the distance between the probe 401 and the sample 403 is reduced to around 100 Å or below, from the utmost surface of the sample, a repelling force works there. The strength of the force is in a range from $10^{-7}$ to $10^{-12}$ N. This repelling force is converted to a displacement by a weak spring (10 N/m–0.01 N/m) to obtain a force working between the probe 401 and the sample 403. Herein as a method of detecting a displacement of the spring, for instance, an optical lever is used.

FIG. 9-6 is a concept drawing illustrating a case where the entire apparatus has the configuration as described above. In the case shown in FIG. 9-6, a sample can be minutely moved in each of the X, Y and Z directions by using a piezoelectric chip 601 in the XYZ scanning system. This displacement detecting system comprises a laser light source 602 and a laser light detector 603, and these are provided so that a laser light reflected on a upper surface of a spring 605, integrated with a probe 604, will go into a detector. When displacement occurs in a spring due to a force working between the probe 604 and a sample 606, a path of reflected laser light changes according to the displacement of the spring. The displacement of the reflected laser light path is then detected as a change in a quantity of light coming into the detector. As such, the method of obtaining data concerning irregularity of a surface of a sample does not involve directly measuring a displacement of a spring, but instead involves moving a sample 606 in the Z direction according to irregularities of a surface of a sample so that the displacement will always be constant. Namely, a clearance between the probe 604 and a surface of the sample 606 will always be constant, and measuring the piezoelectric control voltage is often used.

However it has turned out that, when an object for measurement comprising an insulating material (especially a non-conductive material) is measured with a conventional type of device, the result of measurement does not always coincide with a practical roughness of a surface of a sample. Namely, it has turned out that the measure value was not accurate. When it is tried to obtain an accurate measured value, sometimes a vast quantity of time may be required, or it may become completely impossible to carry out an accurate measurement. Also, sometimes a control system of the apparatus works to forcefully press the probe to a sample and break the expensive probe.

The present invention and activity has involved strenuous effects to find out the cause, and it has been found that the accurate measurement can not be performed because of the following reasons.

1. When measurement for a conductive samples performed, sometimes the sample may have been electrified, an electrostatic force is generated due to the electrification, and this electrostatic force gives influence to a minute interatomic force, which makes it difficult to detect the interatomic force accurately.

2. Polarization occurs in the conductive sample, and the polarization gives effects to the interatomic force, and as a result measurement thereof becomes inaccurate, and sometimes it becomes impossible to obtain an accurate surface roughness.

So it was tried to remove electric charge from the sample, but removal of electric charge can not always be performed successfully, and even if it is possible, a vast quantity of time is required.

The present invention was made in the light of the circumstances as described above, and it is an object of the present invention to provide an interatomic force microscope which enables an accurate measurement of an interatomic force and/or an accurate measurement of surface roughness, even if a sample to be measured is a non-conductive material.

(X-ray Irradiating Apparatus)

The technology of irradiating X-rays onto a surface of a sample has been used in a wide range for the purpose to execute analysis of a sample or manufacture semiconductor devices. For instance, as a device for irradiating X-rays, an X-ray photo-electronic spectrometer (XPS), Auger electronic spectrometer, X-ray diffraction instrument, and total reflection fluorescent X-ray device (TRXRF) have been known.

The X-ray photo-electric spectrometer or the Auger electronic spectrometer is an analyzer used for elemental analysis of a sample or detailed observation of chemical combination of atoms, while the X-ray diffraction instrument is a device used to measure the structure of a crystal making use of X-ray diffraction generated from the sample. Also, the total reflection fluorescent X-ray device is a device which enables quantitative as well as qualitative measurement of an element by irradiating X-rays onto a surface of a sample and making use of fluorescent X-ray release from the sample.

However, as X-rays are directly irradiated onto a surface of a sample, sometimes the sample is electrified, which gives disadvantageous effects to the X-rays or the photo-electrons. As a result, the XPS can not be used for precise measurement of an insulating material.

Detailed description is made for this problem caused by electrification with reference to FIG. 10-3. FIG. 10-3 is a schematic drawing illustrating a conventional type of XPS. In this figure, the reference numeral 301 is an X-ray gun, and herein the X-ray generated in the X-ray gun above and having a constant level of energy is indicated by the reference numeral 302 and is irradiated onto the sample 303.

When the X-ray 302 is irradiated onto the sample 305, at least one photo-electron 305 is released from the sample's surface 305. This photo-electron 305 is detected by the detector 306, and the result is used to observe a chemical combination of atoms in the sample in detail.

If the sample 303 is a silicon wafer, and the surface is coated with a $SiO_2$ film having a thickness of 1000 μm positive charge 307 is accumulated in the surface of the $SiO_2$ film due to irradiation of X-ray. As the $SiO_2$ film is an insulating one, the charge is never lost due to conduction, and a new electric line of force is generated. Under the influence by this electric line of force (electric field), such effects as change of trajectory of the X-ray 302 or the photo-electron 305 occur. Concretely, if any electric charge remains on a surface of the $SiO_2$ film, the surface potentials of the oxide film changes. With this change, an XPS peak position of the $SiO_2$ layer against the Si substrate shifts, and for instance, a width of an $SiO_2$ spectrum becomes wider due to an electric field generated by the charge.

Conventionally, as a means for solving the problem described above, the technology of irradiating electrons having energy of several eV onto a surface of a sample and neutralizing the sample electrically has been used, but there is no means for making a determination as to whether the surface has completely been neutralized or not. Also, a method of thinly depositing metal such as gold (Au) on a surface of an insulator sample and to make the metallic film electrified like the sample and obtaining a binding energy from a difference between the energy level and that in the inner core has been used. However, the sequence for deposition is troublesome, and also a composition of the sample inevitably changes due to deposition, so that it has been difficult to carry out a precise observation. Also as gold is an impurity to a wafer, this method can not be used for observation of a wafer in a process to manufacture semiconductor devices.

This problem is very serious, because ultra LSIs have been becoming increasingly fine and minute. Use of gold deposition to overcome this problem is impossible, because a wafer is seriously contaminated by gold.

The problem caused by electrification as described above occurs in an apparatus using X-rays therein such as an X-ray photo-electric spectrometer (XPS), an Auger electronic spectrometer, an X-ray diffraction device, and a total reflection fluorescent X-ray device (TRXRF).

The present invention was made in the light of the circumstances as described above, and it is an object of the present invention to provide an X-ray irradiating apparatus which can prevent electrification of a surface of an insulator sample.

(Cleaning Equipment)

Conventionally, the following technology has been used for cleaning a body to be processed (such as a semiconductor). In the technology, chemical liquids such as a mixed solution of sulfuric acid and hydrogen peroxide, a mixed solution of chloric acid and hydrogen peroxide, a mixed solution of ammonia and hydrogen peroxide, a mixed solution of fluoric acid and hydrogen peroxide, and ultra pure water are used in combination to remove organic materials, particles, metals, and natural oxide film deposited on a surface of a semiconductor without removing/affecting the flatness of the semiconductor's surface at an atomic level. The technology includes, for instance, the following steps.

1 (1) Cleaning with a mixed solution of sulfuric acid and hydrogen peroxide (Sulfuric acid:Hydrogen peroxide=4:1, Volumetric ratio) for 5 min., (2) Cleaning with ultra pure water for 5 min;. (3) Cleaning with a mixed solution of sulfuric acid and hydrogen peroxide (Sulfuric acid:Hydrogen peroxide=4:1, Volumetric ratio) for 5 min.; (4) Cleaning with ultra pure water for 5 min.; (5) Cleaning with a mixed solution of fluoric acid and hydrogen peroxide (fluorine acid: 0.5%, Hydrogen peroxide: 10%) for 1 min.; (6) Cleaning with ultra pure water for 5 min.; (7) Cleaning with a mixed solution of sulfuric acid and hydrogen peroxide (Sulfuric acid:Hydrogen peroxide=4:1, Volumetric ratio) for 5 min.; (8) Cleaning with ultra pure water for 10 min.; (9) Cleaning with a mixed solution fluoric acid and hydrogen peroxide (Fluorine acid: 0.5%, Hydrogen peroxide: 10%) for 1 min.; (10) Cleaning with ultra pure water for 10 min.; (11) Cleaning with a mixed solution of ammonia and hydrogen peroxide (Ammonia water:Hydrogen peroxide:Ultra pure water=0.05:1:5, Volumetric ratio) for 10 min.; (12) Cleaning with ultra pure water for 10 min.; (13) Steeping into ultra pure water heated to a high temperature (Approx. 90° C.) for 10 min.; (14) Cleaning with a mixed solution of fluoric acid and hydrogen peroxide (Fluorine acid: 0.5%, Hydrogen peroxide: 10%) for 1 min.; (15) Cleaning with ultra pure water for 10 min.; (16) Cleaning with a mixed solution of chloric acid and hydrogen peroxide (chloric acid:Hydrogen peroxide:Ultra pure water=1:1:6, Volumetric ratio) for 10 min.; (17) Steeping into ultra pure water heated to a high temperature (Approx. 90° C.) for 10 min.; (18) Cleaning with ultra pure water for 10 min.; (19) Cleaning with a mixed solution of fluoric acid and hydrogen peroxide (Fluorine acid: 0.5%, Hydrogen peroxide: 10%) for 1 min.; (20) Cleaning with ultra pure water for 10 min.; and (21) Drying by blowing nitrogen gas thereon for 2 min.

Also, the following first to third technologies have been known as a technology to dry a semiconductor in a cleaning process.

The first technology is a spin drier, in which an object to be cried is momentarily rotated at a high rotating speed to blow off liquid deposited on a surface of the object to be dried with the centrifugal force. In this method, it is possible to dry an object to be dried by blowing off even liquid in very fine concave sections on a surface of the object to be dried, and also it is possible to prevent a natural oxide film from growing on a surface of the object to be dried (such as a silicon wafer) by purging nitrogen gas inside the apparatus. In addition, it is possible to prevent generation of static electricity, as well as to prevent particles from being deposited onto the object to be dried due to static electricity by providing an ionizer having an electrode section coated with a ceramic material and turning an object to be dried at a high rotating speed in the apparatus.

The second technology is an IPA vapor drier, which dries an object to be dried by heating IPA (Isopropyl alcohol) in the apparatus to generate IPA vapor and substituting liquid (for instance, ultra pure water) deposited on a surface of the object to be dried introduced into inside of the apparatus with IPA having a high volatility. As the IPA vapor can go into very minute concave sections in a surface of an object to be dried, it is possible to completely dry even inside of very minute concave sections on the surface of the object to be dried. In addition, IPA has a function to remove static electricity. IPA removes static electricity in a surface of an object to be dried and does not generate static electricity, so that it is possible to eliminate deposition of minute particles onto a surface of an object to be dried due to static electricity.

The third technology is an inert gas drier, which dries an object to be dried by blowing an inert gas (such as a nitrogen gas) to a surface of the object to blow off liquid (such as ultra pure water) deposited on the surface of the object. It is possible to effectively remove molecules remaining on or absorbed in a surface of the object to be dried by reducing a quantity of moisture in the gas to an extremely low level. Also, it is possible to prevent a natural oxide film from growing on a surface of the object by shutting off the apparatus against the external air and providing the inert atmosphere flow.

However, there are the following problems in each of the technologies described above.

At first, in the conventional type of semiconductor cleaning technology as described above, all steps are carried out under illumination, or at least in an environment where no consideration is taken to shut off light from outside, so that a semiconductor, which is an object to be dried or cleaned, is excited by energy of light irradiated thereto. Then, a number of free electrons and holes in the semiconductor increases as compared to those in a semiconductor in an environment where incoming light is shut off. For instance, when a semiconductor having therein a p-type region where boron (B) is added to silicon is placed in an environment where light is irradiated to the semiconductor, electrons excited by the light exchange charge with metallic ions (having a positive charge) in the cleaning liquid, and the metallic ions are absorbed into a surface of the semiconductor. On the other hand, if a semiconductor having an n-type region where phosphor (P) is added to silicon is cleaned in an environment where light is irradiated, holes excited by light exchange electric charge with negative ions (having negative electric charge) in the cleaning liquid, and the negative ions are absorbed onto the surface of the semiconductor.

Furthermore, in the conventional type of semiconductor cleaning technology as described above, at least cleaning with ultra pure water is not carried out in an inert gas atmosphere, so that oxygen in the atmosphere is dissolved into the ultra pure water and a surface of a semiconductor, which is an object to be processed, is oxidized. For this reason a natural oxide film, which degrades characteristics of a semiconductor, grows on the surface of the semiconductor. In addition, when a natural oxide film is growing, a metal such as iron (Fe), aluminum (Al), or sodium (Na), which is oxidized more easily than a semiconductor made of, for instance, silicon, generates a metallic oxide, which is taken into the natural oxide film. As such, a surface of the semiconductor is contaminated. Namely, when a semiconductor is not cleaned in an inert atmosphere, the operation itself promotes growth of a natural oxide film which deteriorates characteristics of the semiconductor and causes metal contamination by taking metallic oxide into the natural oxide film.

In the first drying technology described above, after liquid (for instance, ultra pure water) on a surface of an object to be dried is blown off, some molecules of the liquid may remain on the surface of the object.

In the second drying technology, after liquid (for instance, ultra pure water) on a surface of an object to be dried is substituted by IPA vapor for drying, IPA molecules and molecules of the liquid (for instance, water) may remain on the surface of the object to be dried.

In the third technology as described above, static electricity is generated on a surface of an object to be dried due to frictions between the surface of the object to be dried and gas, so that particles are easily deposited on the surface of the object to be dried.

The present invention was made in the light of the circumstances as described above, and it is an object of the present invention to provide a cleaner which can effectively remove impurities on a surface of a semiconductor, when a semiconductor as an object to be processed, is dried or cleaned. Such drying and/or cleaning needs to be accomplished without causing deposition of impurities on the surface of the semiconductor due to excitation of electrons or holes by light, causing deterioration such as formation of a natural oxide film on the surface of the semiconductor, causing generation of static electricity, nor causing deposition of particles.

SUMMARY OF THE INVENTION

An oxide film forming method according to the present invention includes at least a first step in which a gas phase of a mixture of oxygen, molecules including oxygen, or oxygen and/or molecules including oxygen and an inert gas, or a solution containing oxygen and/or molecules including oxygen is contacted to a surface of a substrate body, on which an oxide film is to be formed.

A second step is one in which a surface of the substrate body and that of the oxide film are heated in a gas phase of an inert gas or in vacuum.

A third step is one in which bonding between atoms constituting the surface of the substrate body in the oxide film and oxygen is strengthened and at the same time an oxide film thicker than the oxide film formed in the first step is formed on the surface of the substrate body.

Molecules including oxygen used in this invention should preferably be ozone, water, hydrogen peroxide, nitrogen dioxide, nitrogen monoxide, and/or nitrogen dioxide.

As a solution containing oxygen and/or molecules including oxygen (for instance, a solution in which oxygen is dissolved) a solution may contain dissolved ozone, hydrogen peroxide solution, a mixed solution of sulfuric acid and hydrogen peroxide, a mixed solution of chloric acid and hydrogen peroxide, and/or a mixed solution of ammonia and hydrogen peroxide. It should be noted that a solution prepared by dissolving oxygen in a hydrogen peroxide solution is also available for this purpose.

Temperature of a solution should preferably be in a range from 0 to 100° C.

As an inert gas used in the present invention, for instance, nitrogen gas, argon gas, or a mixture of the gases can be utilized.

The total quantity of oxygen, molecules including oxygen, or a mixture of oxygen and molecules including oxygen in the gas phase of the inert gas used in the first step above should be 1 ppm or below, and preferably be 0.01 ppm or below.

A partial pressure of oxygen, molecules including oxygen, or a mixture of oxygen and molecules including oxygen should be $7.6 \times 10^{-4}$ Torr or below, and preferably be below $7.6 \times 10^{-6}$ Torr or below.

As a substrate body which can be used in the present invention, a semiconductor with the surface made of such metal as silicon, metal, alloy, or metallic silicide can be listed.

Temperature of the substrate body in the first step f the present invention should be in a range from 0 to 600° C., and preferably be in a range from 0 to 500° C., and more preferably be in a range from 0 to 300° C.

Temperature for heat processing in the third step of the invention should be 1200° C. or below, preferably be in a range from 500 to 1150° C., and more preferably be in a range from 800 to 1150° C.

Also, there is no specific restriction over a pressure of the gas phase, and the pressure may be any of depressurized, normal or pressurized state.

In the present invention, when light is irradiated to a gas phase of oxygen, molecules including oxygen, a mixture of oxygen, and/or molecules including oxygen and inert gas, it is preferable to irradiate light having an energy of 1.5 eV or more, and more preferable to irradiate light having an energy of 6.2 eV or more.

In the present invention, when a catalyst (for instance, platinum) is used in a solution, is preferable.

A drier according to the present invention is a gas drier which blows a specific gas to an object to be dried and in which an irradiating means for irradiating ultra-violet rays to at least a portion of the gas is provided.

A rotating coater having a vessel, a mechanism to support and rotate a sample inside the vessel, and a means for supplying liquid material to be spread onto a surface of the sample according the present invention includes a gas supply means for supplying gas from a gas source to inside of the vessel and a means for irradiating ultra-violet ray to the gas to be introduced into the vessel.

A vacuum treatment apparatus according to the present invention, in which a plurality of vessels, each being depressurizable, respectively, and connected to each other via a relay mechanism, are provided and an object to be processed can be moved between each vessel above, includes at least a light injecting means for injecting ultra-violet ray beams to a gas introduced into at least one of the vessels described above. With the light injecting means above, it is possible to ionize gas as well as to remove electric charge from a sample to irradiate right to the sample.

A heat treatment apparatus including an insulator and having a core tube, in which an object to be processed can be carried in or out through an opening which can be opened or closed, according to the present invention, has an irradiating means for irradiating ultra-violet light to gas introduced into the core tube.

It is preferable that an insulator constituting a core tube in the present invention is a material transparent to ultra-violet rays.

Also, in the present invention, it is preferable that a light source for the light irradiating means for irradiating light to gas can emit light having an energy of 3.4 eV or more.

A charged particle flow irradiating apparatus according to the present invention has a light injecting means for injecting ultra-violet rays to gas introduced into the apparatus.

A plasma treatment apparatus according to the present invention, in which a high-frequency power is supplied between opposing electrodes provided in a depressurizable vessel to generate a plasma between the electrodes and an object to be processed held on the electrode is processed by the plasma, has a light injecting means for irradiating light to a gas introduced into the vessel.

An electrostatic absorber according to the present invention has an irradiating section to irradiate ultra-violet rays to the absorbing electrode and gas introduced into the atmosphere surrounding an object to be absorbed.

An interatomic force microscope according to the present invention, in which a surface of an object to be measured and a tip of a probe are mounted in vessel in a manner so as to be opposed to each other with a very minute clearance therebetween and an interatomic force working between atoms constituting the object to be measured and the probe is converted to a mechanical displacement, has an electrolytically dissociated gas supply means for supplying electrolytically dissociated gas into the vessel.

Herein, the electrolytically dissociated gas is a gas in which gas molecules have obtained energy, shifted to an excised state and been dissociated into positive ions and electrons.

The essence of the present invention includes an X-ray irradiating apparatus having a vessel, the inside of which can be depressurized, an irradiating means for irradiating X-rays to an object to be irradiated on a supporting section provide in the vessel, a means for measuring photo-electrons released when X-ray is irradiated, and a light injecting means for injecting light to gas introduced into the vessel.

A cleaner according to the present invention, which cleans or dried an object to be processed, has a light shuttering means for shuttering light off from a section of the object to be processed contacting chemical ultra pure water used for cleaning.

A cleaning apparatus according to the invention, which cleans or dried an object to be processed, has a function to shutter light off from a portion of the object to be processed contacting chemicals or ultrapure water used or cleaning, includes a vessel provided therein in which the internal atmosphere can be substituted with other gas, and furthermore provides a means for supplying inert gas into the vessel, a means for blowing the gas to the object to be dried or drying the object to be dried, and an irradiating means for irradiating ultra-violet rays to at least a portion of the gas.

It is possible to form an oxide film having excellent insulating characteristics on the base surface thereof by contacting oxygen, molecules including oxygen, and a gas phase mixture of gas and/or molecules including oxygen and an inert gas, or a solution including oxygen and/or molecules including oxygen to form an oxide film of one molecular layer or more, then heating a surface of the substrate body in inert gas in the gas phase or in vacuum to suppress growth on an oxide film under raised temperature, and thermally treating the surface of the substrate body and the oxide film in oxygen, molecules including oxygen, or a gas phase mixture of oxygen and/or molecules including oxygen to increase a thickness of the oxide film. A method according to the present invention having the features as described above enables realization of an ultra fine semiconductor device.

When forming an oxide film of a one molecular layer or more on a surface of a substrate body by contacting oxygen, molecules including oxygen, and a gas phase mixture of oxygen and/or molecules, including oxygen and inert gas to the surface of the substrate body. It is generally recognized that the higher temperature of the gas phase mixture or the substrate body is, the sooner an oxide film is formed on the surface of the substrate body, and, also, that the higher a partial pressure of oxygen or molecules including oxygen in the gas phase mixture, the faster the oxide film growth speed is. Also, by irradiating light having an energy of 1.5 eV or more to the gas phase mixture or the surface of the substrate body, it is possible to increase the oxide growth speed.

Also, it is recognized that the more a quantity of oxygen or molecules including oxygen dissolved in a solution containing oxygen or molecules including oxygen, the sooner an oxide film will be formed on the surface of the substrate body.

Also, it is recognized that, when a solution containing oxygen and/or molecules including oxygen to a catalyst which promotes decomposition of oxygen or molecules including oxygen, the oxide film growth speed increases.

Also, it is recognized that, especially an aqueous solution of hydrogen peroxide to a platinum catalyst, oxygen radical and $HO_2^-$ ions are generated and, as a result, the oxide film growth speed becomes faster.

A device according to the present invention includes a gas supply means for supplying a specified gas as described above (e.g., nitrogen gas), an irradiating means for irradiating ultra-violet rays to the as gas described above (such as a deuterium lamp which can irradiate ultra-violet rays having a wavelength of 185 nm), and a tube body having an insulating material provided in a flow path, through which the gas is flown to an object to be dried, so that molecules in the gas are electrolytically dissociated and ions are generated.

As a result, when the gas is flown to the object to be dried, the ions generated as described above are injected to the object to be dried, and static electricity generated due to friction between the surface of the object to be dried and the gas are neutralized by the ions generated as described above. For this reason, static electricity is not generated on the surface of the object to be dried when it is dried.

The rotating spreader according to the present invention includes a gas supply means for supplying gas from a gas source into a vessel and a ultra-violet ray irradiating means for irradiating ultra-violet rays to gas introduced into the vessel.

For this reason, when gas is flown by the gas supply means into a vessel, and ultra-violet rays are irradiated to the gas by the ultra-violet ray irradiating means, gas molecules, to which ultra-violet rays were irradiated, get energy from quantums of the ultra-violet rays and shift to an excited state. A portion of gas is thereby electrolytically dissociated to electrons and ions. This electrolytically dissociated gas is introduced into the vessel. As the electrolytically dissociated gas includes positive ions and electrons, when the gas is introduced into a vessel, the gas contacts a sample and neutralizes an electrified sample, and electricity is removed from the sample. When an electric charge is removed from a sample when spreading during rotation, any electric force is not generated between a sample and a material spread thereon. As such, unevenness in spreading does not occur, and a film having no particles deposited thereon is formed. It should be noted that, when the film is used as an inter-layer insulating film, it is possible to remove electric charge from the film as described above for making a device having excellent characteristics.

It should be noted that irradiation of ultra-violet rays to a gas should preferably be carried out outside a vessel. As a material for the gas to be electrolytically dissociated, nitrogen gas, argon gas or a mixture of nitrogen and argon can advantageously be used.

Also, it should be noted that, when oxygen and vapor are mixed in the nitrogen gas, argon gas, or a nitrogen/argon mixed gas, the oxygen gas is converted to ozone when ultra-violet rays are irradiated thereupon. This ozone has undesirable effects such as reacting with a resist film or other films under the existence of vapor. For this reason, it is desirable to suppress concentration of oxygen and vapor mixed therein to under 10 ppm and 1 ppm, respectively, and more preferably under 10 ppb and 1 ppb, respectively.

When constructing the gas supply means with a piping member, it is preferable to form an insulating material layer on the internal surface. When an insulating material layer is formed, even if ions or electrons in the electrolytically dissociated gas collide against the surface of the layer, no bad effect is given to the surface. Also, as the ions and electrons are not absorbed, the ions and electrons can efficiently be sent to the inside of a vessel. As the insulating material layer as described above, for instance, such a film as an oxidized passive state film or a fluoride passive state film may be used. Also, the insulating material layer may be formed on the entire surface of the piping member, but, from an economical point of view, it is better to form the insulating material layer only in a section contacting the electrolytically dissociated gas, namely in the downstream side from a transparent window.

As a gas (e.g., nitrogen gas) introduced into a vessel (such as a load/lock chamber) has been electrolytically dissociated by ultra-violet rays irradiated from the irradiating means (such as a deuterium lamp), even if an object (such as a wafer) placed in the vessel to be processed therein is electrified, the electric charge is neutralized by the charged bodies electrolytically dissociated as described above.

When a gas, to which ultra-violet rays were irradiated, is introduced into a tubular core tube made of an insulating material, positive ions or electrons, generated due to irradiation of ultra-violet rays to the gas, selectively neutralize an electric charge of an object to be heated in the core tube. For this reason, the object to be heated is not electrified. Thus deposition of particles thereon being eliminated. Also, as the core tube is made of an insulating material, it is possible to neutralize ions or electrons electrolytically dissociate as described above for prevention of deposition of particles. If a light source for a light irradiating section which irradiates light to gas irradiates light having an energy of 3.4 eV or more, it is possible to efficiently neutralize an electrified body such as an insulating body constituting the core tube, an insulating body susceptor supporting a solid substrate carried into the core tube, and a solid substrate.

When ultra-violet rays are irradiated to gas, the gas is electrolytically dissociated and ions or electrons generated due to electrolytic dissociation of gas neutralize an electric charge of a sample (an object to be irradiated) such as SEM or EB. For this reason, it is possible to prevent a sample from being electrified during a process of surface analysis or ultra-high density integration, and also it becomes possible to realize high resolution surface analysis or ultra-high density/high processing speed LSI.

In the present invention, a light projector to irradiate ultra-violet rays to gas introduced into a depressurizable vessel is provided, so that it is possible to introduce gas, to which ultra-violet rays were irradiated, between opposing electrodes provided in a vessel, prior supplying a high-frequency power. As a result, when a high-frequency power is supplied, plasma is easily generated. When ultra-violet rays are irradiated to gas, the gas is electrolytically dissociated to ions and electrons. For instance, argon gas is electrolytically dissociated to $Ar^-$ ions and $e^-$. When a high-frequency power is supplied between opposing electrodes, as a number of $Ar^-$ ions and electrons $e^-$ between the opposing electrodes, so the $Ar^-$ ions and electrons $e^-$ are accelerated in an electric field caused by the high-frequency power, immediately collision between, for instance, neutral Ar atoms and molecules caused by electrolytic dissociation is repeated to cause dielectric breakdown, and plasma is easily generated. For instance, in case of Si thin film, the reproducibility of an effect to remove particles deposited on a surface of a Si substrate during plasma surface cleaning is removed, and any plasma damage is given to the Si substrate, so it becomes possible to form a high quality single crystal Si thin film. This is realized by accurate and precise control of voltage difference between plasma and an Si substrate when a Si thin film grows on the Si substrate, and for this reason it is possible to stably form a high quality Si thin film with the throughput improved.

Also, it is possible to introduce gas, to which ultra-violet ray was irradiated, to between opposing electrodes provided in a depressurizable vessel. When supply of a high frequency power is stopped and the plasma is caused to disappear, a surface of the Si thin film is electrified positively or negatively. Under the conditions, when, for instance, $Ar^-$ ions and electrons $e^-$ generated by electrolytically dissociating Ar gas by means of irradiating ultra-violet rays thereto, are introduced onto a surface of an electrified Si thin film, if the surface of the Si thin film is positively electrified, electrons $e^-$ efficiently neutralize the electric charge stored on the surface, and if the surface of the Si thin film is negatively electrified, Ar⁻ ions efficiently neutralize the surface, thus electrification of the surface being prevented. Furthermore, because of the possibility to prevent electrification, it is possible to prevent particles generated in a vessel in which a plasma is being generated from depositing on a surface of a Si thin film, so that it is possible to manufacture a high processing speed LSI as well as to provide improved reliability and higher yield.

In the present invention, a gas subjected to irradiation of ultra-violet rays is injected to an absorbing electrode as well as to an atmosphere for an object to be absorbed. Gas molecules subjected to irradiation of ultra-violet rays get energy from quanta of the ultra-violet rays and shift to an excited state, the gas thus being electrolytically dissociated to positive ions and electrons. As a result, when electrolytically dissociated gas and electron beam are irradiated to the absorbing electrode as well as to the insulating material, the remaining electric charge preventing the absorbed object from separating therefore is neutralized by electric charge of the electrolytically dissociated gas, so that the absorbed object is separated. Herein, a quantity of injected gas must only be adequate for neutralizing remaining electric charge, and it is not necessary at all to raise a pressure for injecting the gas. However, in association with progress of elimination of the remaining electric charge with the electrolytically dissociated gas, the absorbing force becomes weaker, and finally a force of the injection gas flow over the absorbed object becomes relatively larger, when the object is smoothly separated from the electrode even if the remaining electric charge has not been completely neutralized.

In this invention, forming an internal surface of a tube used to introduce gas with an insulating material is effective for preventing the electric charge from being lost through the tube wall when gas molecules electrolytically dissociated due to irradiation of ultra-violet rays passing through the tube.

An electrostatic absorber is used in a wide range including, e.g., the fields of carrying apparatus, printing machines, and robots, but a main purpose of the absorber according to the present invention is application thereof especially in a process related to the manufacture high performance semiconductor devices such as RIE (Reactive Ion Etching), CVD (Chemical Vapor Deposition), Plasma Sputter/Etching, Photolithography, and/or Epitaxial Growth, and in these cases the electrostatic absorbance according to the present invention shows its advance remarkably. It is effective to use nitrogen gas, argon gas or a mixture of these gases as gas satisfying the requirements concerning the cleanliness degree of the atmosphere in the processes as described above which is efficiently dissociated electrolytically.

On the other and, if oxygen gas and vapor are mixed in the nitrogen gas, argon gas, or the nitrogen/argon mixed gas described above, the oxygen gas is converted to ozone when ultra-violet rays are irradiated. This ozone has an undesirable effect to generate a natural oxide film on a semiconductor substrate under the existence of vapor in the process to manufacture a semiconductor device. When it is taken into consideration that, in this process, the efficiency in conversion of oxygen to ozone due to irradiation of ultra-violet rays are higher than the probability for nitrogen gas and argon gas to shift to the excited state, it is desirable to suppress concentrations of oxygen and vapor mixed therein to under 10 ppm and 1 ppm respectively as limit levels indicating start of severe influence over growth of natural oxide film in the semiconductor device manufacturing process described above.

The interatomic force microscope according to the present invention includes an electrolytically dissociated gas supply means for supplying electrolytically dissociated gas into a vessel, so that, even if an object to be measured or a probe has been electrified, it is possible to neutralize electric charge residing in the object to be measured or the probe with positive ions or electrons in the electrolytically dissociated gas by supplying the electrolytically dissociated gas with the electrolytically dissociated gas supply means to between the object to be measured and the probe as well as to remove electric charge in the object to be measured or the probe within a short period of time. As a result, it becomes possible to carry out measurement by detecting the interatomic force more accurately and obtain an accurate surface roughness. Also, in a polarized conductive body, the electrolytically dissociated gas neutralizes electric charge, so that the same effect can be achieved.

If an electrolytically dissociated gas is continuously introduced, also generation of new electric charge due to such factors as friction between an object to be measured and a probe can be suppressed.

The present invention is characterized in that, in an X-ray irradiating apparatus, a projecting means for projecting ultra-violet light to gas introduced into the apparatus is provided. As a result, it is possible to prevent electrification of a sample of insulating body or during ultra-high density integration process, as well as to carry out precise analysis of chemical bonding state between atoms, which in turn makes it possible to realize a ultra-high density/ultra high processing speed LSI.

A cleaner according to the present invention used to clean or dry an object to be processed has a function to shut off light from at least a section of a semiconductor contacting a chemical liquid or ultra pure water used for cleaning, so that the semiconductor to be processed will never be excited by the energy of the light. As a result, it is possible to effectively remove impurities on a surface of an object to be processed without causing deposition of impurities, originated from electrons or holes due to the light, on the surface of the semiconductor. Furthermore, the cleaner according to the present invention includes a vessel in which atmosphere therein can be substituted with another gas, a function to supply inert gas into the vessel, and a function to supply ultra pure water with a reduced concentration of dissolved oxygen, so that it is possible to effectively remove impurities deposited on a surface of an object to be processed without causing denaturation of the surface of the object to be processed, such as formation of a natural oxide film.

The cleaner according to the present invention used for cleaning or drying an object to be processed, such as a semiconductor wafer, has a function to shut off light from at least a section of the object to be processed contacting a chemical liquid or ultra pure water used for cleaning, so that the object to be processed, such as a semiconductor, is never excited by the energy of light. As a result, it is possible to effectively remove impurities on a surface of an object to be processed without causing deposition of impurities originated from electrons or holes due to the light impinging on the surface of the semiconductor.

Furthermore, the cleaner according, to the present invention includes a vessel in which atmosphere therein can be substituted with another gas, a function to supply inert gas into the vessel, and a function to supply ultra pure water with a reduced concentration of dissolved oxygen, so that it is possible to effectively remove impurities deposited on a surface of an object to be processed without causing denaturation of the surface of the object to be processed, such as formation of a natural oxide film.

Also, the cleaner according to the present invention has an irradiating means (such as deuterium lamp which can irradiate ultra-violet rays having a wavelength of 185 nm) for irradiating ultra-violet rays to the gas, and a tube made of an insulating material provided in a flow path through which the gas is introduced to an object to be dried, ions are generated when the gas molecules are electrolytically dissociated. As a result, when gas is flown to the object to be dried, the ions generated as described above are injected to the object to be dried, and static electricity generated due to frictions between the surface of the object to be dried, and the gas is neutralized by the ions generated as described above. For this reason, static electricity is not generated on the surface of the object to be dried when dried.

EMBODIMENT EXAMPLES

One of the features of the present invention is that an electrolytically dissociated gas supply means is provided in an interatomic force microscope in which a surface of an object to be measured and a tip of a probe are opposed, with a minute space therebetween, in a vessel.

Any material can be used as material for the vessel on the condition that an effect of electrolytically dissociated gas to remove electric over electrification of the material is only negligible/ignorable. For instance, an opaque material such as a plastic or a metal can be used.

Conventionally, if the material is a plastic, electric charge of the vessel is removed, for instance, by cleaning such chemicals as isopropyl alcohol prior practical use, but the present invention eliminates the necessity.

Any configuration is allowable for the electrolytically dissociated gas supply means on the condition that the means can supply electrolytically dissociated gas. However, it is preferable that the electrolytically dissociated gas means includes a gas supply means for supplying gas and an irradiating means for irradiating ultra-violet rays to the gas at a position in the upstream side from the vessel, because of the easiness to form the electrolytically dissociated gas, and in that case, a tube body having a transparent window and a ultra-violet ray source to irradiate ultra-violet rays into the tube body through the transparent window. It should be noted that the window should preferably be provided in a portion of the tube body, and the tube should be opaque as a whole to prevent light from being leaked to the outside, from a viewpoint of safety. Also, it should be noted that preferably the transparent window is made of synthesized quartz.

When ultra-violet ray is irradiated to gas in the gas supply means or in the vessel with gas therein supplied from the gas supply means, the gas molecules get energy from quanta of the ultra-violet ray and shift to the excited state, and is electrolytically dissociated to positive ions and electrons, thus electrolytically dissociated gas being obtained.

It is preferable to form an internal surface of the tube body with insulating material. Even if the electrolytically dissociated gas collides against the internal surface of the tube body, it is possible to prevent decrease of ions and electrons due to release or absorption of ions and electrons electrolytically dissociated as described above, and it is possible to efficiently supply the electrolytically dissociated gas into the vessel. In that sense it should be noted that the insulating section should be formed in the downstream side from a section where electrolytically dissociated gas as generated, namely in the downstream side from the transparent window. Of course the insulation maybe provided on the entire internal surface.

Herein it is preferable to use an oxidized passive state film or a fluoride passive state film as the insulating material. By using any of the passive state films, it is possible to reduce a quantity of impurity gas released from the internal surface of the tube body as well as to reduce an error in measurement of the surface roughness due to the impurity gas.

Also an exit of the tube body may be provided at any appropriate position on the condition that the gas is not directly injected to the probe. If gas from the tube body is directly injected into a probe or an object to be measured, vibration occurs in the probe or the object to be measured due to the gas pressure, which sometimes makes it impossible to carry out accurate measurement of the surface roughness, but if any proper measure is taken to prevent gas from being directly blown onto the probe, this kind of trouble can be prevented.

Also it should be noted that it is preferable to provide a means for exhausting air inside the vessel at an appropriate position inside the vessel. If the means for exhausting air inside the vessel is provided, it is possible to depressurize or vacuum inside of the vessel. If the object to be measured is such an object as a piezoelectric element, when pressure is loaded to the object during measurement, sometimes the property is deteriorated, but in this mode for carrying out the present invention it is possible to carry out measurement under a depressurized or vacuum conditions, which is effective for prevention of such troubles as described above.

Any type of gas can be used as a source for electrically dissociated gas obtained by irradiating ultra-violet ray thereto so long as electrically dissociated gas is obtained by irradiating ultra-violet ray to the gas, but it is preferable to use, for instance, nitrogen gas, argon gas, or a mixture of the two gases to prevent surface of an object to be measured from being oxidized.

It should be noted that, if oxygen gas or moisture are mixed in the material gas for obtaining electrolytically dissociated gas such as nitrogen gas, argon gas, or a mixed gas of nitrogen and argon, the oxygen gas is converted to ozone due to irradiation of ultra-violet ray this ozone generates a natural oxide film on an object to be measured under the existence of moisture and changes the interatomic force, which in turn disadvantageously impedes accurate measurement of the surface roughness. Taking into considerations the fact that the efficiency in conversion of oxygen to ozone by irradiating ultra-violet ray is higher than the probability for the nitrogen gas and argon gas to shift to the excited state, it is preferable in this step to suppress concentrations of oxygen and vapor mixed therein to less than 10 ppm and 1 ppm respectively as limit levels indicating start of serious influence over the interatomic force, and more preferably to below 10 ppb and 1 ppb, respectively.

BRIEF DESCRIPTION OF THE DRAWINGS

FIG. 1-2 is a schematic drawing of an oxide film forming apparatus in which the method according to the present invention is applied to formation of an oxide film.

FIG. 1-3 is a schematic drawing of an oxide film forming apparatus in which the method according to the conventional type is applied to formation of an oxide film.

FIG. 1-4 is a graph showing a current flowing in an oxide film formed on a p-type Si substrate by means of the method according to the present invention.

FIG. 1-5 is a graph showing a current in a p-type Si substrate formed by applying the method according to the present invention.

FIG. 1-6 is a drawing illustrating height of an electron barrier on an interface between the oxide film and the silicon substrate in an embodiment of the present invention.

FIG. 1-7 is a drawing showing dependency of shift of threshold voltage in MOSFET on a number of introduced electrons when hot electrons are introduced into the oxide film in an embodiment of the present invention.

FIG. 2-1 is a block diagram illustrating general configuration of a gas drier according to a first embodiment of the present invention.

FIG. 2-2 is a block diagram illustrating general configuration of a gas drier according to a second embodiment of the present invention.

FIG. 2-3 is a block diagram illustrating general configuration of a gas drier according to a third embodiment of the present invention.

FIG. 3-1 is a block diagram illustrating a rotating spreader according to Embodiment 1 of the present invention.

FIG. 3-2 is a block diagram illustrating a rotating spreader according to Embodiment 2 of the present invention.

FIG. 3-3 is a block diagram illustrating a conventional type of rotating spreader.

FIG. 3-4 is a process drawing illustrating a process for spreading during rotation.

FIG. 4-1 is a simplified illustration showing a key section of a vacuum treatment apparatus according to the first embodiment of the present invention.

FIG. 4-2 is a simplified illustration showing a key section of a vacuum treatment apparatus according to the second embodiment of the present invention.

FIG. 4-3 is a simplified illustration showing a key section of a vacuum treatment apparatus according to the third embodiment of the present invention.

FIG. 4-4 is a simplified illustration of a vacuum treatment apparatus based on the prior art.

FIG. 5-1 is a block diagram illustrating general configuration of a heat treatment apparatus according to the first embodiment of the present invention.

FIG. 5-2 is a block diagram illustrating general configuration of a heat treatment apparatus according to the second embodiment of the present invention.

FIG. 5-3 is a block diagram illustrating a key section of a heat treatment apparatus according to the third embodiment of the present invention.

FIG. 5-4 is a block diagram illustrating a key section of a heat treatment apparatus according to the fourth embodiment of the present invention.

FIG. 5-5 is a graph showing pressure resistance of an oxide film formed with a device according to the present invention.

FIG. 5-6 is a graph showing pressure resistance of an oxide film formed with a conventional type of device.

FIG. 6-1 is a block diagram illustrating general configuration in the first embodiment of the present invention.

FIG. 6-2 is a block diagram illustrating general configuration in the second embodiment of the present invention.

FIG. 6-3 is a block diagram illustrating general configuration in the third embodiment of the present invention.

FIG. 6-4 is a block diagram illustrating general configuration of a conventional type of charged particle flow irradiating apparatus.

FIG. 6-5 is a simplified illustration of an ion implanter.

FIG. 7-1 is a simplified illustration of a bias sputtering device based on the RF-DC bonding system according to the first embodiment of the present invention.

FIG. 7-2 is a simplified illustration of a bias sputtering device based on the RF-DC bonding system according to the second embodiment of the present invention.

FIG. 7-3 is a simplified illustration of a bias sputtering device based on a conventional type of RF-DC bonding system.

FIG. 8-1 is a flat view of a electrostatic absorber according to the first embodiment of the present invention.

FIG. 8-2 is a cross section of the electrostatic absorber taken along the line A–A' in FIG. 8-1.

FIG. 8-3 is a concept drawing illustrating an entire system for supplying electrolytically dissociated gas to the electrostatic absorber according to the present invention.

FIG. 8-4 is a flat view of the Electrostatic absorber according to the second embodiment of the present invention.

FIG. 8-5 is a cross sectional view of the electrostatic absorber taken along the line A–A' in FIG. 8-4.

FIG. 8-6 is a cross sectional view of the electrostatic absorber taken along the line B–B' in FIG. 8-5.

FIG. 9-1 is a side view conceptually illustrating a key section of an interatomic force microscope according to the first embodiment of the present invention.

FIG. 9-2 is a side view conceptually illustrating an interatomic force microscope according to the second embodiment of the present invention.

FIG. 9-3 is a side view conceptually illustrating an interatomic force microscope according to the third embodiment of the present invention.

FIG. 9-4 is a concept diagram for explanation of a principle of measurement with the interatomic force microscope.

FIG. 9-5 is a graph showing a relation between a distance from a probe to an object to be measured and the repelling (pulling) force.

FIG. 9-6 is a side view conceptually illustrating a conventional type of interatomic force microscope.

FIG. 10-1 is a block diagram illustrating XPS according to the first embodiment of the present invention.

FIG. 10-2 is a block diagram illustrating XPS according to the second embodiment of the present invention.

FIG. 10-3 is a block diagram illustrating a conventional type of XPS.

FIG. 11-1 is a block diagram illustrating general configuration of a cleaning equipment according an embodiment of the invention.

FIG. 12-1 is a block diagram illustrating general configuration of a cleaning equipment according to the first embodiment of the present invention.

FIG. 12-2 is a block diagram illustrating general configuration of a cleaning equipment according to the second embodiment of the present invention.

FIG. 12-3 is a block diagram illustrating general configuration of a cleaning equipment according to the third embodiment of the present invention.

FIG. 12-4 is a block diagram illustrating general configuration of a cleaning equipment according to the fourth embodiment of the present invention.

Figure 1:
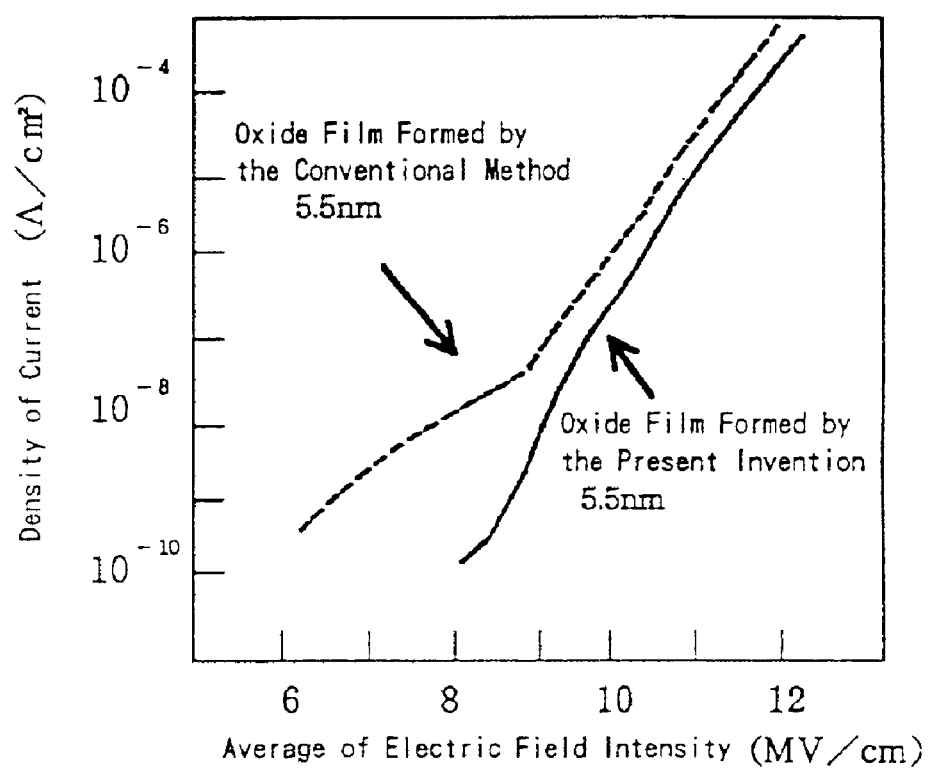
FIG. 1-1 is a drawing illustrating average dependency of density of current flowing in an oxide film on an electric field in an embodiment of the present invention.

DESCRIPTION OF SIGNS (FIG. 1-1–FIG. 1-7)
1. Upstream flange
2. Quartz tube for oxidizing chamber
3. Stainless steel chamber
4. Gate valve
5,6. Loading chamber
7. Halogen lamp for heating wafers
8. Magnet for magnetic levitation and transfer
9. Silicon substrate
10. Susceptor made of silicon
11, 12 Susceptor support made of quartz
13. Arm for magnetic levitation
14, 15 Turbo molecule group
16–23 Valve
101. Quartz tube for oxidizing furnace
102. Electric resistance header
103. Silicon substrate
104. Susceptor made of quartz
105. Soft landing carrier arm
106. Carrier arm support
107. Carrier guide rail
108. Valve
(FIG. 2-1–FIG. 2-3)
1: Gas generator
2a, 2b, 2c: Gas supplier
3: Ultra-violet ray generator
4; Ultra-violet ray irradiating block
5: Ionized gas supplier
6a, 6b, 6c: Valve
7a, 7b: Gas injection nozzle
8: Injection gas (including ions)
9: Object to be dried
10: Injection gas (not including ions)
11: Injection gas (including ions)
(FIG. 3-1–FIG. 3-4)
101: Vessel
102: Vacuum pump
103: Exhaust dumper
104: Si wafer (Sample)
105: Wafer holder
106: Nozzle (Means for supplying a liquid material to be spread)
107: Deuterium lamp
108: Window made of synthetic quartz (Transparent window)
109: Piping member (Gas supply means)
110: Vessel
111: Tube (Other gas supply means)
301: Si wafer (Sample)
302: Wafer holder
303: Nozzle (Means for supplying liquid material to be spread)
304: Vessel
402: Wafer holder
403: Nozzle (Means for supplying liquid material to be spread)
404: Resist
(FIG. 4-1–FIG. 4-4)
101: Vacuum vessel
102; Piping for first gas
103: Piping for second gas
104: Ultra-violet ray projecting means
105: Synthetic quartz window as projector
106: Susceptor
107: Sample (Object to be processed)
108: Vacuum pump
201: Piping for gas
301: Susceptor
302; Sample (Object to be processed)
(FIG. 5-1–FIG. 5-6)
1: Basic body of core tube
2: Gas introducing section
3: Heat source for heating
4: Silicon substrate (object to be heated)
5: Susceptor
6: Ultra-violet lamp (Irradiating means)
7: Valve
8: Jacket
9: Jacket gas introducing section
10: Valve
11: Shutter
12: Jacket gas exhausting section
13: Opening
14: Gas exhausting section
(FIG. 6-1–FIG. 6-5)
101, 102, 103 Vessel
102: Electron gun
103, 210, 302 Sample (object to be irradiated)
105, 303 Deuterium lamp (Projector)
108, 203, 306 Piping
(FIG. 7-1–FIG. 7-3)
101: Depressurizable vessel
102: Vacuum exhaust device
103: Upper electrode
104: Silicon target
105: Lower electrode
106: Silicon substrate
107: Silicon thin film
108: DC source giving voltage to target
109: DC source giving voltage to silicon substrate
110: High-frequency power source
111: Gas inlet port
112: Irradiating section for irradiating ultra-violet ray
113: Window made of synthetic quartz
114: Insulating material
(FIG. 8-1–FIG. 8-6)
1: Electrostatically absorbing electrode
6: Gas introducing tube
8: Semiconductor substrate
14: Ultra-violet ray irradiating section
(FIG. 9-1–FIG. 9-6)
101: Sample (Object to be measure)

102: Probe
103: Tube body (Gas supplying means)
104: Irradiating section
105: Transparent window
106: Ultra-violet ray source
201: Vessel
202: Gas outlet port
401: Probe
402; Spring
403: Sample (Object to be measured)
601: Piezoelectric element
602: Laser light source
603: Laser light detector
604: Probe
605: Spring
606: Sample (Object to be measured)
(FIG. 10-1–FIG. 10-3)
101: Vessel
102: X-ray gun
103: sample
104: Electron beam detector
105: Deuterium lamp
106: Ultra-violet ray irradiating section
107: Quartz window
108: Piping for gas
201: Sample
202: Gas injection port
203: Piping
204: Connecting section
205: Vessel in device
301: X-ray gun
302: X-ray
303: Sample
304: Surface of a sample
305: Beam gun
306: Electron beam detector
307: Electric charge (Positive)
(FIG. 11-1)
1: Light shuttering vessel
2: Semiconductor (Object to be processed)
3: Vessel for cleaning
4: inert gas supplying device
5: Piping for supplying inert gas
6: inert gas
7: Ultra pure water supplying device (having a function to remove oxygen dissolved therein)
8: Piping for supplying ultra pure water
9: Ultra pure water
10: Vessel for receiving waste liquid
11: Piping for discharging waste liquid
12: Waste liquid processing device
13: Gas exhaust valve
14: Piping for exhausting gas
(FIG. 12-1–FIG. 12-4)
101: Light shuttering device
102: Semiconductor
103: Vessel for cleaning
104: Inert gas supplying device
105: Piping for supplying inert gas
106: inert gas
107: Ultra pure water supplying device (having a function to remove oxygen dissolved therein)
108: Piping for supplying ultra pure water
109: Ultra pure water
110: Vessel for receiving waste liquid
111: Piping for exhausting waste liquid
112: Waste liquid treatment apparatus
113: Gas exhaust valve
114: Piping for exhausting gas
201: Gas generator
202a: Piping for gas supply
202b: Piping for supplying gas
202c: Piping for supplying gas
203: Ultra-violet ray generator
204: Ultra-violet ray irradiating section
205: Piping for supplying ionized gas
206a: Valve
206b: Valve
207a: Gas injection nozzle
207b: Gas injection nozzle
208: Injection gas (including ions)
209: Object to be dried
210: Injection gas (not including ions)
211: Injection gas (including ions)

DETAILED DESCRIPTION OF THE INVENTION

Next description is made for embodiments of the present invention with reference to FIG. 1-1 through FIG. 1-7.

FIG. 1-1 a graph showing currents flowing in an oxide film having a thickness of 5.5 nm formed on an n-type Si substrate using a method according to the present invention and in an oxide film having a thickness of 5.5 nm formed on an n-type substrate using a prior-based method. In FIG. 1-1, the horizontal axis indicates an electric field strength of the oxide film, while the vertical axis indicates a density of current flowing in the oxide film. Thickness of the oxide film is 5.5 nm. As the gate electrode, $N^-$-type polycrystal silicon, and negative voltage is loaded to the gate electrode.

The current flowing in the oxide film formed according to the present invention is smaller than that flowing in the oxide film based on the prior art, namely it was recognized that the oxide film according to the present invention shows a higher insulating capability.

The oxide film according to the present invention was formed by using an oxide film manufacturing device.

Figures 1, 2:
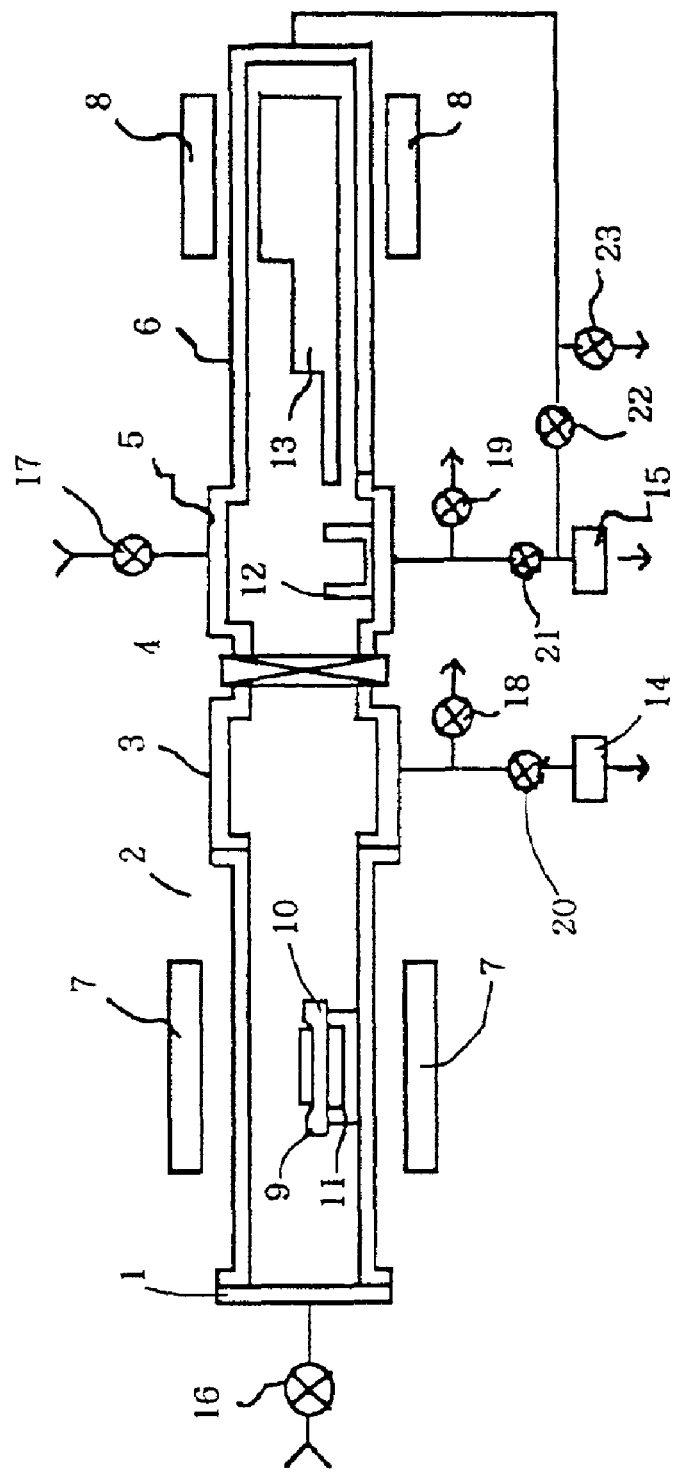

FIG. 1-2 is a block diagram illustrating the oxide film manufacturing device used for forming the oxide film by using the method according to the present invention.

In this figure, designated at the reference numeral 1 is a flange in the upstream side, 2 a quartz tube for an oxidizing chamber, 3 a stainless steel chamber, 4 a gate valve, 5 and 6 a loading chamber, 7 a halogen lamp for heating a wafer, 8 a magnet for magnetic levitation and carriage, 9 a silicon substrate, 10 a susceptor made of silicon, 11 and 12 a susceptor support made of quartz, 13 an arm for magnetic levitation, 14 and 15 a turbo molecule pump, and 16 and 23 a valve.

The gate valve 4 is provided between the oxidizing chambers 2, 3 and the loading chamber 5, 6 enables load lock transfer of the silicon substrate 9, and does rot generate particles, thus enabling particle-free transfer.

After a natural oxide film was removed by contacting the silicon substrate to diluted fluorine solution, the silicon substrate was cleaned with ultra pure water and dried, and was placed in the loading chamber 5. The surface of the silicon substrate is terminated with hydrogen. The loading chambers 5 and 6 were vacuumed to remove impurities including in the atmosphere, and ultra high density argon gas was supplied into the chambers. A silicon chamber is transferred from the loading chamber 5 to the oxidizing chamber 2 while the gate valve 4 is open, and the ultra high density argon gas is flowing. The silicon substrate 9 is heated up to 300° C. by the halogen lamp 7 in the ultra high density argon gas, and under the temperature the surface of the silicon substrate is still terminated with hydrogen. Then by contacting ultra high density oxygen gas to the silicon substrate 9, a silicon oxide film comprising one molecular layer (thickness; 0.3 nm), was formed on the surface of the substrate with high controllability.

This oxide film works as a protecting film against residual oxygen or increase of micro roughness in the subsequent oxygen. After air inside the oxidizing chambers 2 and 3 was substituted by ultra high density argon gas, the silicon substrate 9 was heated to the thermally oxidizing temperature of 900° C. A quantity of moisture contained in argon gas which is atmosphere for the heated silicon temperature was around 8 ppm.

Thickness of the oxide film on the surface of the substrate immediately after heating was 0.4 nm. Then, a silicon oxide film having a specified thickness (5.5 nm) was formed on the surface of the substrate. Namely, the ratio of a thickness of oxide film formed after the silicon substrate was heated to 900° C. until oxidization was started against the total thickness of the film was around 7%, or less than ⅕ the total thickness.

The oxide film based on the prior art was formed by using an oxidizing furnace based on an electric resistance heating system in which ultra high density oxygen gas is always supplied, and the downstream side is opened to the atmosphere.

Figures 1, 2, 3:
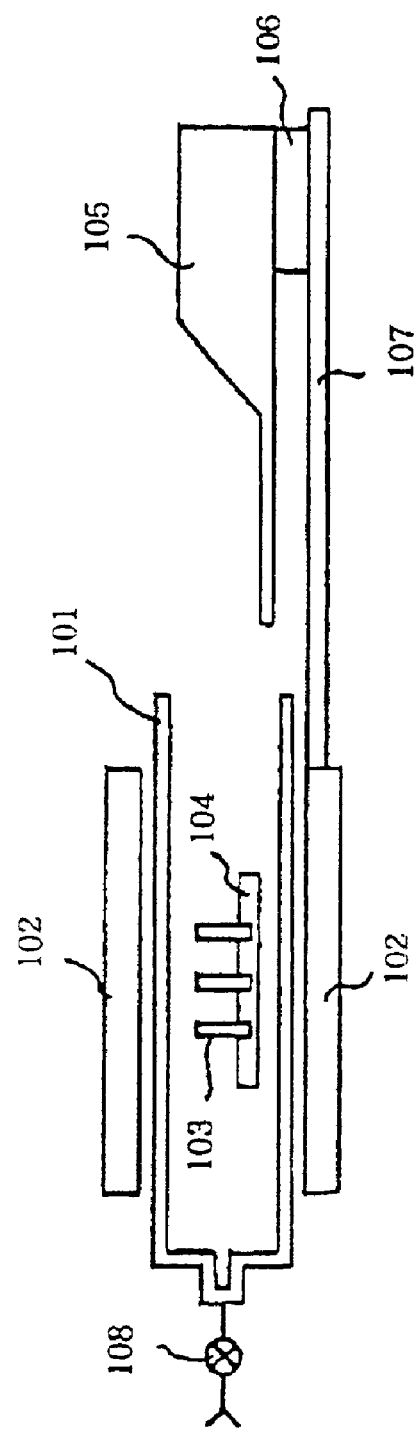

FIG. 1-3 is a block diagram illustrating an oxide film manufacturing device used to form the oxide film based on the prior art, in this figure, designated at the reference numeral 101 is an quartz tube for an oxidizing furnace, 102 an electric resistance heater for heating, 103 a silicon substrate, 104 a susceptor made of quartz, 105 a soft landing transfer arm, 106 a transfer arm support, 107 a transfer guide rail, and 108 a valve.

After a natural oxide film was removed by contacting the silicon substrate to a diluted fluoric acid solution, the silicon substrate was cleaned with ultra pure water, dried, transferred by the soft landing transfer system, heated, and was placed in the quartz tube for oxidizing furnace 101 heated up to 900° C. A thickness of the oxide film formed on the surface of the substrate upon completion of heating was 1.6 nm. Then, a silicon oxide film having a specified thickness was formed on the surface of the substrate 103. Namely, the ratio of a thickness of the oxide film formed before regular oxidization under 900° C. was started against the total film thickness was around 29%, or less than ⅕ the total thickness.

For this reason, of the thickness of the oxide film formed by using the method according to the present invention, the thickness of the oxide film formed before start of regular oxidization was 0.4 nm, while that in case of the oxide film formed by using a prior art-based method was around 1.6 nm. As a thickness of an oxide film formed on a semiconductor device becomes thinner, a percentage of a thickness of oxide film other than that regularly formed under a specified temperature increases.

Namely it can be understood that the method according to the present invention is more effective as a thickness of a specified oxide film becomes smaller.

FIG. 1-4 is a graph showing a current flowing in an oxide film formed on a p-type substrate by using the method according to the present invention. In FIG. 1-4, the horizontal axis indicates an average electric field strength of the oxide film, while the vertical axis indicates a density of current flowing in the oxide film. Numerical values in FIG. 1-4 indicates thickness of the oxide film. An N⁻-type polycrystal silicon was used as the gate electrode, and a positive voltage was loaded to the gate electrode.

FIG. 1-5 is a graph showing a current flowing in the oxide film formed on a p-type Si substrate by using a conventional method. In FIG. 1-5, the horizontal axis indicates an average electric field strength of the oxide film, while the vertical axis indicates a density of a current flowing in the oxide film. Numerical values in FIG. 1-4 indicate a thickness of the oxide film. An N⁻-type polycrystal silicon was used as the gate electrode, and positive voltage was loaded to the gate electrode.

Even if a thickness of the oxide film is less than 7 nm, a density of current flowing in the oxide film formed by using the method according to the present invention does not increase. On the other hand, a density of current flowing in the oxide film formed by a conventional type of method increases, when the thickness of the oxide film is less than 7 nm, in an electric field strength range from 6 to 8 MV/cm. Namely it was recognized that the oxide film formed by using the method according to the present invention shows a higher insulating capability when the thickness is less than 7 nm.

FIG. 1-6 is a graph showing height of an electric barrier on an interface between an oxide film and a silicon substrate in case of an oxide film formed by using the method according to the present invention as well as in case of oxide film formed by using a conventional type of method. In FIG. 1-6, the horizontal axis indicates a thickness of the oxide film, while the vertical axis indicate height of barrier against emission of electrons from silicon to the oxide film on an interface between the oxide film and silicon.

Aluminum was used as the gate electrode, and positive voltage was loaded to the gate electrode.

Barrier height against electrons in the oxide film formed by using the method according to the invention is higher than that in an oxide film formed by using a conventional method, when the thickness of the oxide film is less than 7 nm. Namely it was turned out that the oxide film formed by using the method according to the present invention shows a high insulating capability when the thickness is less than 7 nm.

FIG. 1-7 is a plot showing shift of threshold voltage values in MOSFET having an oxide film formed by using the method according to the process invention and that formed by using a conventional type of method. In FIG. 1-7, the horizontal axis indicates a number of implanted electrons, while the vertical axis indicates shift of a threshold value. Thickness of a gate oxide film in MOSFET is 9 nm, while the channel length is 48.4 $\mu$m. The introduced current is 1×10$^{-7}$ Å. It should be noted that formation of an oxide film was carried out 3 times by using the method according to the present invention and by a conventional method respectively, and values obtained by using the method according to the present invention are shown by ○, Δ, □, while the values obtained by using a conventional type of method are shown by •, ▲, ■.

It was turned out that shift of a threshold voltage when electrons are introduced into an oxide film formed by using the method according to the present invention shows a higher reliability than that in an oxide film formed by using a conventional type of method.

FIG. 2-1 shows the first embodiment of the present invention.

To the nitrogen gas generator (gas supply means) for generating nitrogen gas by evaporating liquefied nitrogen is connected the piping for supplying nitrogen gas 2a.

To the downstream side of the piping for supplying nitrogen gas 2a is connected a ultra-violet irradiating section 4 made of synthetic quartz to irradiate ultra-violet rays generated from the ultra-violet ray generator (such as a deuterium lamp) as an irradiating means.

And to the downstream side from the ultra-violet ray irradiating section is connected the piping for supplying ionized gas 5 comprising an insulating material (such as stainless piping coated with fluorine resin).

To the furthermore downstream side is connected the gas injection nozzle 7a via the valve 6a. The injected gas 8 is blown to the object to be dried 9 opposing the gas injection nozzle 7a.

In this embodiment, nitrogen gas generated in the nitrogen gas generator 1 is introduced via the piping 2a for supplying nitrogen to the ultra-violet irradiating section 4, and when the ultra-violet ray generator 3 is started, ultra-violet rays are irradiated to nitrogen gas, the nitrogen gas is electrolytically dissociated, and nitrogen gas ions N$_2^-$ and electrons e$^-$ are generated in the ultra-violet ray irradiating section 4.

Furthermore the ions generated as described above are injected together with a gas flow through the piping 5 for supplying ionized gas, valve 6a, and gas injection nozzle 7a, and blown to the object 9 to be dried. In this case, the internal surface of the piping 5 for supplying ionized gas is coated with Insulating material, so that the nitrogen gas ions N$_2^-$ or electrons do not disappear and efficiently remove electric charge of the object 9 to be dried.

Table 1 shows results of measurement of surface voltage on each silicon wafer before and after 5 sheets of silicon wafer are dried when ultra-violet rays are irradiated, and when not irradiated.

The used silicon wafer is an n-type Si (100) with a diameter of 33 mm, and silicon wafers just subjected to overflow rinse with ultra pure water after preprocessings such as cleaning with a mixed solution of sulfuric acid and hydrogen peroxide, cleaning with a mixture of ammonia and hydrogen peroxide, cleaning with a mixed solution of chloric acid and hydrogen peroxide, and cleaning with a mixed solution of fluoric acid and hydrogen peroxide were used. In the drier, the silicon wafer as an object to be dried was set on a wafer fixing tool made of PFA (Perofluoroalcoxy resin).

A flow rate of nitrogen gas injected from the gas injection nozzle 7a was set 100 l/min, the injection time to 2 minutes, and a clearance between the nozzle and wafer to 50 mm. The used nitrogen gas was ultra high purity gas: namely a quantity of moisture in the gas was less than 1 ppb and also a concentration of oxygen was less than 1 ppb.

A 500 W deuterium lamp was used as the ultra-violet ray generator, and the space between the deuterium lamp and the ultra-violet ray irradiating section 4 was purged with nitrogen gas.

When comparing a result of measurement when ultra-violet rays were irradiated to nitrogen gas flowing into the ultra-violet ray irradiating section 4 (when the ultra-violet ray generator was started) to that when ultra-violet ray was not irradiated (when the ultra-violet ray generator 3 was not started), a remarkable difference can be observed in voltages on a surface of a silicon wafer which is an object to be dried. The measurement was performed using a surface voltage meter.

TABLE 1

|  | (1) Ultra-violet ray irradiated | | (2) Ultra-violet ray not irradiated | |
| --- | --- | --- | --- | --- |
|  | Before drying | After drying | Before drying | After drying |
| Surface Voltage (kV) | 4.5–4.9 | 0.012–0.031 | 4.4–4.9 | 5 or more |

Namely, as shown in Table 1, when ultra-violet ray is not irradiated as in a conventional type of drying method, the surface voltage from 4.4 to 4.9 kV of a silicon wafer measured just after cleaning increases to 5 kV or more after injection of nitrogen gas. On the other hand, when ultra-violet ray is irradiated according to the present invention, the surface voltage of a silicon wafer immediately after cleaning is in a range from 4.5 to 4.9 kV, but the surface voltage after dried by injection of nitrogen gas subjected to irradiation of ultra-violet ray drops to 0.031 kV or less. Namely it can be understood that drying by means of injecting nitrogen gas subjected to irradiation of ultra-violet ray is excellent in its capability to remove static electricity and static electricity is not generated during drying. Also in case where a silicon wafer is dried after irradiation to ultra-violet rays, moisture on an object to be dried is completely removed, and other impurities such as particles are not deposited.

The above result indicates that, when a drier according to this embodiment of the present invention is used, an object to be dried can be dried without leaving liquid to be remove at all, without allowing deposition of any material other than a liquid to be dried, and with preventing generation of static electricity.

Although nitrogen gas is used as a specified gas to be supplied from the gas supply means, also argon gas, which does not react to the object 9 to be dried like nitrogen gas, may be achieved, and the same effect can be achieved by using other gas. Furthermore, although the above description of this embodiment assumes that a gas flow rate is set to 100 l/min, other flow rate is also allowable. However, when the drying efficiency is taken into considerations, it is preferable that the flow rate is set to a range from 50 to 150 l/min. Also it is preferable that a concentration of moisture or water vapor in the gas is less than 1 ppm and that of oxygen is 10 ppm or less.

Also in the present invention, both positive and negative ions are generated by electrolytically dissociating gas, the effect of achieving static electricity is effective toward an object to be dried having a negative surface voltage such as a PFA tool. Furthermore the above description assumes that a deuterium lap is used as the ultra-violet ray generator 3, but any light source may be used provided that the energy is large enough to electrolytically dissociate the gas, and the same effect can be achieved by using, for instance, a low voltage mercury lamp.

Also the above description of the embodiments assumes that gas is supplied under normal temperature, the drying efficiency can be raised by using a first heating means based on, for instance, an electrically heating system, to heat the gas to be supplied (up to, for instance, 200° C.). Similarly, the heating efficiency may be raised by heating an object to be heated using a second heating means based on, for instance, an infrared system.

FIG. 2-2 is a drawing for illustrating the second embodiment of the present invention.

In this embodiment, nitrogen gas is directly blown to the object 9 to be dried via the injection nozzle 7b branched in the upstream side from the ultra-violet ray irradiating section 4 in the piping 2 for supplying nitrogen gas as described in the first embodiment. Other portions of this embodiment are the same as those in the first embodiment, so description thereof is omitted herein.

This embodiment has the configuration as described above, drying is performed by blowing a large quantity of gas to the wafer 9 from the injection nozzle 7b, and if necessary it is possible to remove static electricity of the wafer 9 using the nozzle 7a additionally.

Also generated ions are directly blown to the object 9 to be dried, so that the object 9 to be dried can be dried, suppressing generation of static electricity like in the first embodiment.

Table 2 shows a result of measurement of surface voltage of wafers when the silicon wafers were dried in the device shown in FIG. 2-2.

In this case, the type of wafers used in this testing was the same as that of those used in the first embodiment, and the wafers were subjected to the same preprocessing and the same sequence for overflow rinse. Also the silicon wafer, an object to be dried, was set on a wafer fixing tool made of PFA like in the first embodiment.

The flow rate of gas injected from the gas injection nozzle 7a was set to 10 l/min, the injection time to 2 minutes, and a clearance between the nozzle and the wafer to 50 mm. Also the flow rate of nitrogen gas injected from another gas injection nozzle 7b was set to 90 l/min, the injection time to 2 minutes, and the clearance between the nozzle and the wafer to 50 mm.

As the ultra-violet ray generator 3, a 500 W deuterium lamp was used, and the space between the deuterium lamp and the ultra-violet ray irradiating section 4 was purged with nitrogen gas. The concentration of moisture in the used nitrogen gas was less than 1 ppb, while that of oxygen was less than 1 ppb.

TABLE 2

| | (1) Ultra-violet ray irradiated | | (2) Ultra-violet ray not irradiated | |
|---|---|---|---|---|
| | Before drying | After drying | Before drying | After drying |
| Surface Voltage (kV) | 4.5–4.8 | 0.011–0.028 | 4.5–4.9 | 5 or more |

As shown in Table 2, when ultra-violet rays are not irradiated as in a conventional method, the surface voltage of the silicon measured just after cleaning is in a range from 4.5 to 4.9 kV, but the value after drying by means of injecting nitrogen gas increases to more than 5 kV. On the other hand, when ultra-violet rays are irradiated according to the present invention, the surface voltage of the silicon measured just after cleaning is in a range from 4.5 to 4.8 kV, but the value drops to less than 0.028 kV after drying by means of injecting nitrogen gas subjected to irradiation of ultra-violet rays. Namely like in the first embodiment, drying according to the second embodiment is excellent in its capability to remove static electricity, static electricity is not generated during drying, moisture on an object to be dried can completely be removed, and deposition of other impurity particles can completely be suppressed.

On the basis of the results shown in Table 2, it maybe said that, also in this embodiment like in the first embodiment, an object to be dried can be dried without leaving a liquid to be dried or other particles deposited thereon, and in addition suppressing generation of static electricity.

FIG. 2-3 is a drawing illustrating the third embodiment of the present invention.

In this embodiment, in the piping 2 for supplying nitrogen gas in the first embodiment, the branched piping 2c branching in the upstream side from the ultra-violet irradiating section 4 is connected and joined to the piping 5 for supplying ionized gas. Other portions of this configuration are the same as those in the first embodiment.

This embodiment has the configuration as described above, so that, like in the second embodiment, removal of static electricity and drying can be performed efficiently by once dividing gas to a portion contributing to removal of static electricity and a portion mainly contributing to drying and then joining the two portions later.

Table 3 shows a result of measurement of surface voltage of silicon wafer when dried with the device shown in FIG. 2-3.

In this embodiment, the flow rate of gas flowing into the ultra-violet ray injecting section 4 was set to 10 l/min, and the flow rate of gas joined via another piping 2c for supplying nitrogen gas branching from the piping 2a for supplying nitrogen gas to the piping 5 for supplying ionized gas was set to 90 l/min. For this reason, the flow rate of nitrogen gas injected from the gas injection nozzle 7a was 100 l/min, the injection time 2 minutes, and the clearance between the nozzle and the wafer 50 mm.

TABLE 3

| | (1) Ultra-violet ray irradiated | | (2) Ultra-violet ray not irradiated | |
|---|---|---|---|---|
| | Before drying | After drying | Before drying | After drying |
| Surface Voltage (kV) | 4.3–4.8 | 0.014–0.030 | 4.6–4.9 | 5 or more |

(Embodiment 1)

Next description is made for the first embodiment of the present invention with reference to FIG. 3-1.

The device according to this embodiment has a system to exhaust gas inside the vessel 101 via the exhaust damper 103 with the vacuum pump 102, said system shut off from the outside with the vessel 101 made of SUS material, in this figure, the reference numeral 104 denotes a sample to form a spread film, such as a Si wafer. This wafer 104 is held by the wafer holder 105 by means of, for instance, vacuum absorption. A specified quantity of resist is dripped onto the wafer 104.

Feature of the device according to this embodiment consists in that the device has the piping means 109 as a gas supply means for supplying gas (such as nitrogen gas) into the vessel 101 and furthermore a ultra-violet ray irradiating means for irradiating ultra-violet ray (In this embodiment: a deuterium lamp) from a ultra-violet ray source to N₂ gas.

The ultra-violet ray is irradiated to N₂ gas through the synthetic quartz window (transparent window) 108 in the irradiating section.

In this embodiment, an oxidized passive state film having a thickness of about 10 nm is formed on the internal surface of the piping member 109. The gas subjected to irradiation of ultra-violet rays go through the piping member 109 and can effectively contact a surface of the wafer 104. It should be noted that, in this embodiment, the deuterium lamp 107, synthetic quartz window 108, and furthermore a portion of the piping for supplying N₂ gas are protected with the vessel made of, for instance, SUS to prevent ultra-violet rays from being irradiated onto resist.

Also in this embodiment a vacuum exhaust means is provided in the lower section of the vessel 101. In this embodiment, the vacuum exhaust means comprises a vacuum pump 102 and an exhaust dumper 103. For this reason, in the vessel 102 the exhaust speed can freely be controlled via the vacuum pump 102 and the exhaust dumper 103, and furthermore as N₂ gas subjected to irradiation of ultra-violet rays are introduced into the vessel, it is easy to adjust temperature and humidity in the resist spreading environment.

By substituting atmosphere for spreading resist with N₂ gas subjected to irradiation of ultra-violet rays, electric charge of a wafer during spreading resist in rotational mode is neutralized, a quantity of particles deposited thereon and unevenness in spreading resist are remarkably reduced, and homogeneity of a resist film is substantially improved. Also, it has been recognized that a surface of a sample having remarkable irregularities is visibly flattened by using this device according to the present invention after spreading of resist.

It should be noted that, although the vessel made of SUS is used to prevent resist from being exposed to ultra-violet rays in this embodiment, any material can be used so long as that the material is effective for interrupting ultra-violet rays. Also the synthetic quartz window 108 is provided in the ultra-violet irradiating section so that ultra-violet rays having a wavelength of, for instance, 360 nm is well transmitted therethrough, and any material can be used for the window on the condition that the material allows transmission of ultra-violet rays.

Although resist was used as a material to be spread in this embodiment, a homogeneous film not electrified could be formed also by using materials obtained by solving such films as SiO₂ film, PSG film, or AsPG film with inorganic or organic solvent.

Also it was recognized that deterioration of device characteristics due to electrification does not occur when an SiO₂ film is formed by using the device according to the present invention and the film is used as a film for interlayer insulation in a multi-layered wiring. Also it is required that at least the internal surface of the ultra-violet ray irradiating section and the piping 109 up to adjacent the wafer 104 made of insulating material so that the electrolytically dissociated N₂⁻ or e⁻ are kept in the electrolytically dissociated state, and although the piping with a stainless steel oxidized passive state film formed thereon was used in this embodiment, other insulating material such as Teflon may be used. Also N₂ was used as gas to which ultra-violet rays were irradiated in this embodiment. Also, Ar gas or a mixed gas of N₂ and Ar may be used. Also it has been found that the same effect can be achieved also by using an inert gas such as Xe or Ar.

(Embodiment 2)

Next description is made for the second embodiment of the present invention with reference to FIG. 3-2.

In this embodiment, the piping 111 is provided as other gas supply means in addition to the piping member 109.

Other portions are the same as those in Embodiment 1.

In this embodiment, gas other than electrolytically dissociated one can be introduced via the piping 111 into the vessel 101, and for this reason it is possible to adjust temperature and humidity in environment for spreading resist more precisely than in Embodiment 1 and also to more improve homogeneity of a spread film. Also it is possible to control gas pressure in the vessel 101 more easily.

With this device, like in Embodiment 1, by substituting atmosphere for spreading resist with N₂ gas subjected irradiation of ultra-violet ray, electric charge of a wafer during spreading resist in rotational mode was neutralized, and deposition of particles as well as unevenness in spreading resist was eliminated. Also homogeneity of the resist film was improved as compared to that in Embodiment 1. Also it was recognized that a surface of a sample having irregularities was flattened after resist was spread by using the device according to the present invention.

(Embodiment 1)

Next description is made for the first embodiment of the present invention with reference to FIG. 3-1.

The device according to this embodiment is shut off from the outside by the vessel made of, for instance, SUS, and has a system to exhaust gas inside the vessel 101 through the exhaust dumper 103 with the vacuum pump 102. In this figure, the reference numeral 104 denotes a sample on which a spread film is to be formed, such as a Si wafer. This wafer 104 is held by the wafer holder 105 by means of, for instance, vacuum absorption. Resist is dripped onto the wafer 104 through the nozzle 106 at a specified rate.

Feature of the device in this embodiment consists in that said device has the piping member 109 which a gas supply means for supplying gas (such as nitrogen gas) into the vessel 101 and furthermore a ultra-violet ray irradiating means for irradiating ultra-violet rays from a ultra-violet ray source 107 (In this embodiment: deuterium lamp) to N₂ gas.

The ultra-violet rays are irradiated through the synthetic quartz window (transparent window) in the irradiation section to N₂ gas.

In this embodiment, on the internal surface of the piping member 109 is formed an oxidized passive state film having a thickness of, for instance, around 10 nm. Gas subjected to irradiation of ultra-violet rays can pass through the piping member 109 and effectively contact a surface of the wafer 104, it should be noted that, in this case, the deuterium lamp 107, synthetic quartz window 108, and furthermore a portion of the piping for N₂ gas are protected against ultra-violet rays by the vessel 110 made of, for instance, SUS to prevent ultra-violet rays from being irradiated to resist.

Also in this embodiment a vacuum exhaust means is provided in the lower section of the vessel 103. In this embodiment, the vacuum exhaust means consists of the vacuum pump 102 and the exhaust damper 103. For this reason, the exhaust speed from inside of the vessel 101 can freely be controlled via the exhaust damper 103 by the vacuum pump 102, and furthermore N₂ gas subjected to irradiation of ultra-violet rays are introduced into the vessel, so that it is easy to control temperature and humidity in the environment for spreading resist.

As described above, as the atmosphere for spreading resist was substituted with N₂ gas subjected to irradiation of ultra-violet rays, electric charge of a wafer during spreading resist in rotation mode was neutralized, a quantity of particles deposited thereon and unevenness in spreading resist were remarkably reduced, and homogeneity of the resist film was remarkably improved. Also it was confirmed that, when the device according to the present invention is applied to a sample having remarkably irregularities on the surface, the surface becomes very flat after resist spread thereon.

Although the vessel 101 and vessel 110 both made of SUS were used in this device to prevent resist from being exposed to ultra-violet rays, any material can be used provided that the material can shut off ultra-violet rays. Also the synthetic quartz window 108 in the ultra-violet rays irradiating section is provided to transmit ultra-violet rays having a wavelength of 360 nm or less, and any material can be used on the condition that the material transmits ultra-violet rays.

Resist was used as a material to be spread in this embodiment, but a homogeneous film having no electric charge could be formed also by using a material obtained by solving such a film as $SiO_2$ film, PSG film, or AsPG film with inorganic or organic solvent to a liquid material for spreading.

It was recognized that, when an $SiO_2$ film is formed with the device according to the present invention and the $SiO_2$ film is used as an interlayer insulating film for multi-layered wiring, deterioration of device characteristics due to electrification does not occur. Also it is required that at least internal surface of the ultra-violet rays irradiating section and the piping 109 up to adjacent the wafer 104 is an insulating body so that the electrolytically dissociated $N_2^-$ and $e^-$ are kept in the electrolytically dissociated state until they contact a sample, and although piping having an internal surface with a stainless steel oxidized stainless steel passive state film thereon is used in this embodiment, but also such as insulating material as fluoride Passive state or Teflon® (PTFE) maybe used. Also $N_2$ was used as gas to be subjected to irradiation of ultra-violet rays, Ar gas or a mixed gas of $N_2$ and Ar may be used for that purpose. It has been recognized that the same effect can be achieved also by using inert gas such as Xe or Kr.

(Embodiment 2)

Next description is made for the second embodiment of the present invention with reference to FIG. 3-2.

In this embodiment, the piping 111 is provided as other gas supply means, in addition to the piping member 109.

The remaining portions are the same as those in Embodiment 1.

In this embodiment, it is possible to introduce gas other than that electrolytically dissociated can be introduced through the piping 111 into the vessel 101, so that it is possible to control temperature and humidity in environment for spreading resist more precisely than in Embodiment 1 as well as to furthermore improve homogeneity of the spread film. Also it is possible to more easily control gas pressure in the vessel 101.

It was recognized that, when the atmosphere for spreading resist was substituted with $N_2$ gas subjected to irradiation of ultra-violet rays with this device like in Embodiment 1, electric charge of a wafer during spreading resist in rotational mode was neutralized, a quantity of particles deposited thereon and unevenness in spreading resist were remarkably reduced, and homogeneity of the resist film was remarkably improved. Also it was confirmed that, when the device according to the present invention is applied to a sample having remarkably irregularities on the surface, the surface becomes very flat after resist is spread thereon.

Next description is made for embodiments of the present invention with reference to related drawings. It should be noted that description of the embodiment is made only for the load/lock chamber which is a representative one of vacuum vessels used in this device.

Figures 1, 2, 3, 4:
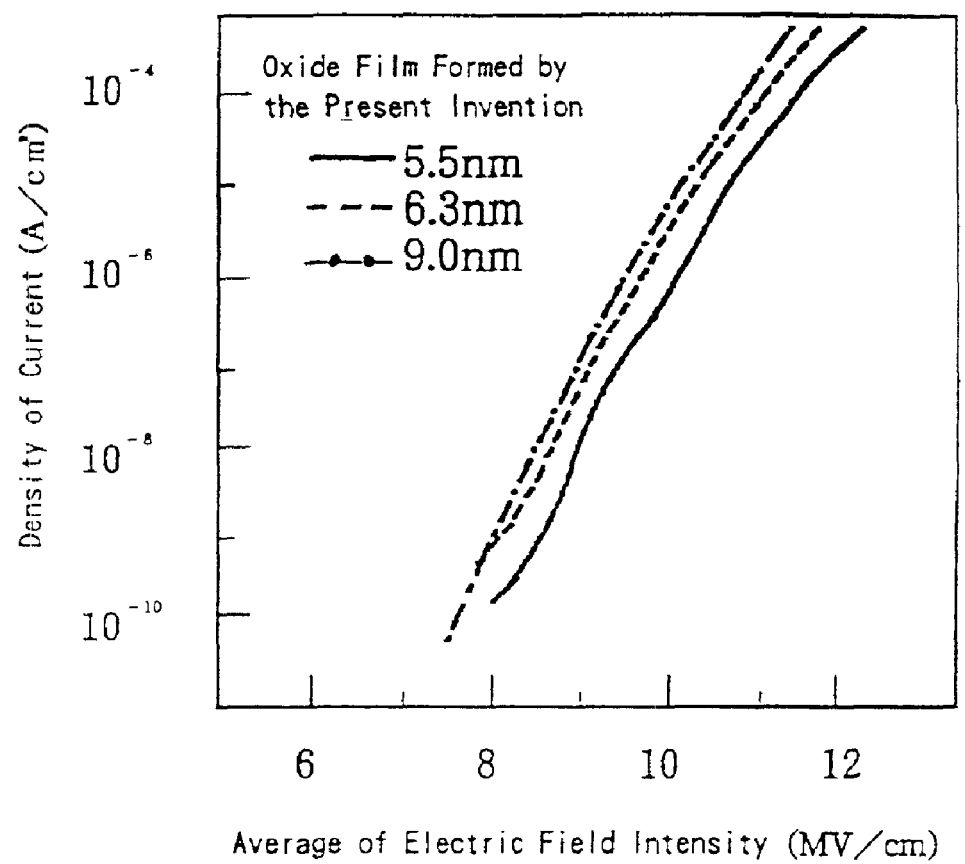

FIG. 4-1 is a drawing illustrating the first embodiment of the present invention. In FIG. 4-1, the reference numeral 101 indicates a load/lock chamber which is a vacuum vessel, the material is, for instance, SUS 316L, the internal surface thereof is subjected to complex electrolytic polishing and a processing to form an oxidized passive state film thereon, and is formed to a hollow square box with one edge of 300 mm.

The reference numeral 102 indicates a piping for gas, the material is, for instance, SUS 316L, the internal surface thereof is subjected to complex electrolytic polishing and a processing to form an oxidized passive state film thereon, and the diameter is ¼ inches. It should be notes that argon is used as gas.

The reference numeral 103 indicates a piping for gas, the material is, for instance, SUS 316L, the internal surface thereof is subjected to complex electrolytic polishing and a processing to form an oxidized passive state film thereon, and the diameter is ¼ inches. It should be notes that the gas used is, for instance, nitrogen gas.

The reference numeral 104 indicates an ultra-violet rays projector comprising, for instance, a deuterium lamp.

The reference numeral 105 indicates a window through which the projected beam passes, and the material is, for instance, synthetic quartz which will transmit ultra-violet rays having a wavelength of 360 nm or below. Any material may be used provided that the material transmits ultra-violet rays.

The reference numeral 106 is a susceptor for a sample, the material is, for instance, SUS 316L, and the internal surface thereof is subjected to complex electrolytic polishing, and the diameter is 6 inches.

The reference numeral 107 indicates a sample, which is, for instance, a silicon wafer with a diameter of 5 inches.

The reference numeral 10 indicates a vacuum pump to vacuum the aforesaid vacuum vessel, and for instance a turbo molecule pump maybe used.

The principle of actual operation is as described below.

When nitrogen gas flows in the piping 103, ultra-violet rays projected from the deuterium lamp 104 are irradiated through the synthetic quartz window 105 to the nitrogen gas described above. A portion of the nitrogen gas is electrolytically dissociated by the irradiated ultra-violet rays to $N_2^-$ and $e^-$, which flow in the electrolytically dissociated state over a silicon wafer and remove electric charge of the wafer. When only argon gas was flown at, for instance, a flow rate of 2 to 3 l/min. stopping the turbo molecule pump 108 and without flowing nitrogen gas subjected to irradiation of ultra-violet rays to leak the load/lock chamber and a number of particles deposited on the silicon wafer was measured with a particle counter, and the number was in a range from 1000 to 1500. When nitrogen gas was flown through the piping 103 under the same conditions as described above and under normal pressure at a flow rate of 5 cc/min and ultra-violet rays from the deuterium lamp 104 were projected, a number of particles deposited on the silicon wafer measured according to the standard method was less then 5 pieces. Thus the device according to the present invention has a remarkable merit of substantially reducing a number of particles.

It should be noted that, in the above embodiment, the vacuum vessel 101 and piping 102 each made of, for instance, SUS 316L with the internal surface subjected to complex electrolytic polishing as well as a processing to form an oxidized passive state film hereon, but the material and the size may be changed according to the necessity.

In the above embodiment, the piping 103 was made of, for instance, SUS 316L with the internal surface thereof subjected to complex electrolytic polishing as well as a processing to form a passive state film thereon, but a tube with the internal surface coated with Teflon® (PTFE) or a ceramic tube may be used for that purpose. Any type of insulating material may be used provided that the surface will not neutralize generated ions and electrons.

Material of the susceptor 106 used in the above embodiment was SUS 316L and the internal surface was subjected to complex electrolytic polishing, but the material and size may be changed according to the application, and also a plurality of susceptors may be used.

In the above embodiment, the sample 107 was a silicon wafer, but other material may be used according to the application. Namely, such a chemical semiconductor wafer such as a quartz substrate, a glass substrate, or gallium arsenide may be used.

The vacuum pump 108 used in the above embodiment was a turbo molecule pump, but other type of vacuum pump may be used according to the necessity.

Also in the above embodiment, nitrogen gas was used as the first gas and argon gas was used as the second gas, but any gas may be used provided that the gas is drying gas, and also the gas introduced through the gas inlet port 102 may be the same as that introduced through the gas inlet port 103. Preferably a concentration of oxygen should be less than 10 ppm. This is because ozone is generated due to irradiation of ultra-violet rays and $N_2^-$ ions decrease. Also in the above embodiment, separate gas inlet ports were used, but a common inlet port may be used. FIG. 4-2 is a drawing illustrating the second embodiment of the present invention.

In this embodiment, the piping 103 in the above embodiment is built with the piping 201 extending up to a position just close to the sample 107, and the remaining portions are the same as those in the first embodiment, so that description thereof is omitted herein. Like in the first embodiment, nitrogen gas subjected to irradiation of ultra-violet rays were flown through the piping 103, particles were counted with a particle counter, and the result was 5 particles or less. Namely the second embodiment shows the same effect as in the first embodiment.

It should be noted that, although the piping for gas 201 extends up to a position near the sample, this piping 201 may be connected to anywhere provided that the gas can be introduced into the vacuum vessel, and also a movable piping is allowable.

Also in the above embodiment, the piping 201 is straight, but a bending one may be used if necessary.

FIG. 4-3 is a drawing illustrating the third embodiment of the present invention.

In this embodiment, the susceptor 106 comprises a carrier 301 which can process a plurality of wafers 302. Other portions in the configuration are the same as those in the first embodiment. Like in the first embodiment nitrogen gas was flown and particles were counted with a particle counter, and as a result in case of a carrier which could hold 5 sheet of wafer, a number of particles deposited on a wafer was 5 pieces or below. So it may be said that the same effect like in the first embodiment can be achieved in this embodiment.

The carrier 301 according to the third embodiment of the present invention can hold 5 sheets of wafer each in the vertical position, but also construction for holding wafers in their inclined position is allowable.

In the embodiments 1 through 3, nitrogen gas subjected to irradiation of ultra-violet rays were introduced into the load/lock chamber to prevent a wafer from being electrified when the chamber is leaked. It was reported, however, that sometimes a wafer is electrified even during transfer in vacuum. The cause has not been clarified, but as electric charge of a wafer can be removed also by introducing gas subjected to irradiation of ultra-violet rays into the carriage chamber, so an inlet port may be arranged in the carriage chamber.

Next description is made for embodiments of the present invention with reference to the related drawings.

Figures 1, 2, 3, 4, 5:
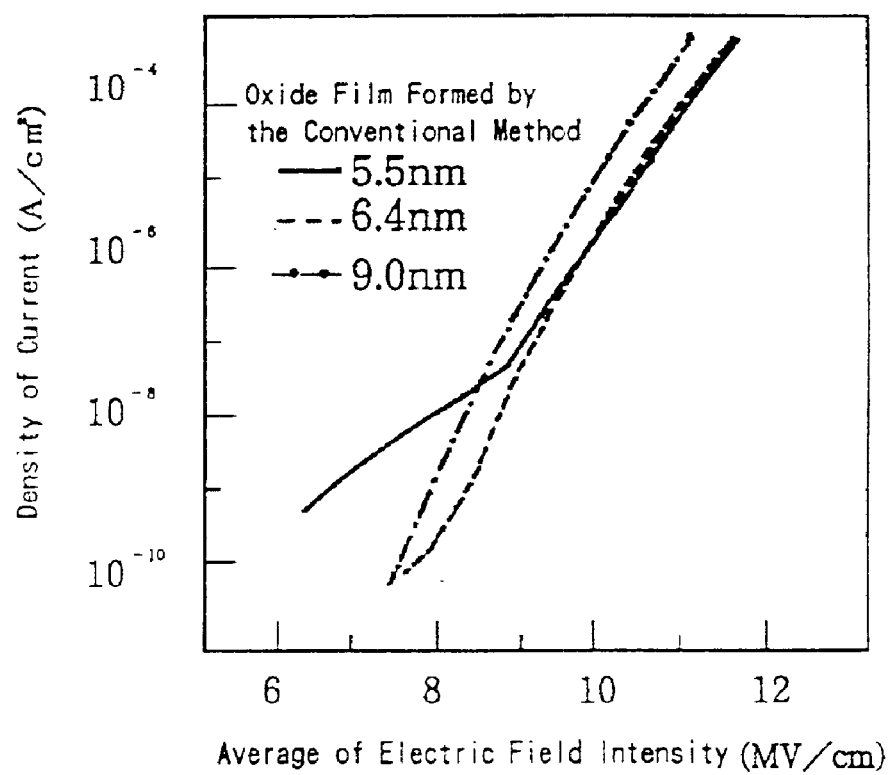

FIG. 5-1 is a drawing illustrating a horizontal type of single tube oxidizing reactor device according to the present invention. It should be noted that, in the following description of each embodiment, the same signs are assigned to identical or equivalent components. As shown in FIG. 5-1, in the core tube body 1, a gas inlet section 2 is formed in one edge section of the tube in the longitudinal direction thereof and a gas outlet section 14 is formed in other edge section thereof with the gas inlet section 2 made of synthetic quartz and a ultra-violet lamp 6 as an irradiating means provided outside the gas inlet section 2. It should be noted that, in addition to synthetic quartz, such material as magnesium oxide, calcium fluoride, or melted quartz may be used as the material for the gas inlet section 2. Namely any material may be used provided that the material transmits ultra-violet rays at a high efficiency and preferably the material does not contaminate inside of the core tube 1 (in other words, on the condition that the material is particle-free or degassing-free). To the upstream side from the gas inlet section 2 is connected a gas supply system not shown herein via the valve 7.

The clearance between the gas inlet section 2 and the ultra-violet lamp 6 should preferably be narrow to prevent ultra-violet rays from being absorbed by gas in the air (such as oxygen or nitrogen). For this reason, to efficiently excite gas flowing in the gas inlet section 2 in the direction indicated by an arrow in FIG. 5-1 with ultra-violet beam from the ultra-violet lamp 6, it is effective to seal a space between the gas inlet section 2 and the ultra-violet rays lamp 6 with gas not absorbing ultra-violet rays. Namely it is effective to use gas in a higher energy area than an ultra-violet rays absorption zone of the introduced gas flowing in the gas inlet section 2. For instance, if the introduced gas is oxygen gas, nitrogen gas is effective as the gas for sealing, and if the introduced gas is nitrogen gas, hydrogen gas is effective as the gas for sealing. However, sealing gas absorbs ultra-violet rays in a high energy area, ultra-violet rays in a high energy area attenuates. So it is effective to cover a path of ultra-violet rays between the gas inlet section. 2 and the ultra-violet ray lamp 6 with a vessel for sealing and exhaust air inside the sealing vessel with a vacuum pump.

On the other hand, on the quartz susceptor 5 as a holding member in the core tube 1 is mounted the silicon substrate 4, which is heated by the heat source 3. The heat source preferably comprises such a device as an electric resistance heater or an infrared lamp. As a material for the core tube body 1 and the susceptor 5, in addition to synthetic quartz and melted quartz, such a material as alumina, silicon carbide, aluminum nitrate, fluorine nitrate is available on the condition that the material does not contaminate the silicon substrate 4 (namely on the condition that the material is free from sodium ions, heavy metals, and also degassing-free or particle-free).

The silicon substrate 4 is contacted to a diluted fluoric acid solution to remove a natural oxide film, then cleaned with ultra pure water, and dried before testing. Then the silicon substrate 4 is placed on the quartz susceptor 5, the cover body 11 of the opening 12 of the core tube 1 is opened, the silicon substrate is carried into the core tube body 1 by means of soft landing carriage, and then the cover body 11 is closed.

Then the silicon substrate 4 is heated by the heat source 3 up to 900° C. A flow rate of gas introduced into the gas inlet section 2 is set to 2000 cc/minute. The introduced gas is subjected to irradiation of ultra-violet rays from the ultra-violet ray lamp 6. After the silicon substrate 4 is heated for 10 minutes under the temperature of 900° C., the silicon substrate 4 and the quartz susceptor 5 are carried out from the core tube body 1 according to a sequence contrary to that for soft landing carriage described above. Then voltage of the silicon substrate 4 subjected to an oxidizing process is measured with an electrostatic voltmeter and particles on the silicon substrate 4 are counted with, for instance, a wafer surface checker. In a result of actual measurement, voltage of the silicon substrate 4 after subjected to the processing above was 5V, and as for particles each achieving a diameter in a range from 0.5 to 5 µm no particle was found.

On the other hand, the same testing was conducted to gas not subjected to irradiation of ultra-violet rays from an ultra-violet ray lamp under the same conditions as described above; namely the silicon substrate 4 was contacted to a diluted fluoric acid solution to remove a natural oxide film thereon, then cleaned with ultra pure water, dried, placed on the quartz susceptor 5, carried into the core tube by means of soft landing carriage, heated under 900° C. for 10 minutes in oxygen gas, and then taken out also by means of soft landing carriage. In this case, voltage of the silicon substrate 4 was 2000 V, and a number of particles having a diameter in a range from 0.5 to 5 µm was 20.

The voltage in the oxide film and a silicon substrate each formed according to this embodiment was at most 50 V, and a number of particles on the oxide film was less than 1. Namely it can be recognized that the device according to the present invention can suppress voltage of the silicon substrate 4 to less than 50V and prevent particles from being deposited on the silicon substrate 4.

FIG. 5-2 is a drawing illustrating the second embodiment of the present invention. In this embodiment, a jacket 8 is provided to cover the external side of the core tube body 1, it should be noted that a fluid inlet section 9 is provided in one edge section of the jacket 8, which is connected via the valve 19 to a fluid source. A fluid discharge section 12 is provided -n the other edge section of the jacket 8. The fluid inlet section 9 is made of synthetic quartz, and the ultra-violet ray lamp 6 is provided outside the fluid inlet section 9. Configuration of the fluid inlet section 9 is the same as that of the gas inlet section 2 in the first embodiment above.

It should be noted that the heat source 3 heats via the jacket section 8 and the core tube 1 the silicon substrate 4 as an object to be heated.

A flow rate of gas flown into the gas inlet section 2 is set, for instance, to 2000 cc/minute, but irradiation of ultra-violet rays are not carried out while the gas is being introduced into the core tube body 1. Liquid may be flown as a fluid into the fluid inlet section 9 in place of gas, and if nitrogen gas is used, the flow rare is set to 1000 cc/min. in this embodiment, voltage in the silicon substrate 4 just after subjected to the reactive process and taken out from the core tube was 40V, and not particles each having a diameter in a range from 0.5 to 5 µm was found on the silicon substrate 4.

It should be noted that, when ultra-violet rays were not irradiated in the fluid inlet section, voltage in the silicon substrate 4 was 2000V and 25 particles each having a diameter from 0.5 to 5 µm were observed on the silicon substrate 4.

FIG. 5-3 is a drawing illustrating a vertical type single tube oxidizing reaction furnace according to the third embodiment of the present invention.

In this embodiment, the gas inlet section 2 formed in the upper section of the vertical types of core tube body 1 has an ultra-violet ray lamp provided outside thereof. Excluding a point that the device is of vertical type, the configuration and the effects are the same as those in the first embodiment.

Namely in this embodiment voltage in the silicon substrate 4 just after taken out from the core tube body 1 was 5V like in the first embodiment, and no particle was discovered on the silicon substrate 4.

Figures 1, 2, 3, 4, 5, 6:
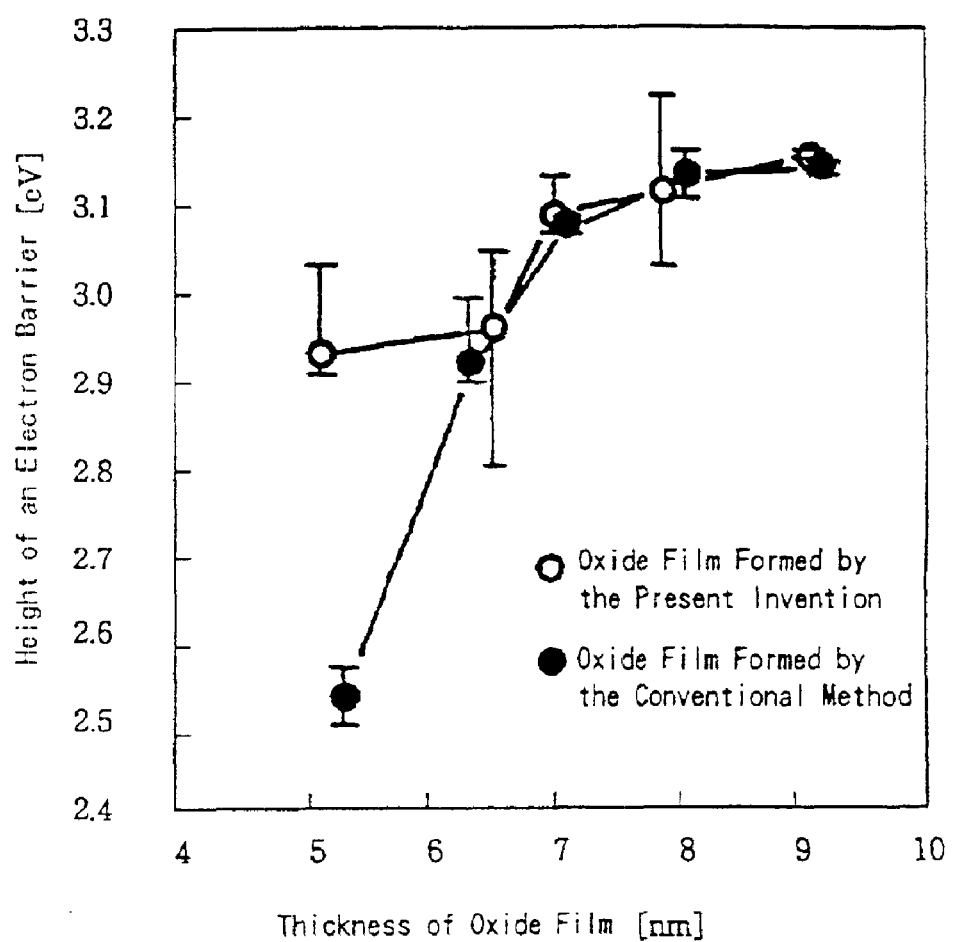

FIG. 5-4 is a drawing illustrating the fourth embodiment of the present invention, and excluding a point that the device is of vertical type, the configuration is the same as that in the second embodiment described above. FIG. 5-5 is a graph showing pressure resistance of the oxide film formed with the device according to the present invention, while FIG. 5-6 is a graph showing pressure resistance of an oxide film formed with a conventional type of device. In FIG. 5-5 and FIG. 5-6, the horizontal axis indicates a dielectric breakdown electric field for oxide films, while the vertical axis indicates a percentage of dielectrically broken oxide films. Thickness of the oxide film is 5 nm. An $n^-$ type of polycrystal is used as the gate electrode, and positive voltage is loaded to the gate electrode.

An oxide film formed with the device according to the present is not dielectrically broken in an average electric field of 8 MV/cm or less. On the other hand, an oxide film formed with a conventional type of device is dielectrically broken in an average electric field for oxide film of 8 MV/cm or less. Namely it was recognized that an oxide film formed with the device according to the present invention shows a higher reliability.

(Embodiment 1)

Next description is made for the first embodiment of the present invention with reference to FIG. 6-1.

The device according to the present invention enables observation of a surface state of a sample by irradiating electrons swept from the electron gun 102 onto a surface of the sample 104 such as $SiO_2$ obtained oxidizing Si in the vessel 101 vacuumed by a vacuum exhaust system having, for instance, an exhausting capacity of 1000 l/sec in a depressurized state and observing secondary electrons coming out of the surface of the sample with a secondary electron detector 104. The principle of operation of this device as a microscope is the same as that described in relation to the prior art-based examples, so that detailed description thereof is not provided herein.

Feature of this device consists in that said device has a means for irradiation ultra-violet rays from the deuterium lamp 5 to $N_2$ gas and blowing the $N_2$ gas to a surface of a sample. The ultra-violet rays are irradiated via the synthetic quartz window 107 in the irradiation section 106 under normal pressure to $N_2$ gas flowing there at a flow rate of, for instance, 1 cc/min, and the $N_2$ gas subjected to irradiation of ultra-violet rays pass through the piping for gas 108 with an oxidized passive state film having a thickness of about 100 Å on the internal surface thereof and is blown to a surface of a sample. Because of this irradiation of ultra-violet rays, a portion of $N_2$ gas is electrolytically dissociated to $N_2^-$ and electrons.

Thus, when observing a non-conductive sample such as $SiO_2$, if $N_2$ gas subjected to irradiation of ultra-violet rays are blown to the sample, electrons on a surface of the sample electrified by an electron beam from an electron gun is effectively neutralized by $N_2^-$ ions generated due to irradiation of ultra-violet rays, and for this reason it was possible to remarkably suppress deterioration of a resolution in an elect-on microscope which has been troublesome in the prior art.

In order to efficiently carry out electrolytic dissociation of $N_2$ gas by irradiating ultra-violet rays, pressure of $N_2$ gas in the ultra-violet rays irradiating section 106 is set to around 1 atmospheric pressure. The synthetic quartz window 107 provided in the ultra-violet rays irradiating section well transmits ultra-violet rays having a wavelength of, for instance, 360 nm or less, and any material may be used as material for this window provided that the material well transmits ultra-violet rays. Also as the electrolytically dissociated $N_2^-$ ions or electrons are blown in their electrolytically dissociated state to the sample 103, and for this reason it is required that at least an internal surface of the piping 108 between the ultra-violet irradiating sample 106 and the sample 103 is an insulating material, and although piping with the internal surface covered with a stainless steel passive state film was used in this embodiment, but other types of film such as a fluoride passive state film or Teflon® (PTFE) may be used.

Also $N_2$ was used as gas to be subjected to irradiation of ultra-violet rays, Ar gas or a mixed gas of $N_2$ and Ar may be used in place of $N_2$ gas for that purpose.

Also it has been recognized that the same effect can be achieved by using inert gas such as Xe or Kr.

As air exhaust is carried out by an exhaust system which can exhaust $N_2$ flowing at 1 cc/min under 1 atmospheric pressure at the exhaust rate of 1000 l/sec, so that pressure in the device 101 is kept at $1.3 \times 10^{-5}$ Torr, and under this degree of pressure, observation of a sample's surface is fully possible. Also a flow rate of the $N_2$ gas is decided according to a balance between the exhausting capability of the vacuum exhaust system and pressure in an available vessel 101, so that the flow rate can freely be set in a range allowed by the factors.

FIG. 6-2 shows the second embodiment of the present invention. In the device according to this embodiment a position of the $N_2$ gas injection port to be blown to the sample 201 in the vessel 205 can freely be moved by a sliding mechanism 204, and with this feature it is possible to move the injection port 202 of the piping 203 for $N_2$ gas to a position where the injection port does not impede a sample being carried into or out from the vessel 205, and then to move the injection port 202 to a position adjacent to a sample when observing a surface of the sample, so that it is possible to efficiently prevent the sample from being electrified. Other portions of the configuration are the same as those as described in relation to FIG. 6-1, so that description thereof is not provided herein.

FIG. 6-3 is a drawing illustrating the third embodiment of the present invention. In other words, this figure is a block diagram of an ion implanter in which a source and a drain section in, for instance, MOSFET can be formed by irradiating, for instance, As ions accelerated in an ion source electric field and introduced into a vessel on to a surface of the sample 302 in the vessel 301 vacuumed to a depressurized state by a vacuum exhaust system having an exhausting capability of, for instance, 1000 l/sec under reduced pressure. Principle of generation of damages to a sample in this device was described in detail in relation to the prior art, so that detailed description thereof is not provided herein.

Feature of the device according to the present invention consists in that said device has a means for irradiating ultra-violet rays to $N_2$ gas using the deuterium lamp 303 and blowing the $N_2$ gas to a surface of a sample. The ultra-violet rays are irradiated through the synthetic quartz window in the irradiating section 304 to $N_2$ gas flowing at a flow rate of, for instance 1 cc/m n under normal pressure, and the $N_2$ gas subjected to irradiation of ultra-violet rays pass through the piping 306 for gas with an oxidized passive state film having a thickness of around 100 Å on the internal surface and is blown to a surface of a sample placed in a depressurized state.

Because of this irradiation of ultra-violet rays, a portion of the $N_2$ gas is electrolytically dissociated to $N_2^-$ ions and electrons.

Also in this case, like in the embodiment shown in FIG. 6-1, electrons on a surface of a sample were effectively deleted by $N_2^-$ generated due to irradiation of ultra-violet rays when $N_2$ gas subjected to irradiation of ultra-violet rays were blown to the sample as shown in the embodiment in FIG. 6-1, and it was possible to remarkably suppress deterioration of the gate insulating film of, for instance MOSFET, which has been troublesome in the prior art.

In order to efficiently carry out electrolytic dissociation of $N_2$ gas by irradiation of ultra-violet rays, pressure of $N_2$ gas in the ultra-violet ray is set to around 1 atmospheric pressure. The quartz window 305 provided in the ultra-violet rays irradiation section well transmits ultra-violet rays having a wavelength of, for instance, 360 nm, and any other material may be used on the condition that the material can transmit ultra-violet rays. Also to blow electrolytically dissociated $N_2^-$ and $e^-$ in their electrolytically dissociated state to the sample 302, it is required that at least the internal surface of the piping 306 connecting the ultra-violet rays irradiating section 304 to the sample 302 is an insulating material, and although piping with an internal surface covered with a stainless steel passive state film is used in this embodiment, other insulating material such as a fluoride passive state film or Teflon® (PTFE) may be used.

Although $N_2$ gas is used in this embodiment as gas to be subjected to irradiation of ultra-violet rays, Ar gas or a mixed gas of $N_2$ and Ar may be used in place of $N_2$ gas for the purpose. It has been recognized that the same effect can be achieved also by using inert gas such as Xe or Kr.

As air is exhausted by an exhaust system having the exhausting capability to exhaust $N_2$ flowing at a rate of 1 cc/min under 1 atmospheric pressure at the rate of 1000 l/sec, the pressure in the device 301 is kept at $1.3 \times 10^{-5}$ Torr and under the pressure as described above an average free travel of Ar gas is around 7 m, and no trouble for ion implantation occurs. Also a flow rate of the gas is decided according to a balance between an exhausting capability of the vacuum exhaust system and the pressure in the available device 301, so that the flow range can freely be set in a range allowable according to these parameters.

Also in this device, the configuration allowing free movement of a position of the injection port 307 for $N_2$ gas blown to the sample 302 is allowable, and with this feature it becomes possible to move the $N_2$ gas injection port to a position where said port does not impede the sample 302 when carried into or out of the vessel 301 and also to move said injection port to a position adjacent to the sample when carrying out ion implantation, which in turns makes it possible to efficiently prevent electrification of the sample with a small quantity of gas.

The electron beam direct drawing device (EB) is a device which forms a ultra fine spatter at an order of sub-half micron by irradiating an electron beam to electron beam resist spread on a sample in a depressurized state. Also in this device, it s possible to effectively delete electrons in a surface of a sample negatively electrified by irradiation of an electron beam during drawing a pattern by blowing $N_2$ gas subjected to irradiation of ultra-violet rays to the sample. With this feature, such problems as pattern displacement due to electrification, which have been troublesome in the prior art, are solved, and it has become possible to form a pattern for a ultra high density and ultra high processing speed integrated circuit.

Also this device can be applied to a secondary ion mass spectrometer (SIMS) to carry cut mass spectrography of secondary ions coming out from a sample's surface when an ion bean is irradiated to the sample placed in a depressurized state. Namely in mass spectrography with a conventional type of SISM, a sample is positively electrified during analysis due to irradiation of ions, so that secondary ions are accelerated when coming out from a surface of the sample, and such problems as an error during mass spectrography are disadvantageously generated. However, it becomes possible to efficiently delete positive electric charge on a sample's surface with electrons in electrolytically dissociated gas and remarkable suppress electrification by blowing such gas as $N_2$ gas subjected to irradiation of ultra-violet rays to the sample's surface like in the SEM, or an ion implanter as described above.

Figures 1, 2, 3, 4, 5, 6, 7:
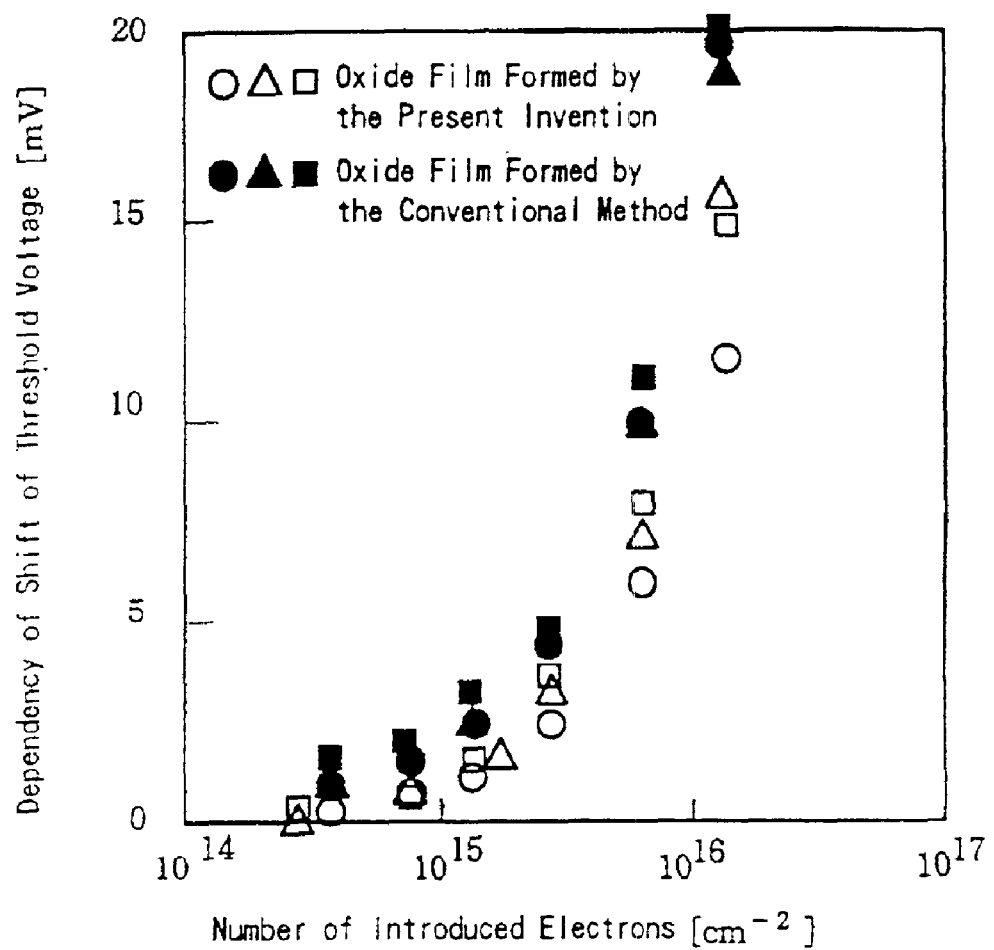
Figures 1, 2:
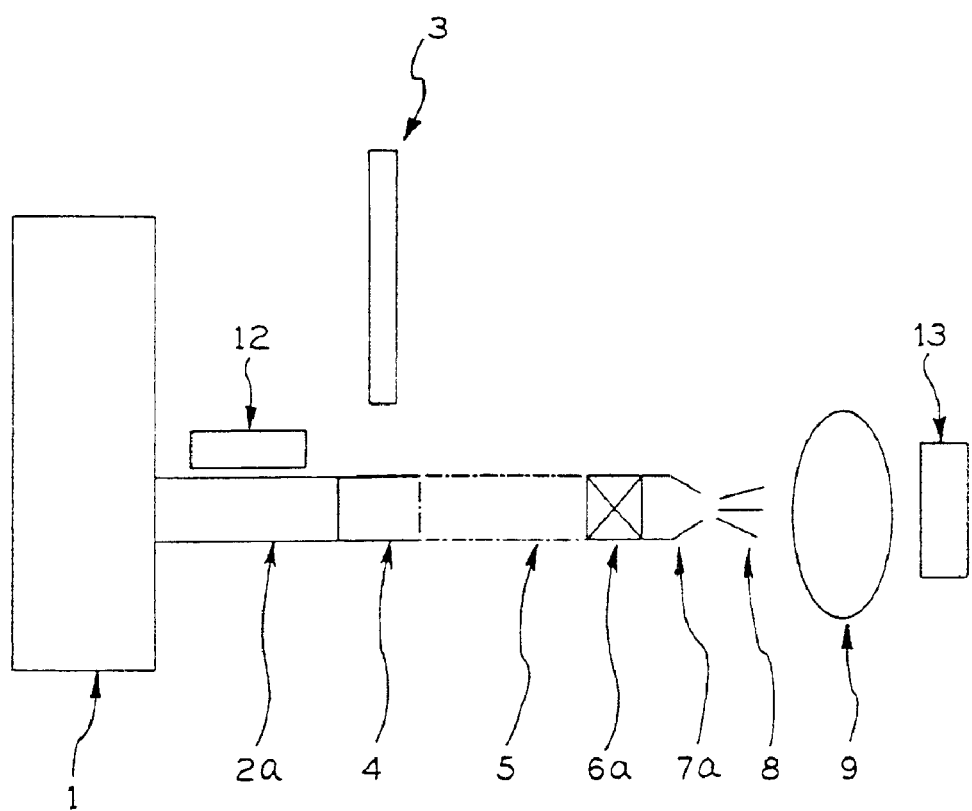
Figure 2:
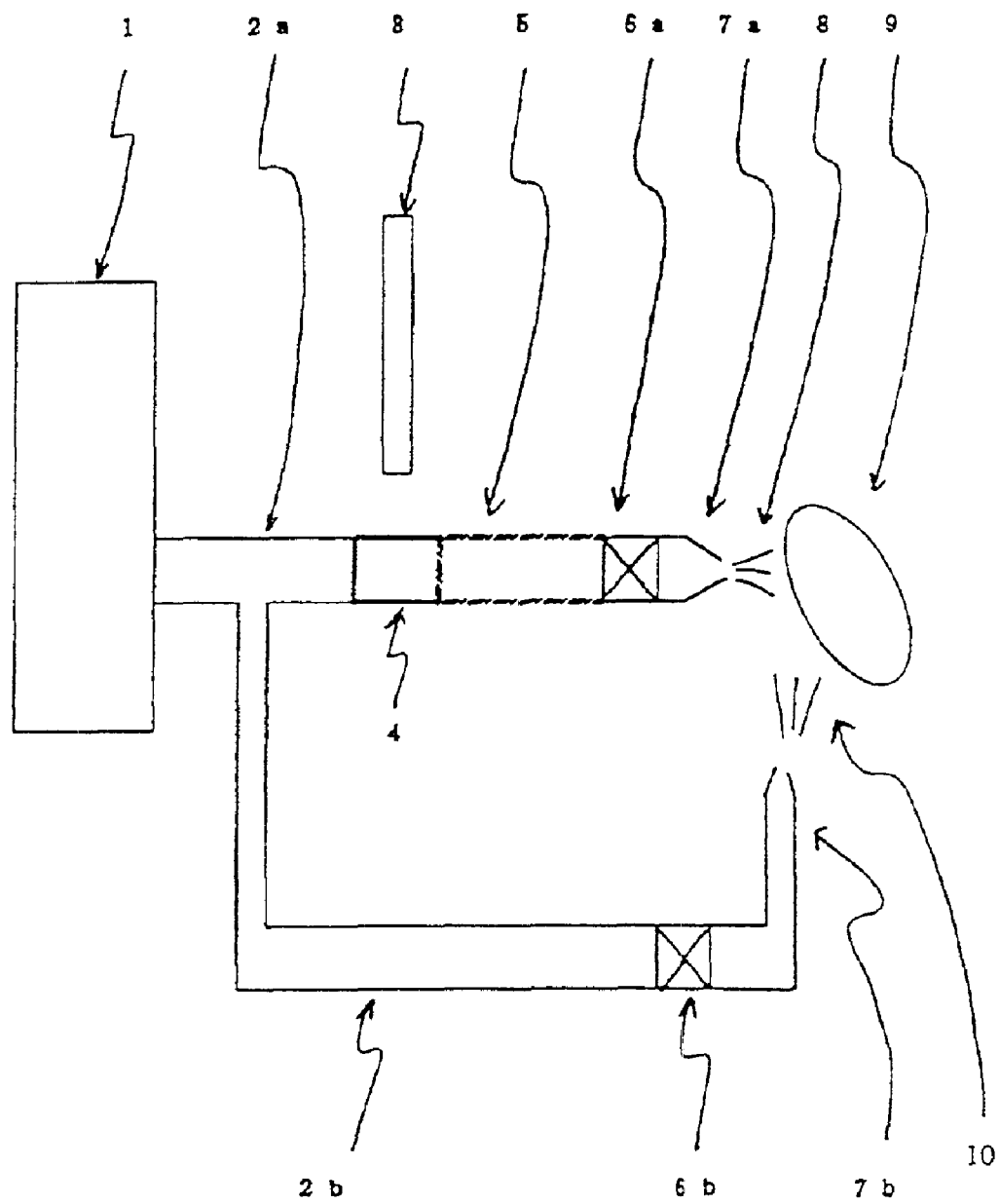
Figures 2, 3:
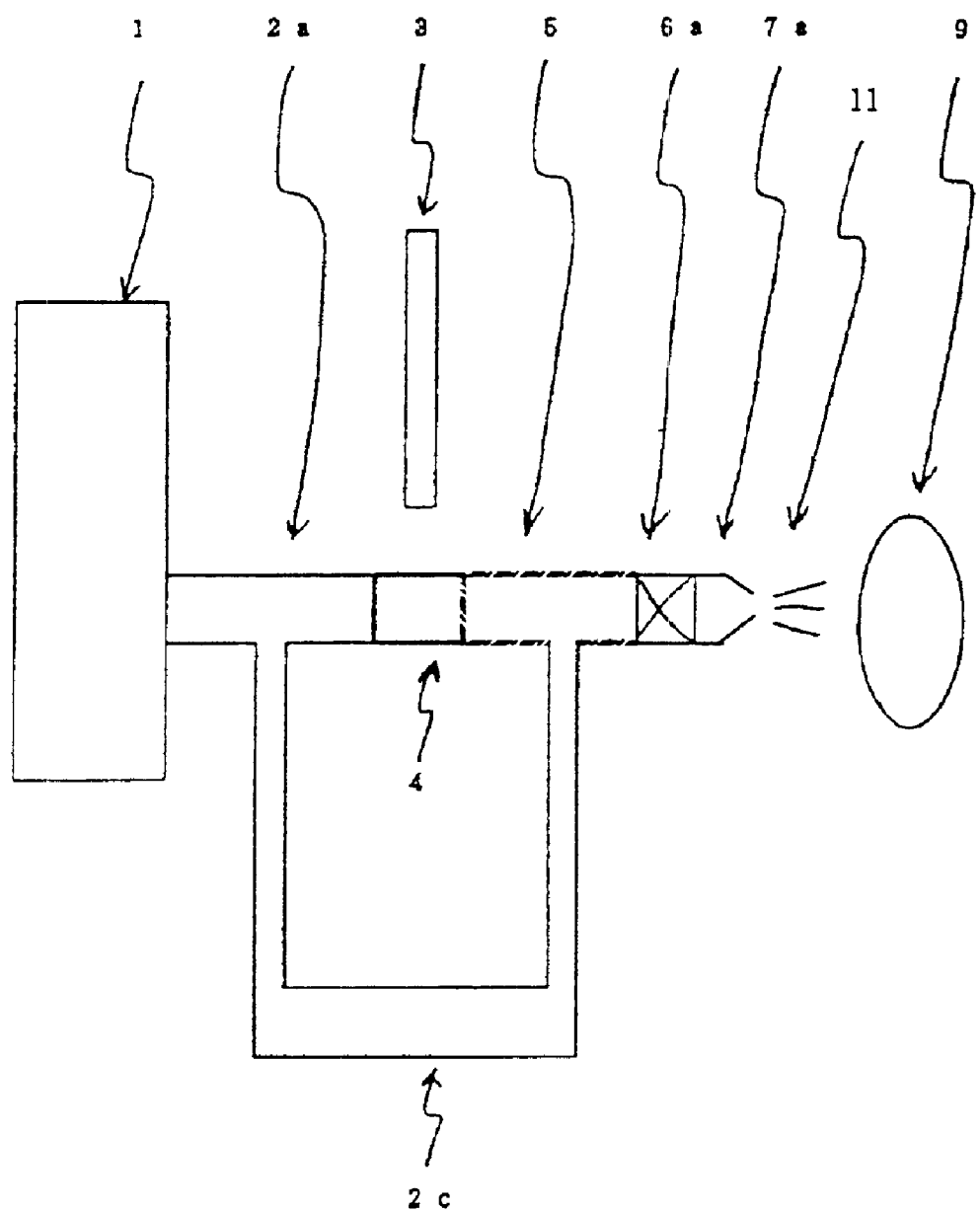
Figures 1, 3:
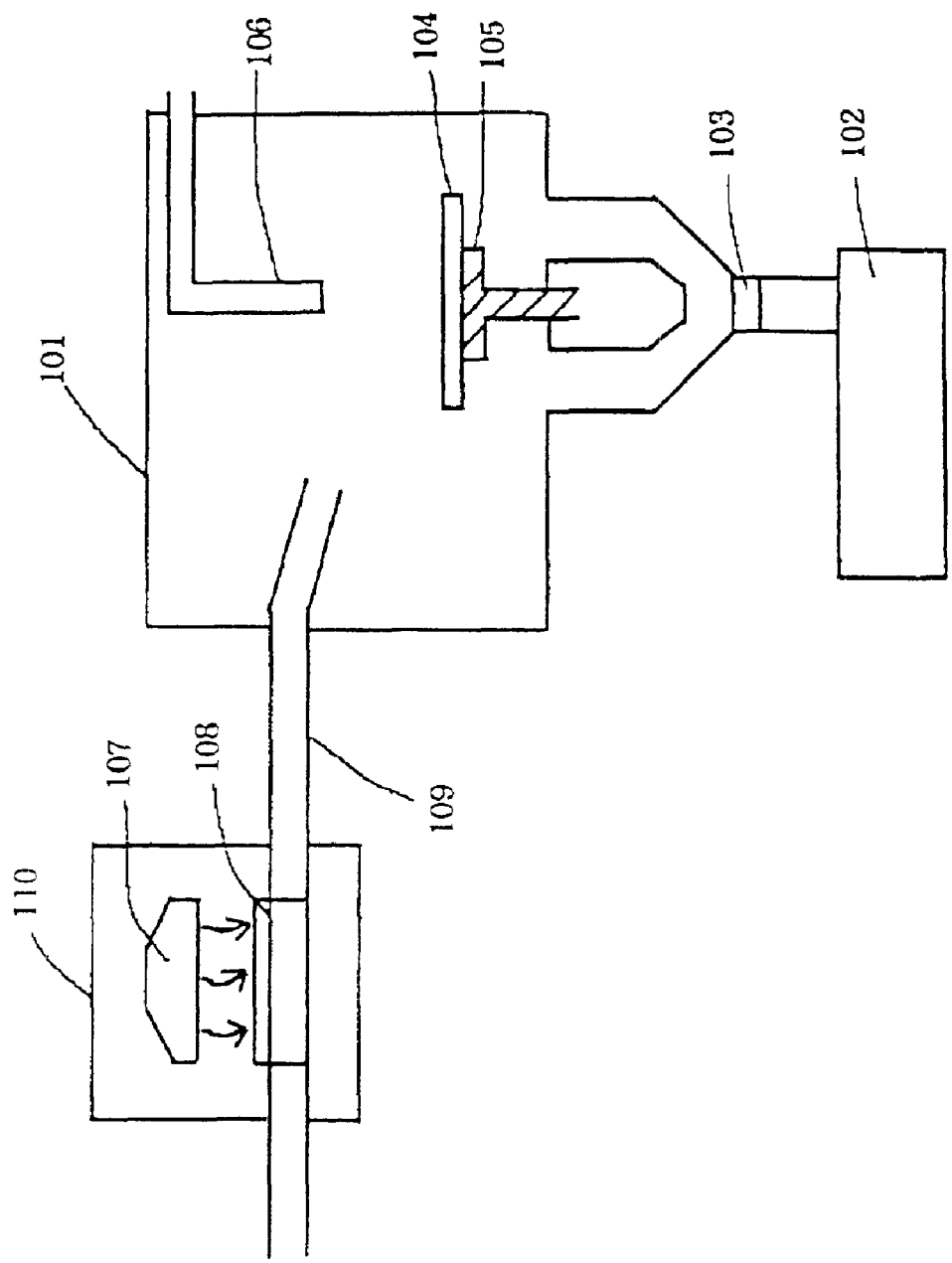
Figures 2, 3:
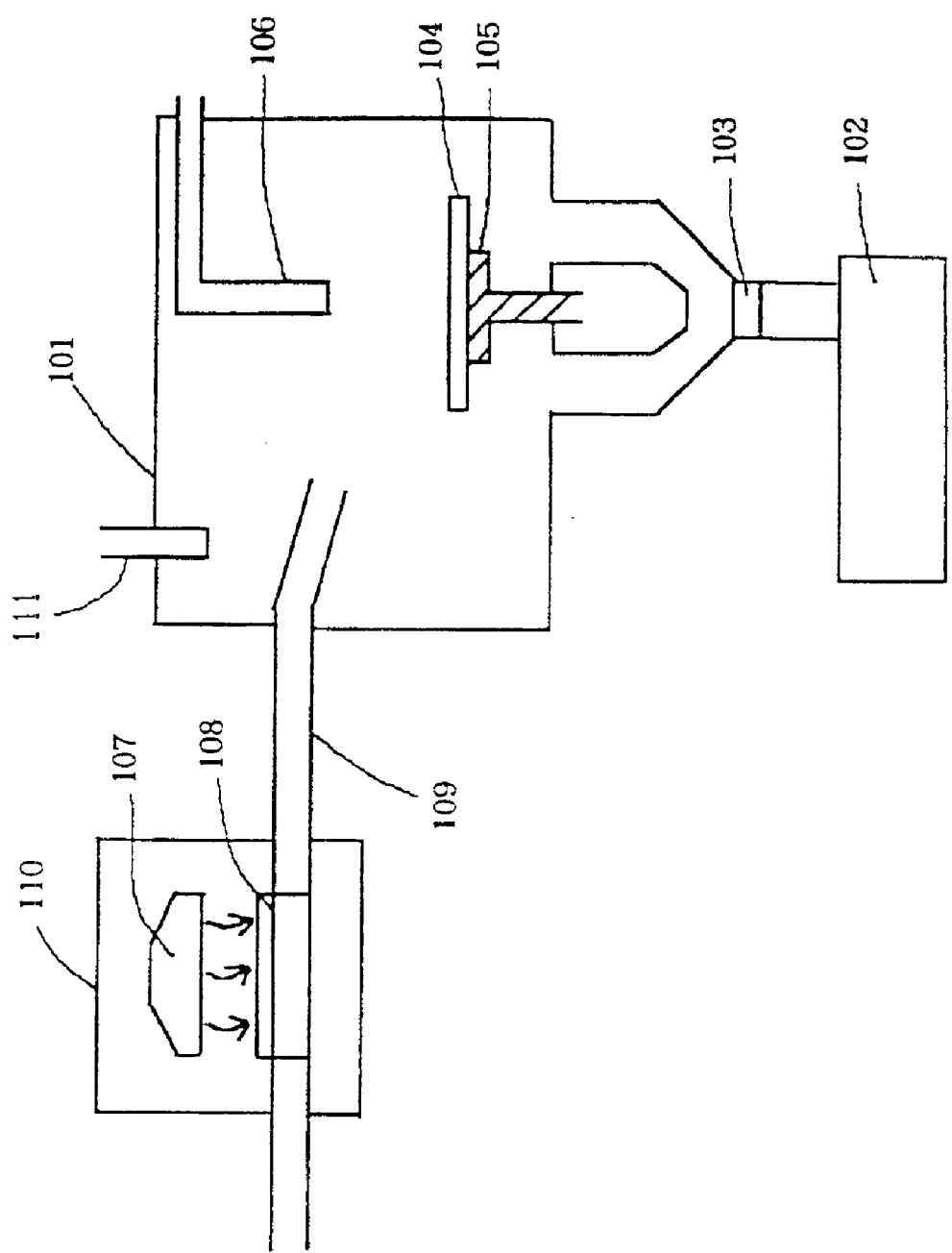
Figure 3:
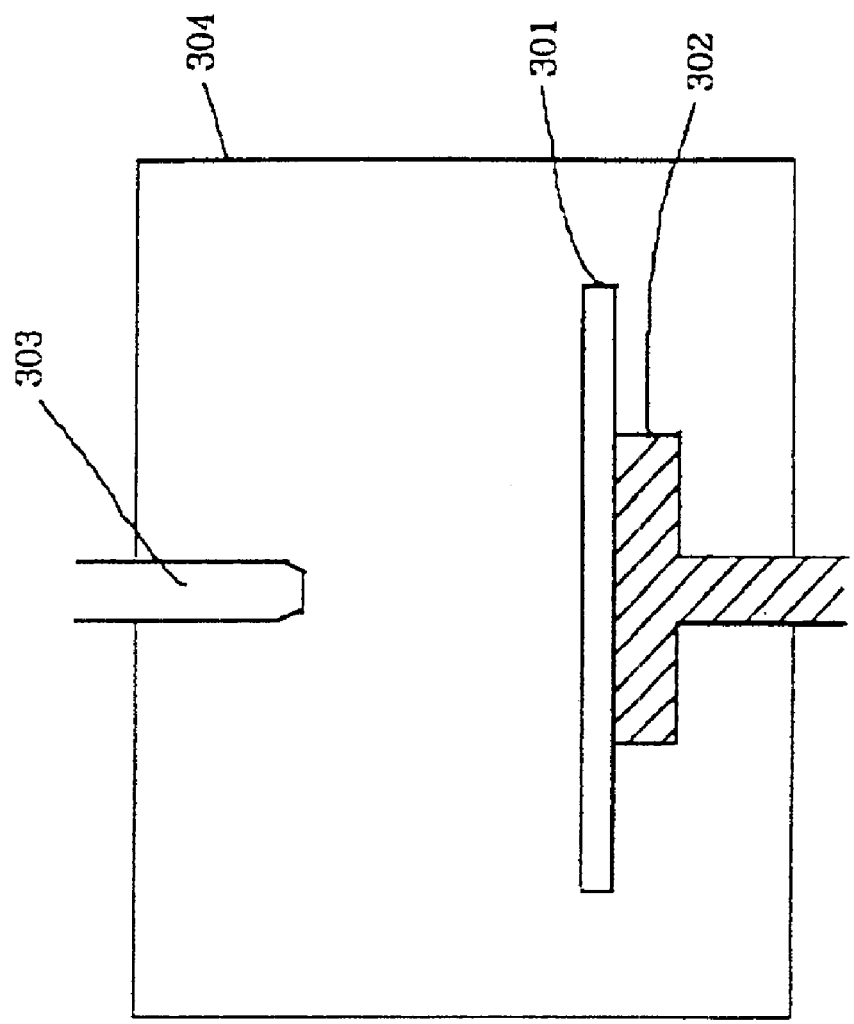
Figures 1, 4:
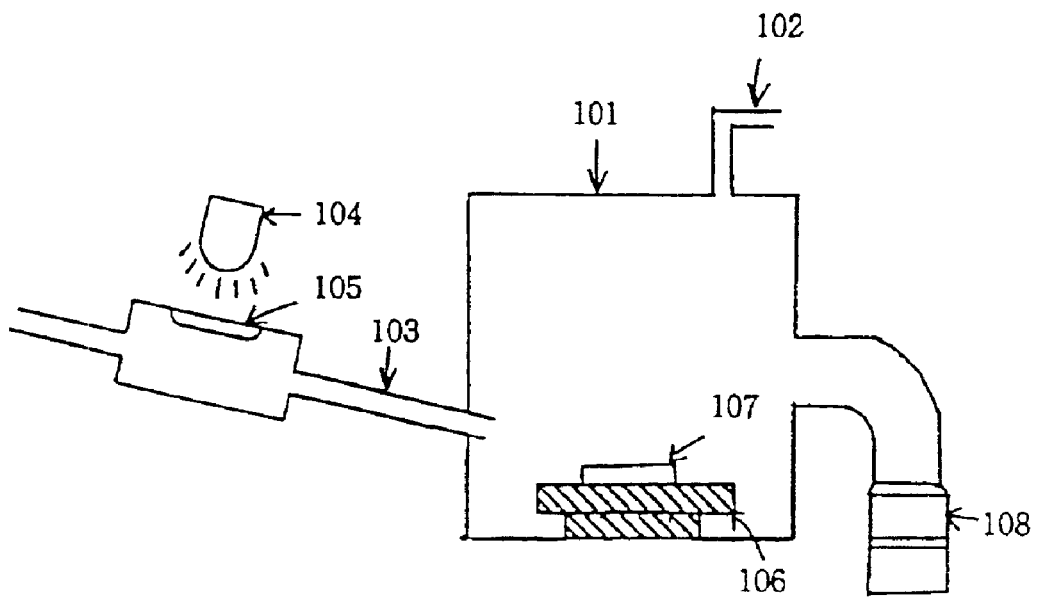
Figures 2, 4:
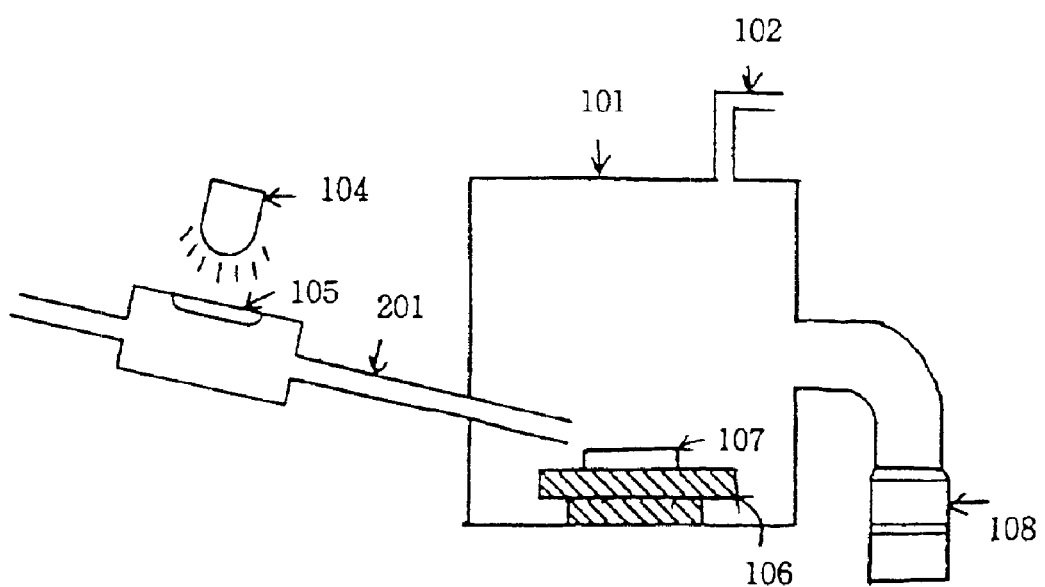
Figures 3, 4:
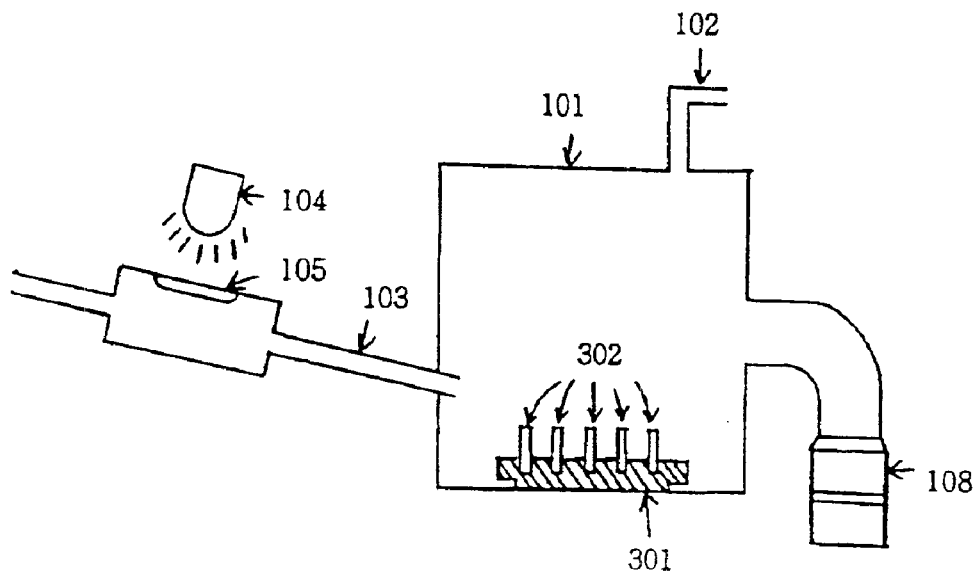
Figure 4:
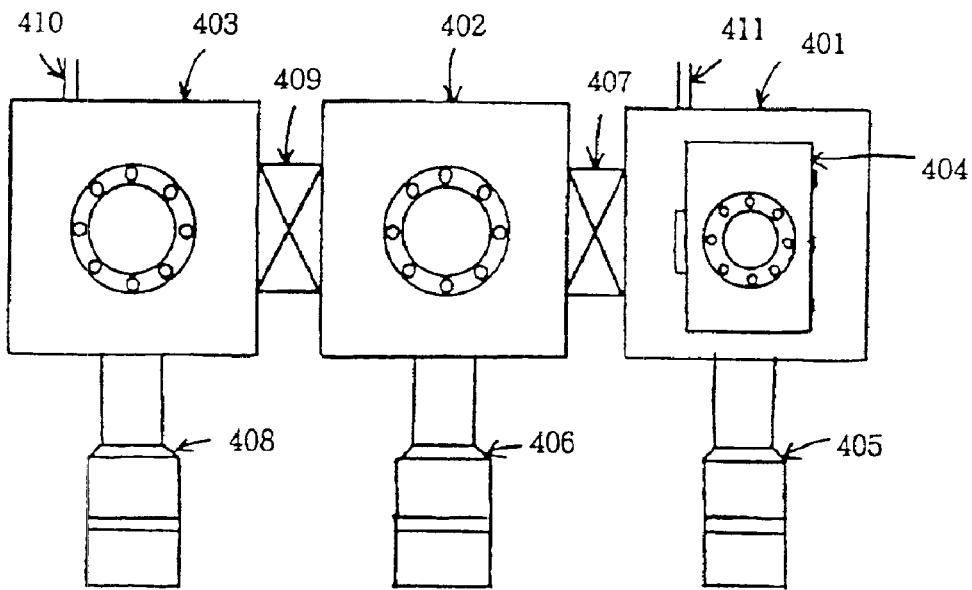
Figures 1, 5:
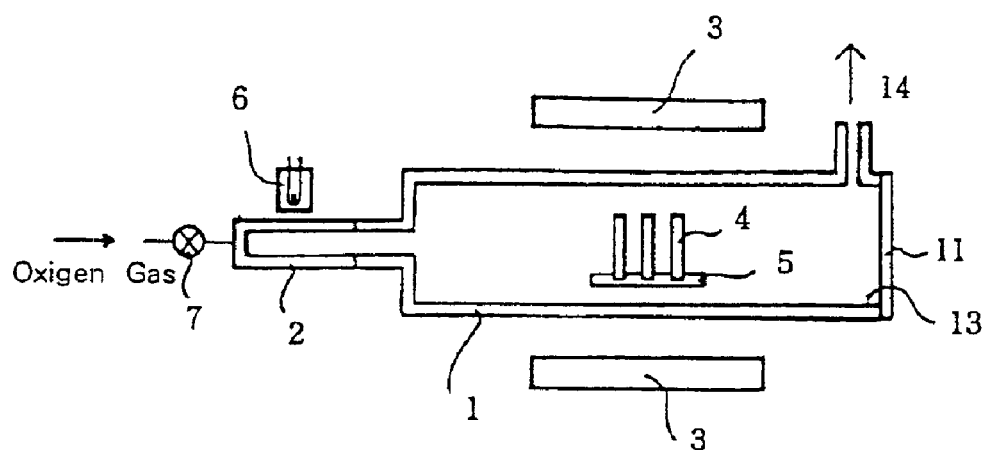
Figures 2, 5:
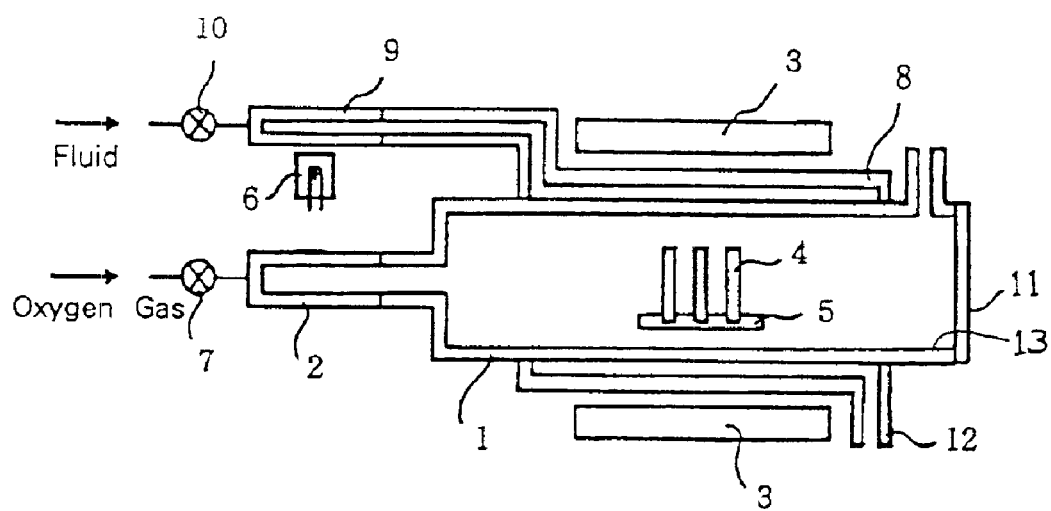
Figures 3, 5:
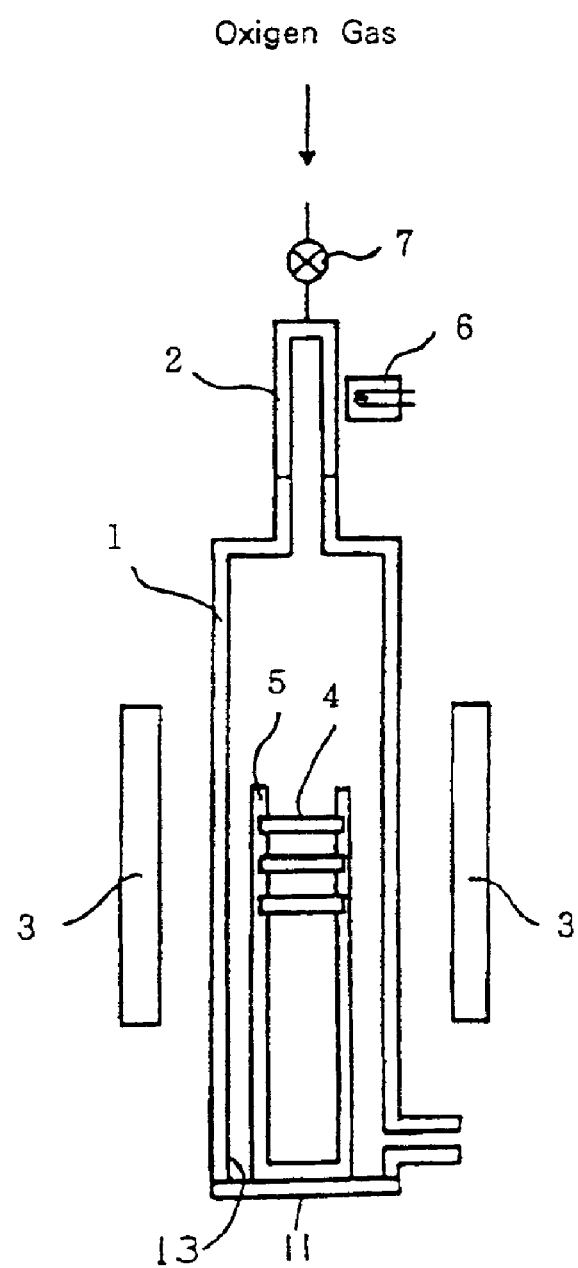
Figures 4, 5:
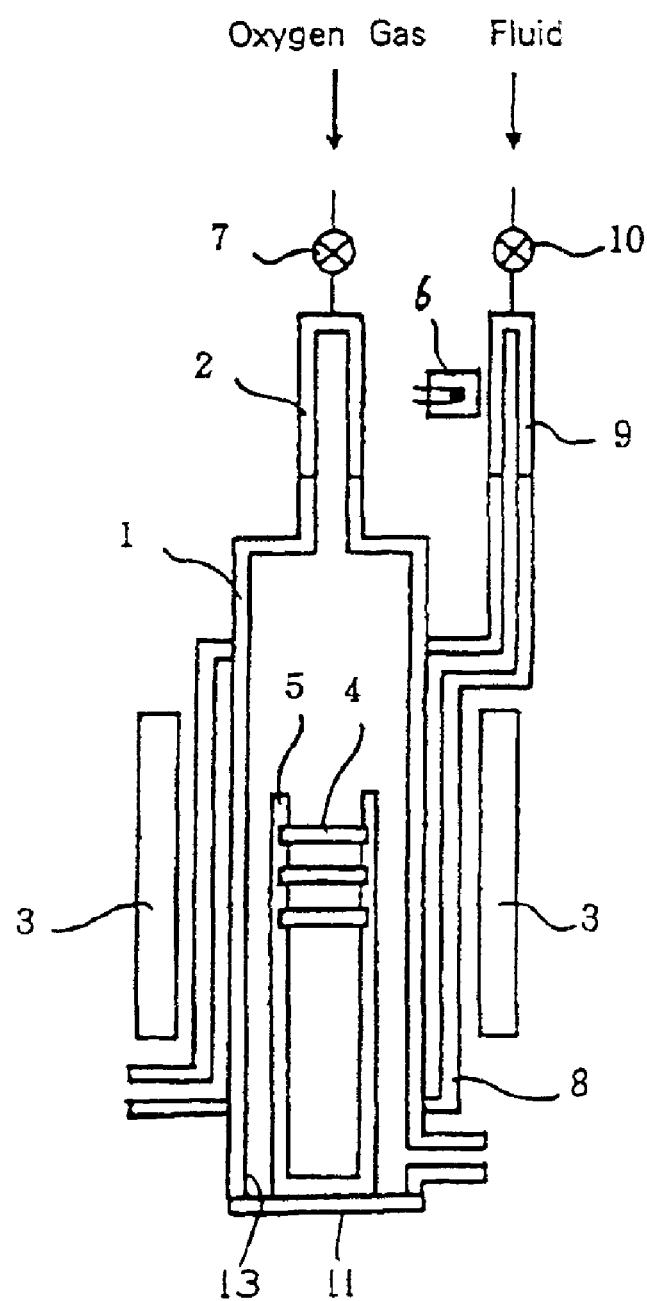
Figure 5:
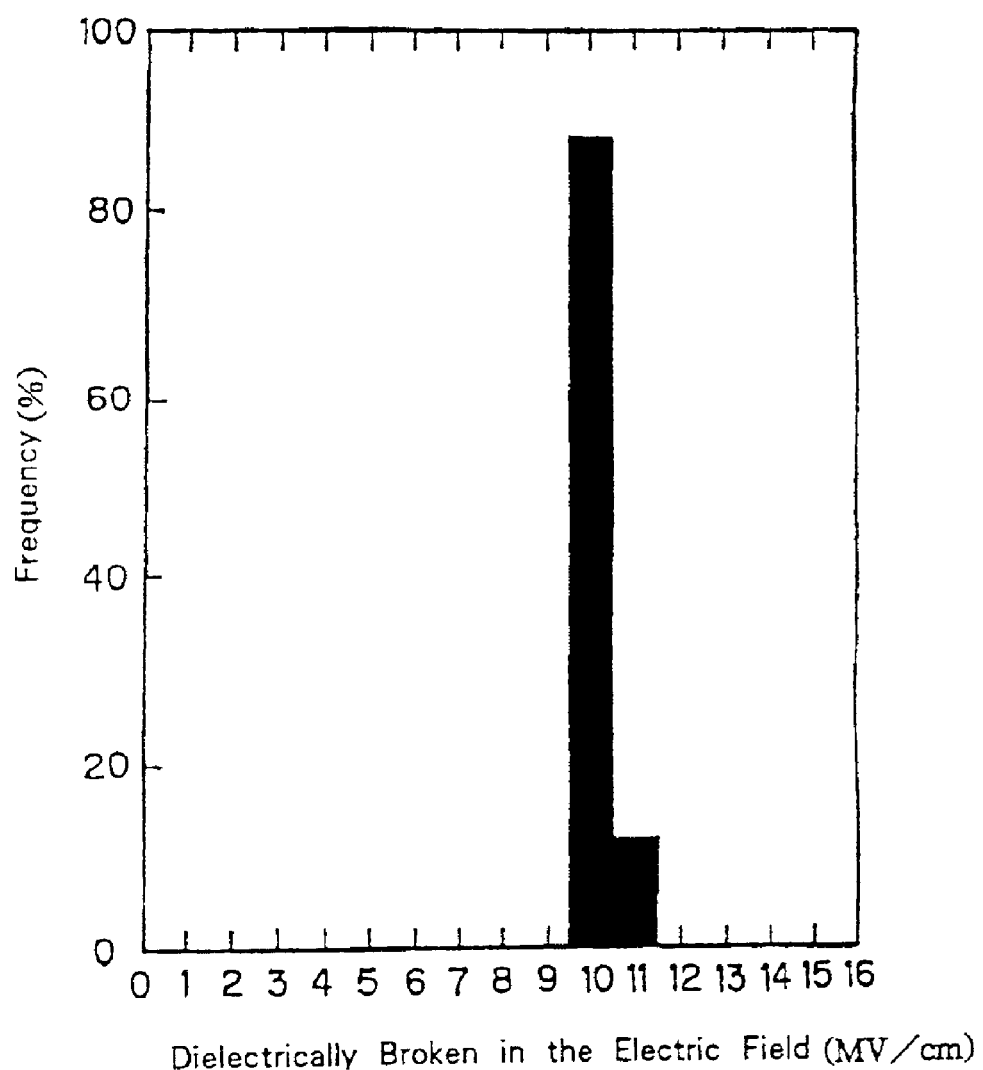
Figures 5, 6:
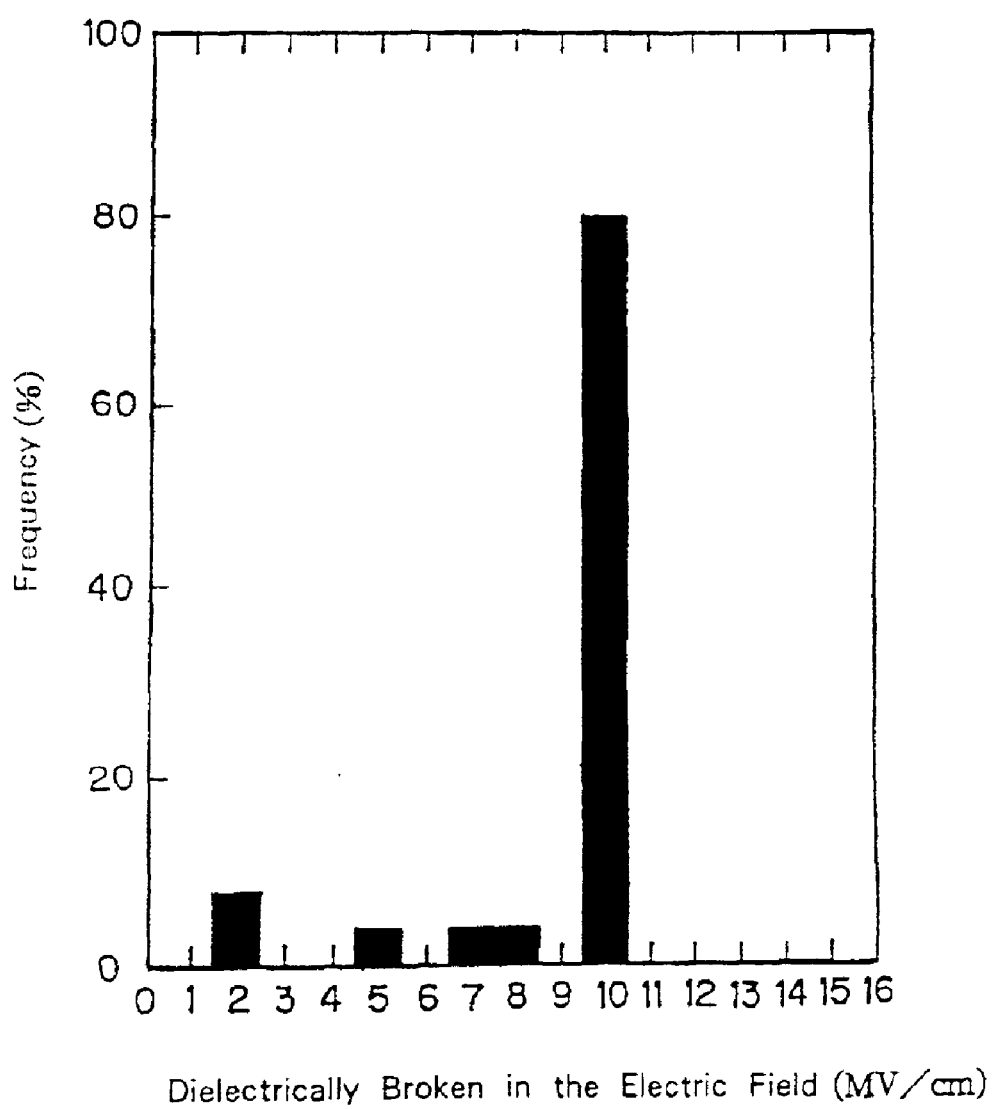
Figures 1, 6:
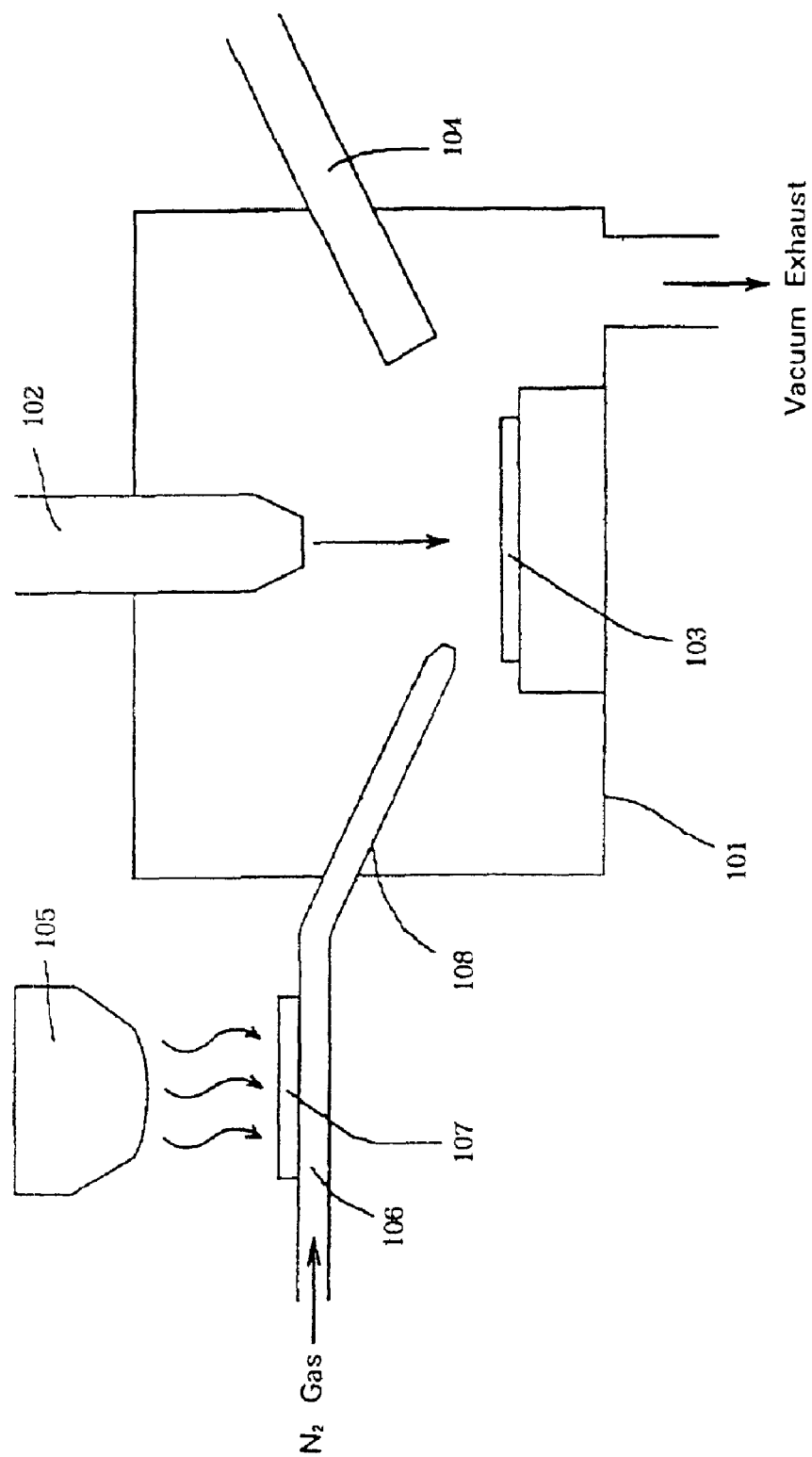
Figures 2, 6:
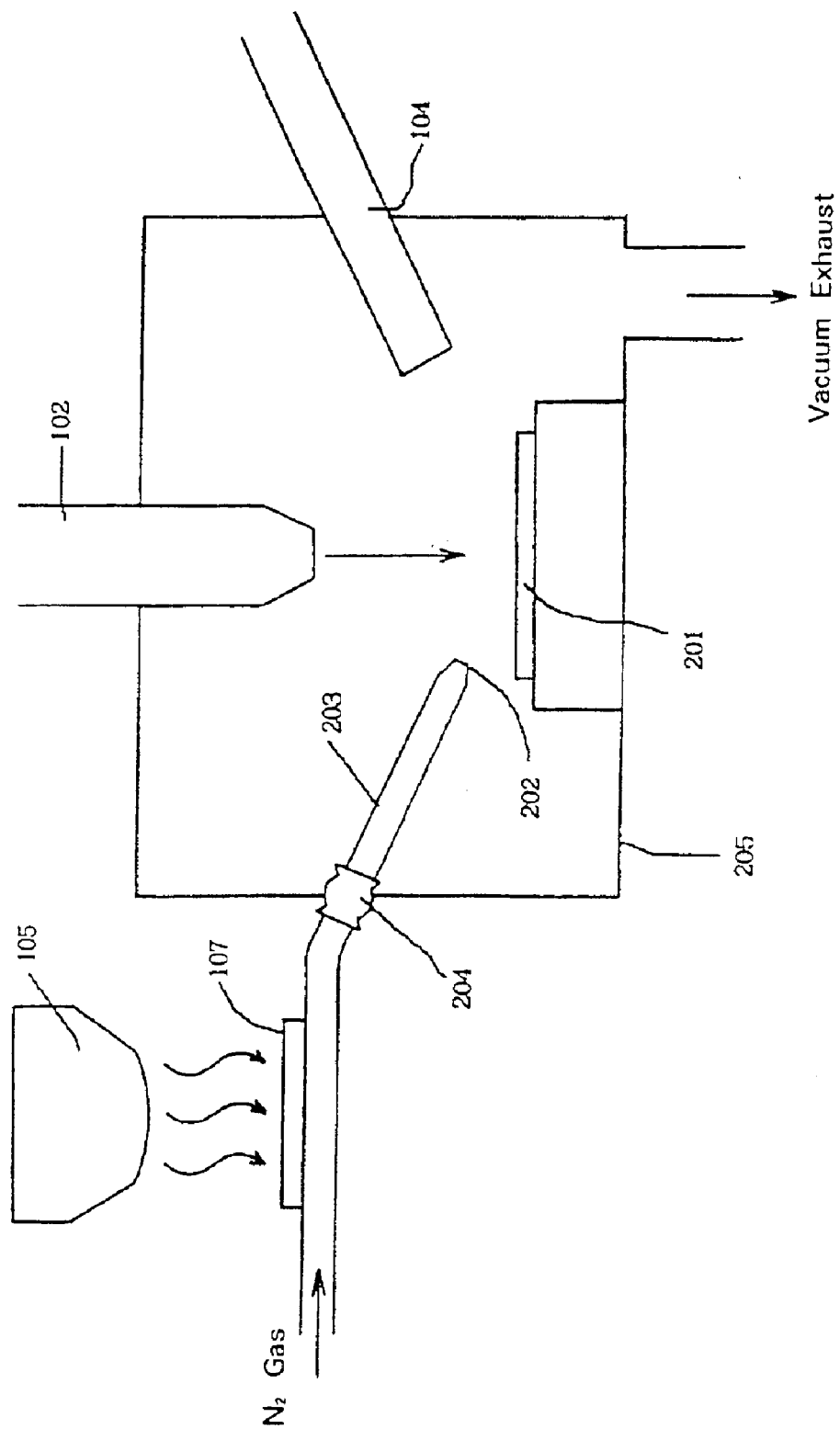
Figures 3, 6:
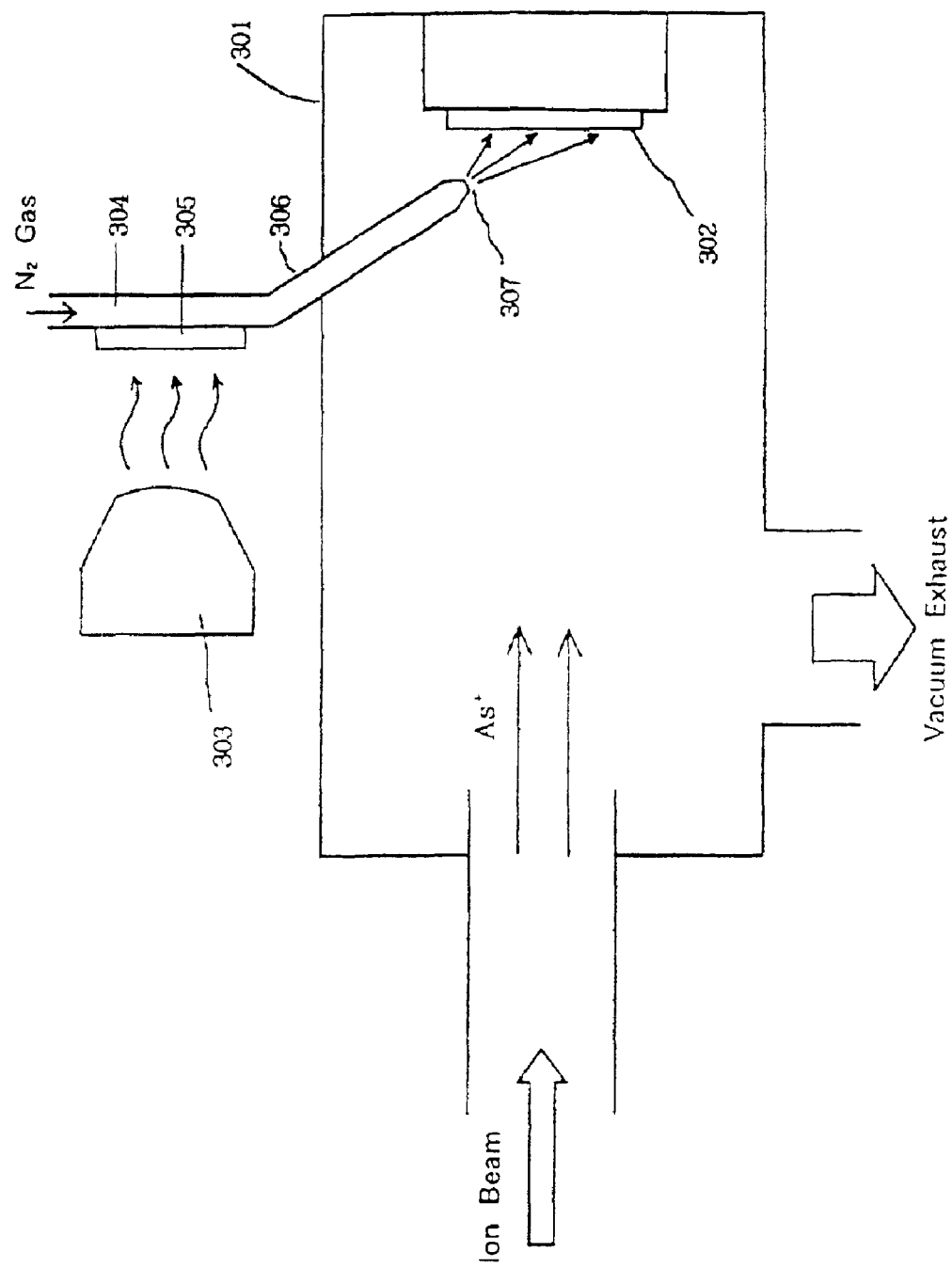
Figures 4, 6:
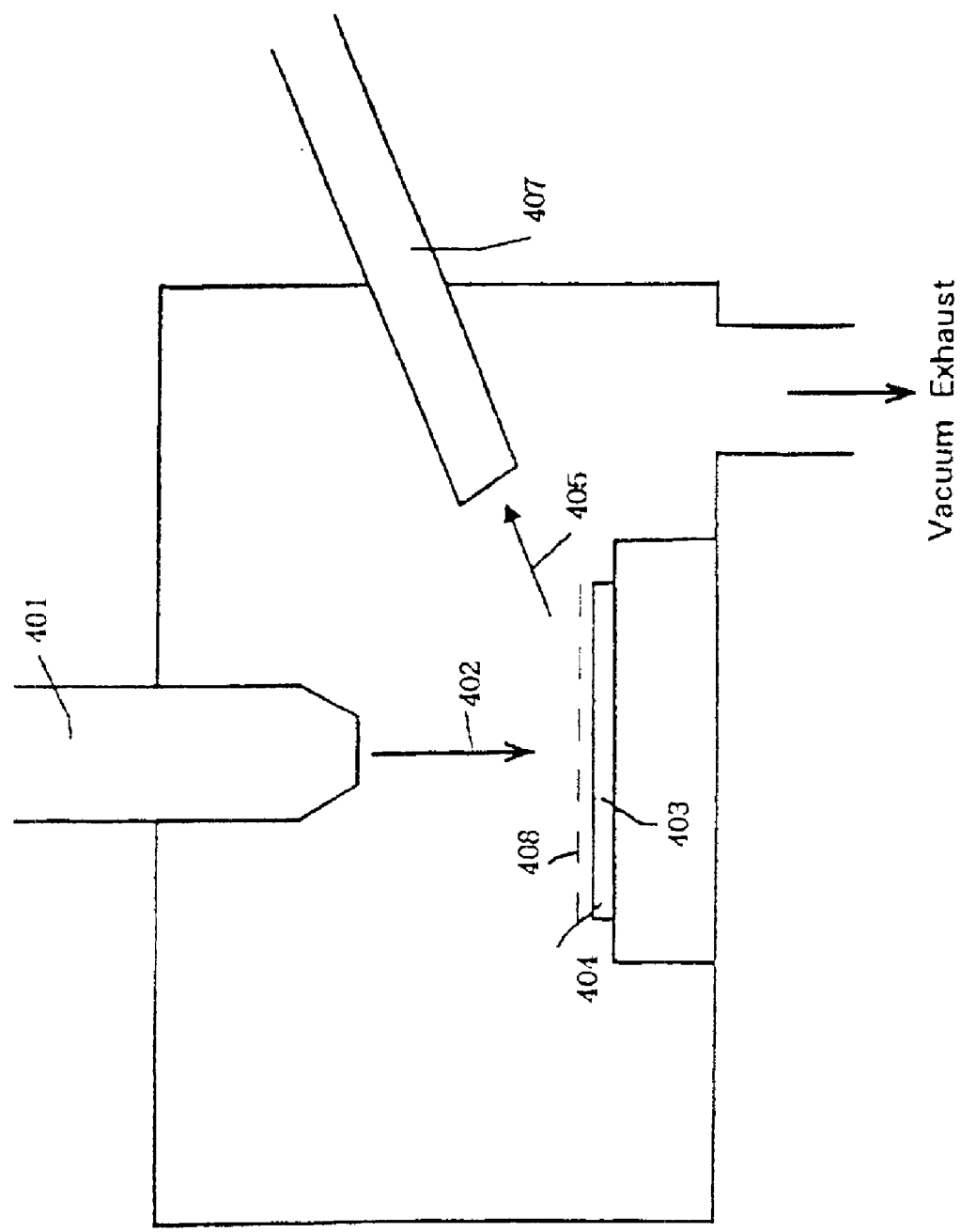
Figures 5, 6:
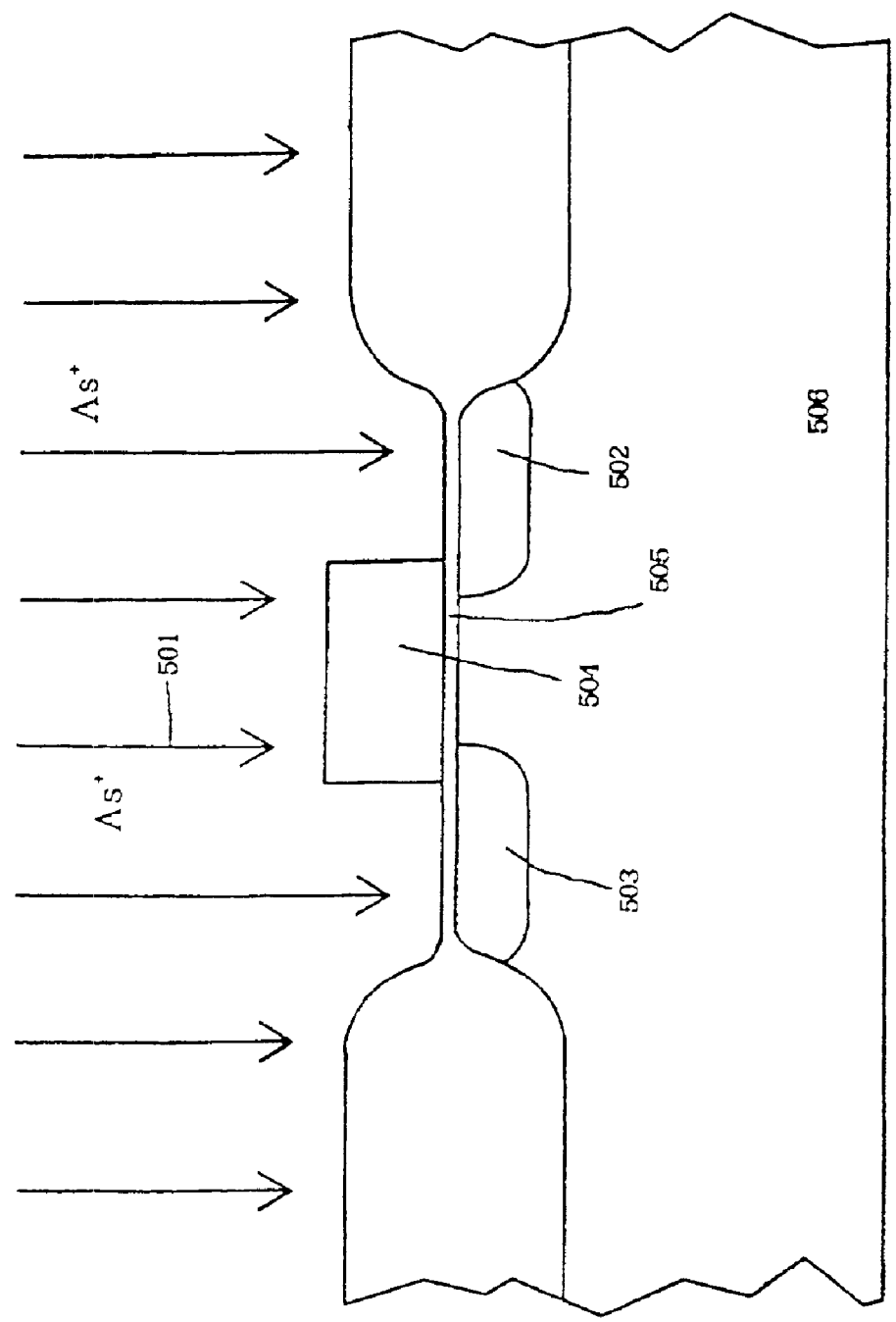
Figures 1, 7:
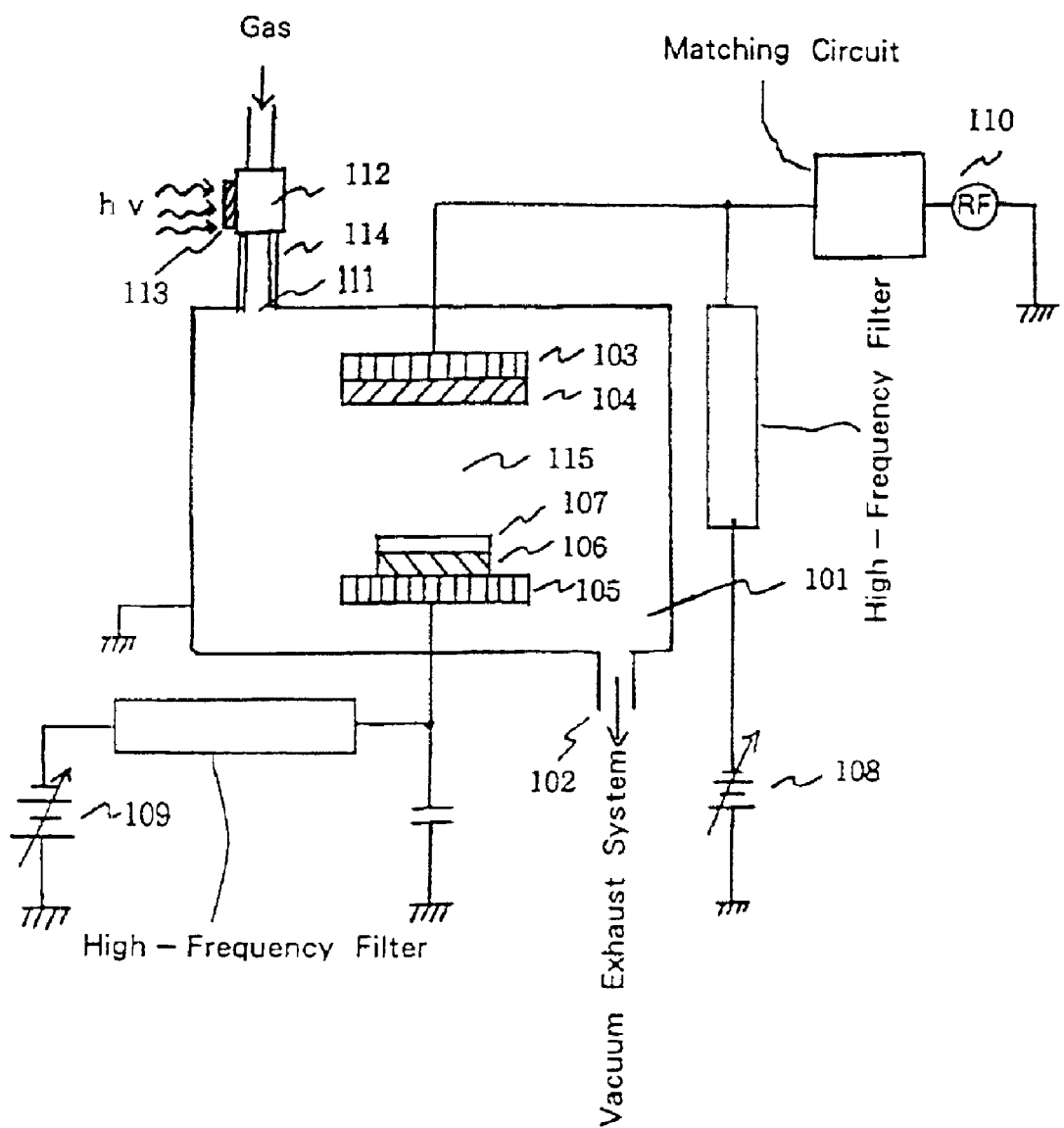
Figures 2, 7:
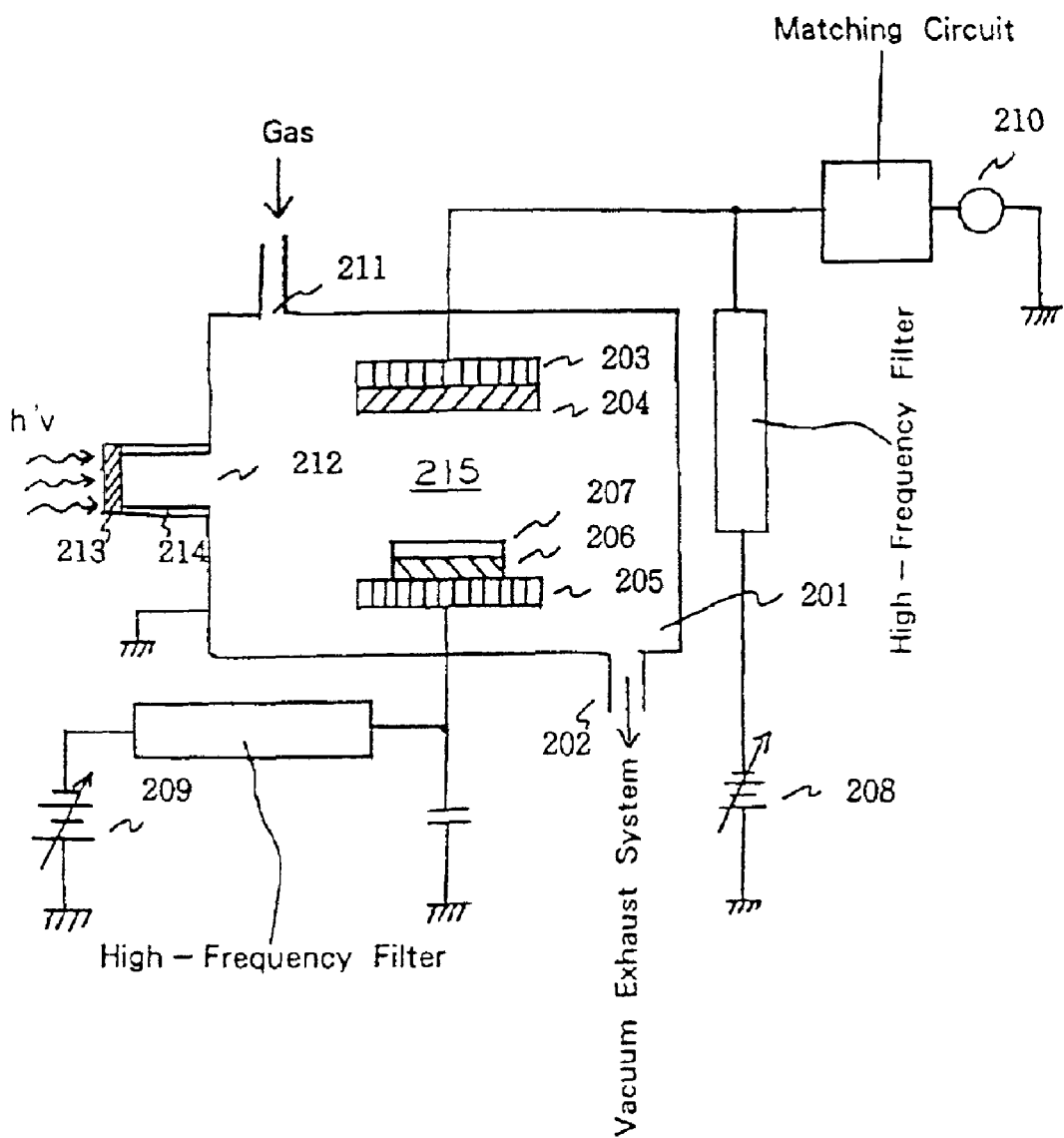
Figures 3, 7:
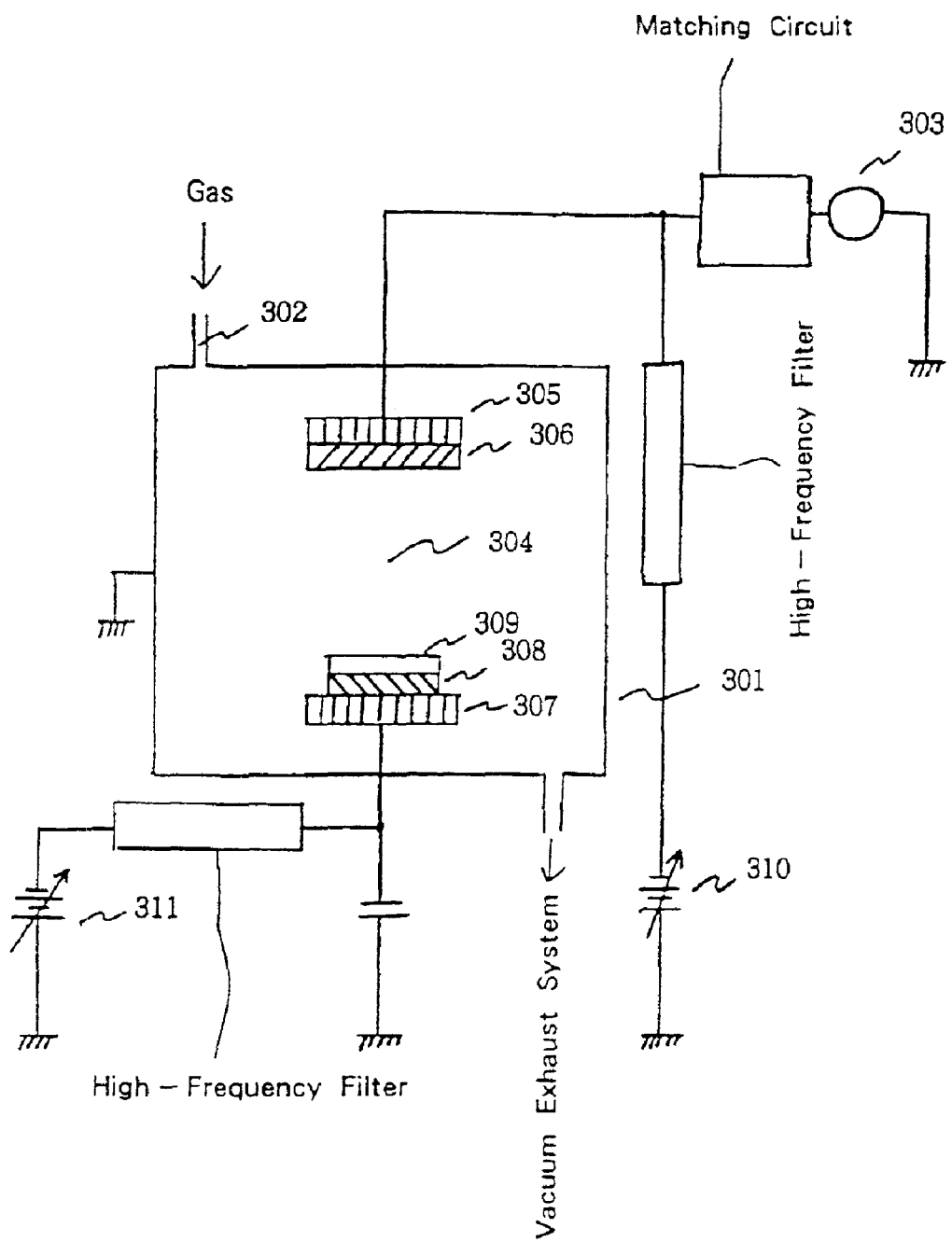

Next description is made for an embodiment of the present invention with reference to FIG. 7-1.

FIG. 7-1 is a simplified illustration for a bias sputtering device based on an RF-DC bonding system according to the first embodiment of the present invention. Feature of this device was detailed in detail in relation to the prior art, so that description thereof is omitted herein. Herein detailed description is made for features of this invention. In this figure, the reference numeral 111 indicates a gas inlet port to introduce Ar gas into a depressurizable vessel 101, and the irradiating section 112 for irradiating ultra-violet rays to Ar gas introduced into the vessel 101 and the piping 114 with at least the internal surface covered with a stainless steel oxidized passive state film are connected to the same. The synthetic quartz window is provided in the ultra-violet irradiating section 112, and the window well transmits ultra-violet rays having a wavelength of, for instance, 360nm. It should be noted that, in the piping connecting the irradiating section 112 to the vessel 101, at least the internal surface thereof must be coated with an insulating film to introduce electrolytically dissociated $Ar^-$ ions or electrons $e^-$ in their electrolytically dissociated state to between the opposing electrodes 115 provided in the vessel 101, and although piping with the internal surface coated with a stainless steel oxidized passive state film was used in this embodiment, other insulating film such as a fluoride passive state film, a nitrate passive state film, or Teflon® (PTFE) may be used. Also the synthetic quartz window 113 was used in the irradiating section 112 for irradiating ultra-violet rays in this embodiment, any other material may be used provided that the material well transmits ultra-violet rays.

FIG. 7-2 is a drawing illustrating the second embodiment of the present invention.

Feature of this embodiment consists in that an irradiation port having an irradiating section, in which ultra-violet rays are irradiated to between opposing electrodes provided in a depressurizable vessel, is provided therein. The piping between the irradiating section and the irradiation port is not for introducing electrolytically dissociated $Ar^-$ ions or electrons $e^-$ in their electrolytically dissociated state to between opposing electrodes provided in the vessel 101, so that the internal surface must not always be an insulating film. However, to maintain electrolytically $Ar^-$ ions or electrons $e^-$ in their electrolytically dissociated state for a long time, it is preferable that the internal surface of the joint piping is an insulating film.

Furthermore, also the entire internal surface of the vessel preferably is coated with an insulating film so that electrolytically dissociated $Ar^-$ ions or electrons $e^-$ can reside there as long as possible. Other portions in this configuration are the same as those in the first embodiment of the present invention, so that description thereof is omitted herein. Also the problems to be solved and means for solving the problems are completely the same as those in the first embodiment, and also it is needless to say that also the operation and the effect are the same as those in the first embodiment.

As clearly shown in description of the above embodiments, it is extremely important to accurately control a voltage difference between plasma and an Si substrate as well as to prevent a surface of a Si substrate from being electrified for improve quality of various types of thin films used as material for ultra LSI. Furthermore most of prior art-based process devices are mainly based on thermochemical reactions, and parameters which can be controlled from the outside are very few; namely temperature, gas pressure, and gas flow rate. Furthermore, the same situation also exists in a process making use of plasma, and a voltage in an Si substrate has been controlled by making use of a natural voltage difference between plasma and the Si substrate; namely self bias. In the future, to satisfy the needs for higher product quality and higher preciseness in processes at an order of sub-microns, all process parameters will have to be controlled electronically. The most important factor for that purpose is a voltage in an Si substrate to be processed, and it is obvious that use of a plasma treatment apparatus is indispensable for that purpose.

It should be noted that, although the above description assumes uses of a bias sputtering device, the same effect can be achieved also by a technology making use of plasma such as the RIE technology, or plasma CVD technology, CVD or etching technology making use of ECR, or reactive bias sputtering technology. Also an Si substrate was used as an object to be processed in this embodiment, but also a chemical compound semiconductor or material other than semiconductor may be used. Also Ar gas was used in this embodiment as gas to be subjected to irradiation of ultra-violet rays, inert gas such as $N_2$, Xe, Kr may be use for that purpose. Also a mixture of, for instance, Ar gas and He gas, or of Ar gas and $N_2$ may be used in place of that. Also a mixture of Ar gas and $H_2$ gas, or that of CF4 gas and $O_2$ gas each reactive with Ar gas, a mixture of various types of reactive gasses, or reactive gas only may be used. Also the above description assumes a case where ultra-violet rays are irradiated from a projecting means to gas introduced through a gas inlet port of a vessel and a case where ultra-violet rays are irradiated to between opposing electrodes provided in a vessel, but it is not always required that ultra-violet rays irradiated to only one of them, and ultra-violet rays may be irradiated to both simultaneously. Also ultra-violet rays may be irradiated not only to generate plasma or to prevent electrification after disappearance of plasma, but also while plasma is being generated under stable conditions.

(Embodiment 1)

Figures 1, 8:
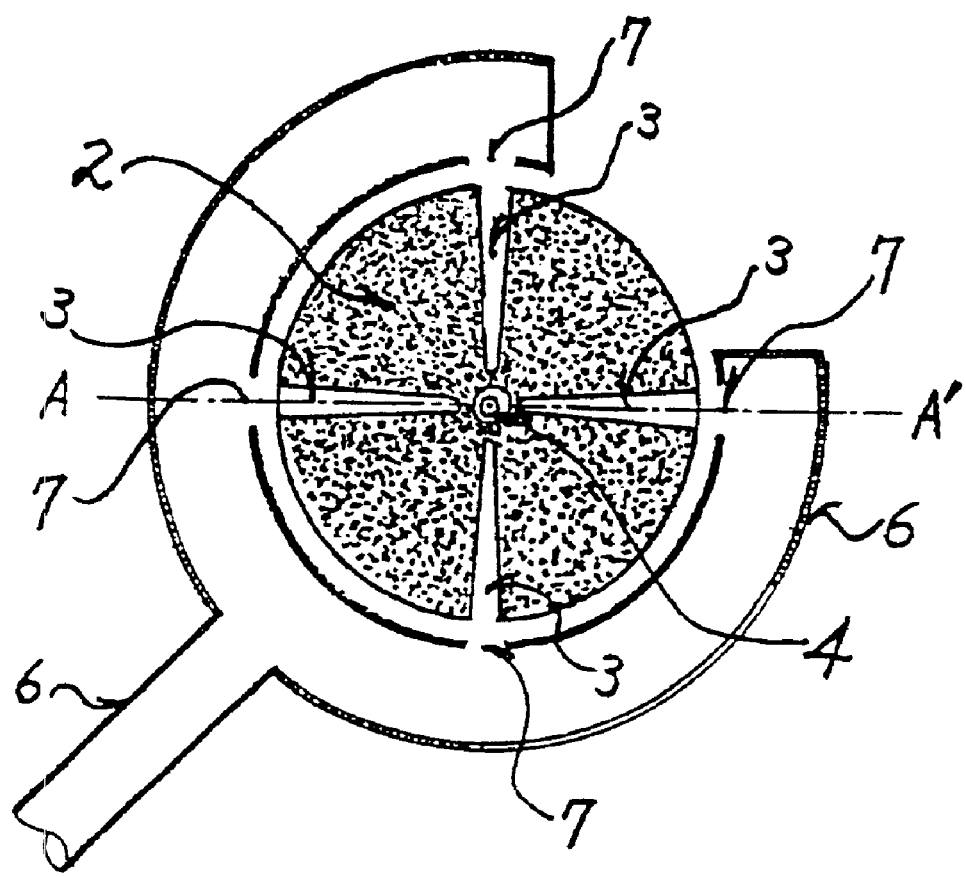
Figures 2, 8:
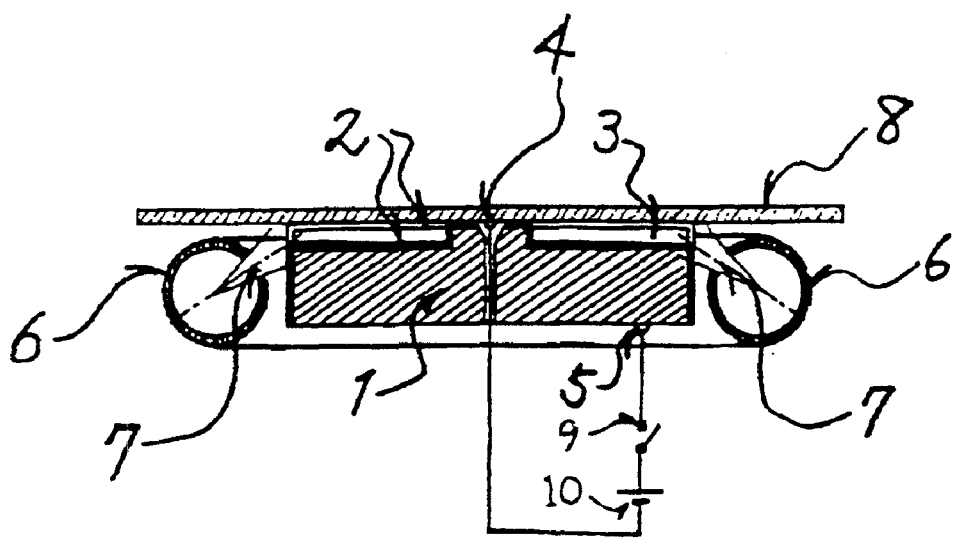
Figures 3, 8:
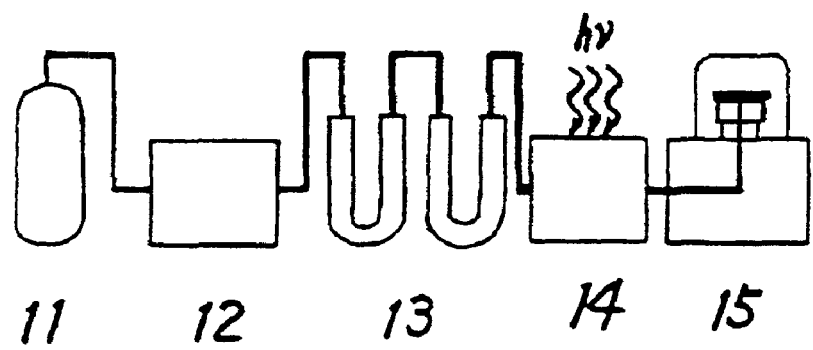
Figures 4, 8:
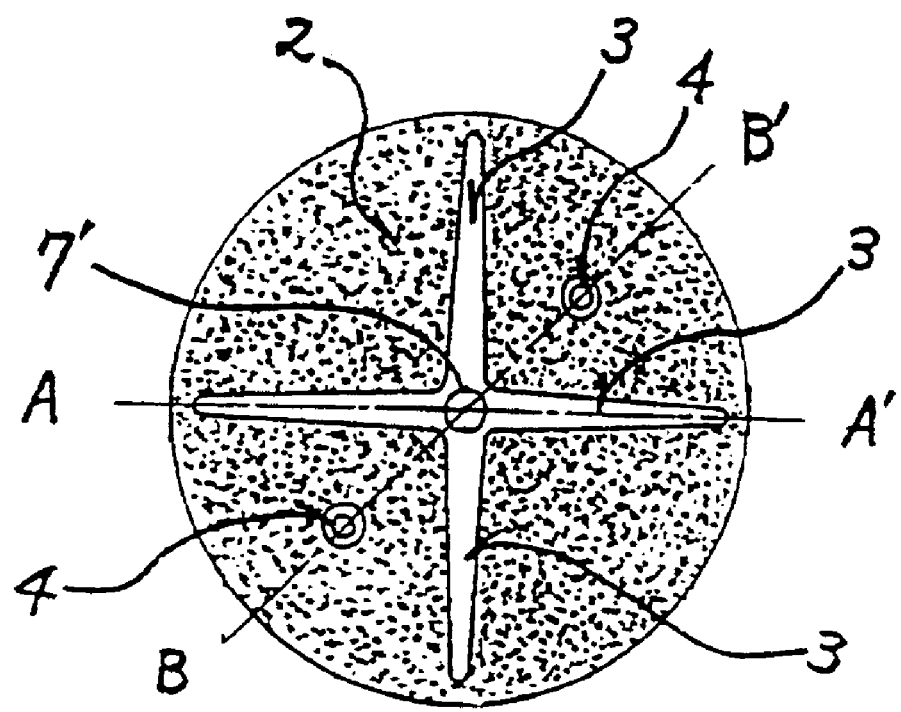
Figures 5, 8:
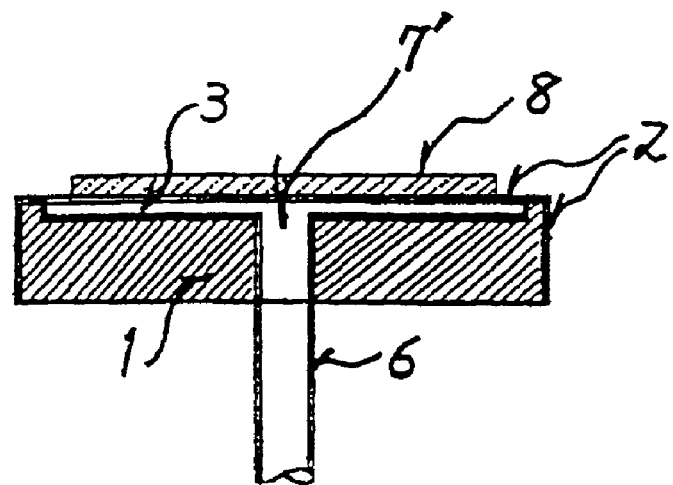
Figures 6, 8:
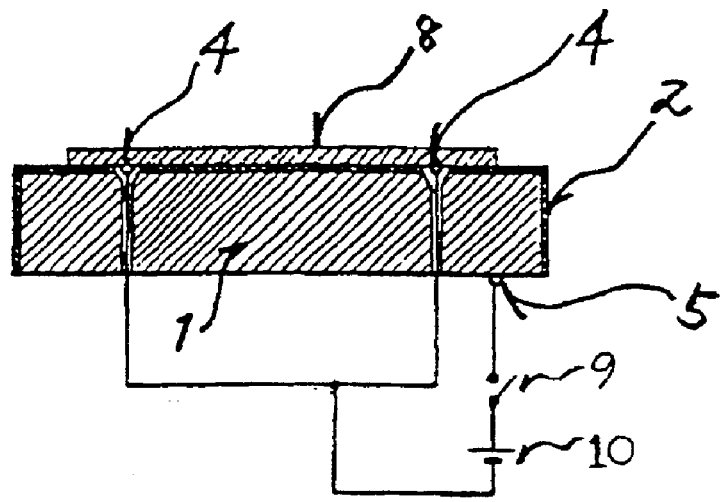

Next description is made for the first embodiment of the present invention with reference to FIG. 8-1 to FIG. 8-3.

FIG. 8-2 is a flat view illustrating the first embodiment of the present invention, and FIG. 8-2 is a cross sectional view thereof taken along the line A–A' in FIG. 8-1. It should be noted that the semiconductor substrate 8 is omitted in the flat view.

In this embodiment, the absorbing electrode 1 is a molybdenum disc, and a plurality of small grooves 3 are provided in a radial form along the diameter on the plane to absorb the silicon substrate 8 so that the silicon substrate is easily contacted to the injected gas. The contact terminal 4 electrically insulated from said molybdenum disc is provided through a throughhole of this molybdenum disc 1 to load voltage to the silicon substrate 8. The contact terminal 4 is connected via the molybdenum electrode terminal 5 and the switch 9 to the electrostatic power source 10 for absorption. A surface of the molybdenum disc 1 to absorb the silicon substrate 8 including the surface of the small grooves 3 are coated with an insulating layer containing alumina oxide as the main component.

On the other hand, the circular gas inlet tube 6 surrounding the molybdenum electrode is provided under the absorbing surface at a position concentric with the electrode for absorption. The gas injection port 7 is provided inside the gas inlet piping 6 on the extension line of the small groove 3 in the direction of diameter so that the maximum injection rate of the injected gas can be obtained in the central direction along the small groove 3.

The gas inlet tube is preferably made of quartz glass, but when tube made of metal such as stainless steel is used, the internal surface is coated with insulating material using such a means as a processing for forming an oxidized passive state film. A general concept drawing for a gas system for introducing gas into the gas inlet tube 6 is shown in FIG. 8-3. Gas from the gas tank 11 passes through the gas flow control section 12 and is purified in the purifying device 13 with the concentrations of oxygen and vapor mixed therein reduced to less than 10 ppm and less than 1 ppm respectively. Then the gas is sent to the ultra-violet rays irradiating section 14, where the gas is electrolytically dissociated, and then sent to a semiconductor manufacturing device incorporating the electrostatic absorber 15. It should be noted that the length of piping from the ultra-violet rays irradiating section 14 to the electrostatic absorber 15 should preferably be as short as possible so that loss of electric charge due to rebonding of the electrolytically dissociated gas is minimized.

(Embodiment 2)

Next description is made for the second embodiment of the present invention with reference to FIG. 8-4, FIG. 8-5 and FIG. 8-6.

FIG. 8-4 is a flat view illustrating the second embodiment of the present invention, and FIG. 8-5 and FIG. 8-6 are cross sections of the device according to the second embodiment of the present invention shown in FIG. 8-4 taken along the lines A–A' and B–B' respectively in FIG. 8-4. It should be noted that the semiconductor substrate 8 is omitted in the flat view for simplification.

In this embodiment, a gas injection port 7' penetrating the molybdenum disc 1 is provided at a center of said molybdenum disc 1, and the electrolytically dissociated gas injected from the injection port 7' is guided along the small grooves 3 on the molybdenum disc 1 to a surface of the alumina 2. Also the contact terminal 4 to load voltage to the silicon substrate 8 is provided at an appropriate position afar from the adjacent small groove 3.

The gas system to introduce gas into the gas piping 6 is the same as that in FIG. 8-3.

It should be noted that, in FIG. 8-1, FIG. 8-2, FIG. 8-4, FIG. 8-5 and FIG. 8-6 each illustrating an embodiment of the present invention, the same reference numerals are assigned to the corresponding sections, so that description thereof is omitted herein. Also a form and a number of the small grooves, and positions and a number of terminals for loading voltage are not limited to those shown in the figures above. Also it should be noted that each of the embodiments above is suited to a case where a diameter of the semiconductor substrate 8 is larger than that of the electrostatic absorbing electrode 1, and a case contrary to the one described above. This relative between diameters of the two components above does not restrict configuration of the device in any mean.

In each embodiment, it was confirmed that, after a silicon wafer having a diameter of 8 inches and that having a diameter of 2 inches were absorbed and the switch 9 was turned ON to inject gas, the wafer were separated from the electrodes within 1 second in both cases without disturbing the wafer positions.

(Embodiment 1)

Figures 1, 9:
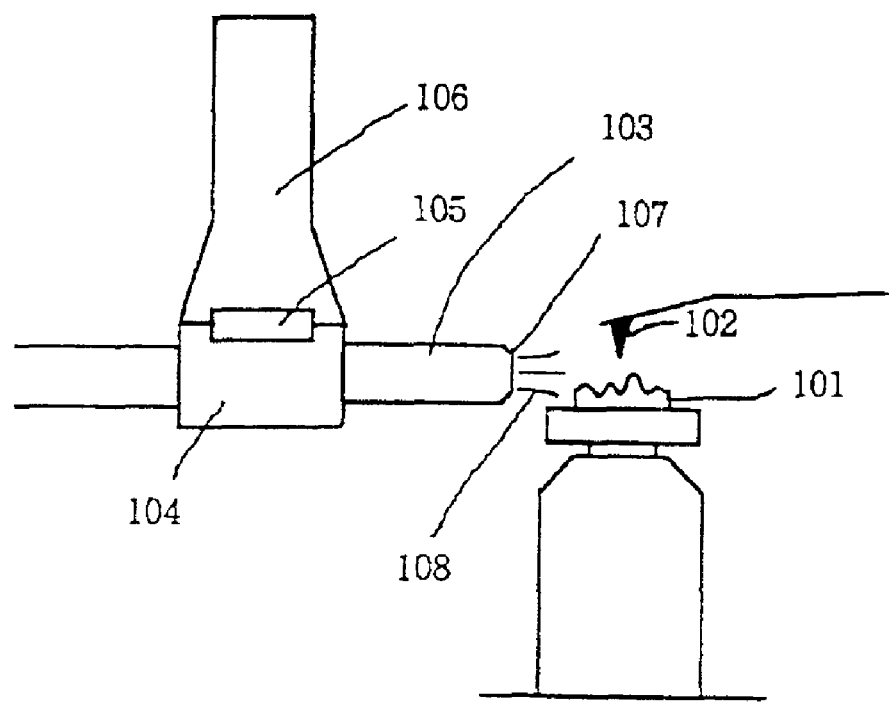
Figures 2, 9:
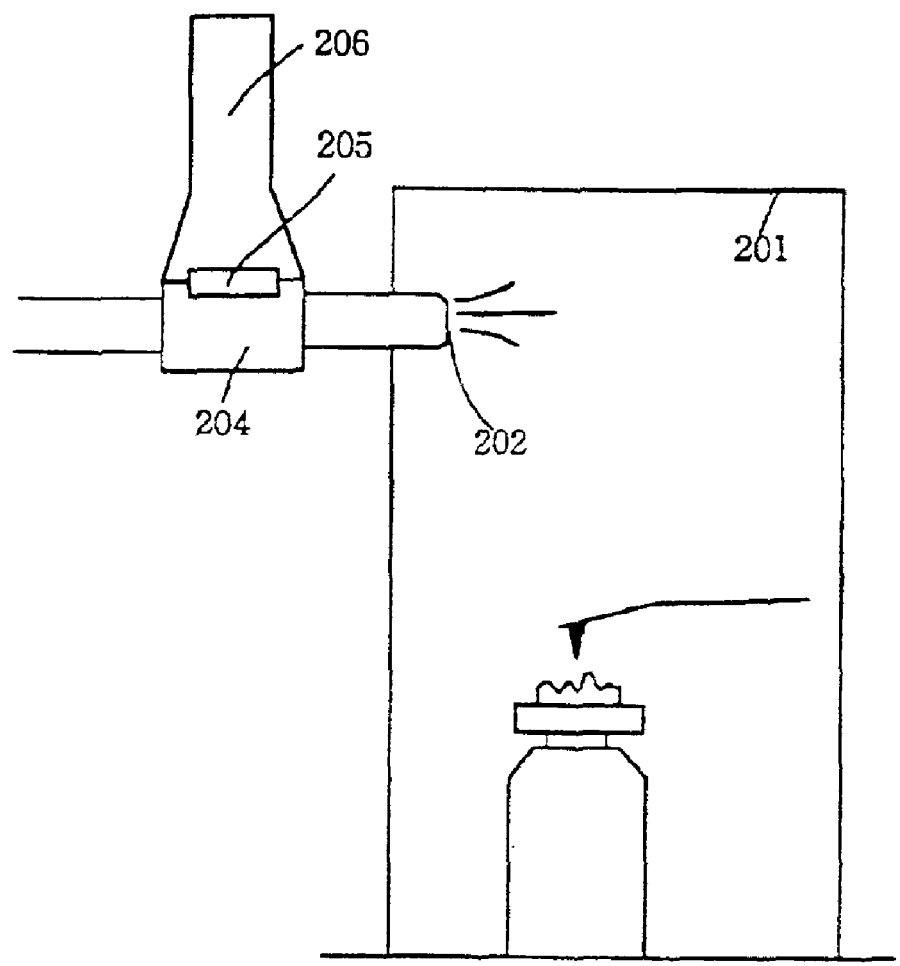
Figures 3, 9:
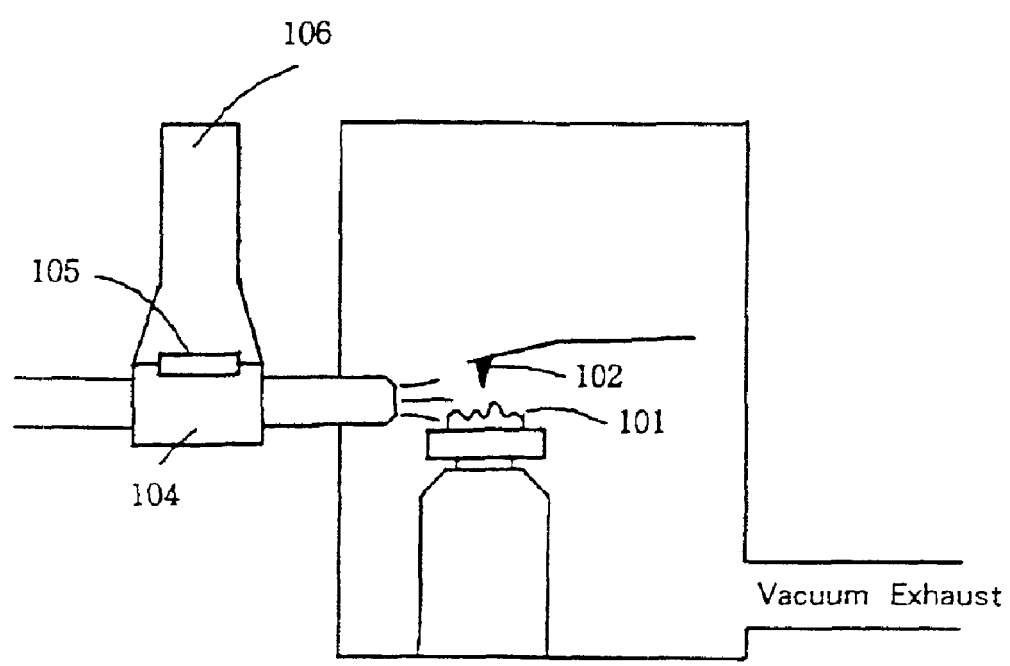
Figures 4, 9:
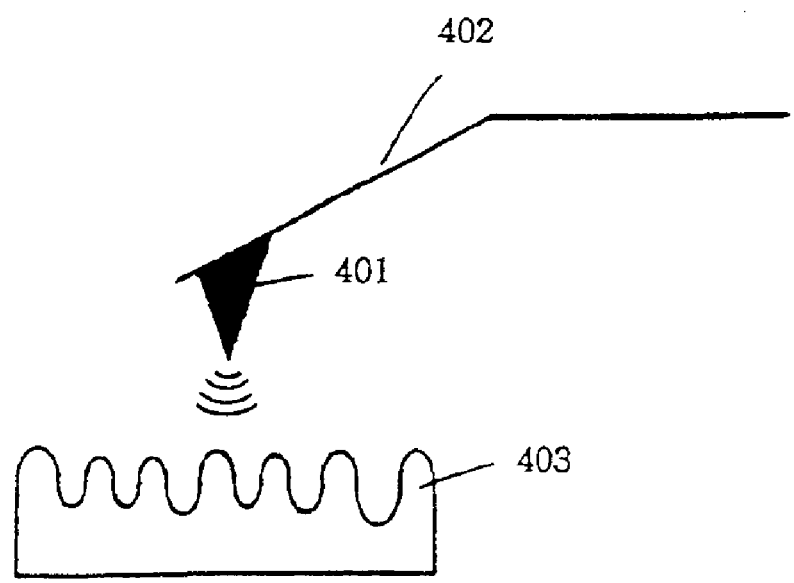
Figures 5, 9:
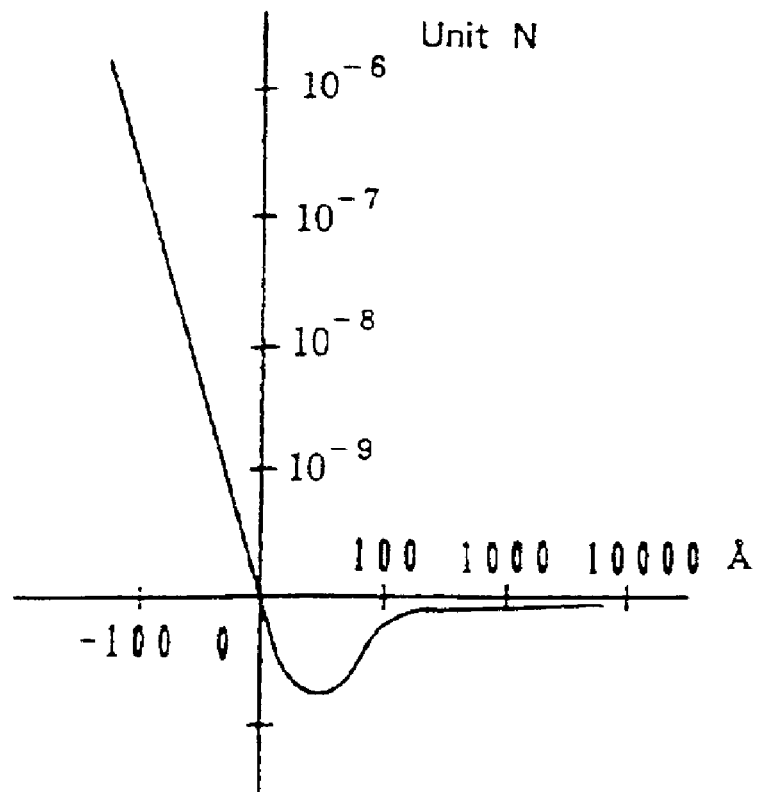
Figures 6, 9:
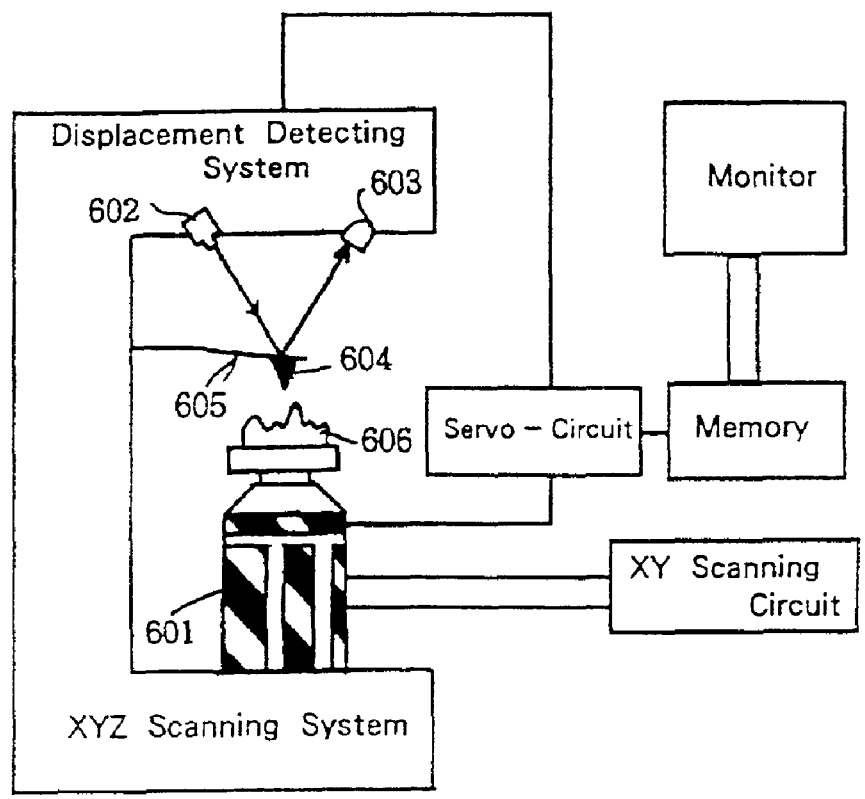

FIG. 9-1 is a drawing illustrating the first embodiment of the present invention. It should be noted that the interatomic force microscope was described in detail in relation to the prior art and only a simple illustration thereof is provided herein. The tube body 103 was arranged so that the gas outlet port was located adjacent to an insulating material sample or a metallic sample 101 mounted on an insulating body; for instance at a position 1 cm away from the sample in the horizontal direction. Although a stainless tube with the internal surface coated with an oxidized passive state fi m was used in this embodiment, any material may be used for the gas-contacting section provided that the material is insulating one. The gas is subjected to irradiation of ultraviolet rays from the ultra-violet ray source 106 in the ultra-violet rays irradiating section 104 through the ultra-violet rays irradiation window made of synthetic quartz before entering the inlet section.

The internal surface of the irradiating section is made of the same material as that for the inlet section. As the source for ultra-violet rays, a deuterium lamp was used. A flow rate of the gas was set to a very low level of 5 cc/min in this embodiment, but the flow rate may be raised to a higher level provided that no influence is given to the measurement system itself. Also if the gas flow rate is lower than the value described above, the gas outlet port should be moved closer to the sample so that the gas will be dispersed at a density adequate for the probe or the sample. Also it is possible to flow a large quantity of gas before start of measurement, and then measurement should be started after stopping supply of the gas.

Actual measurement was carried out by using the device shown in FIG. 9-1. As the material gas, argon gas including oxygen and vapor at concentrations of 15 ppm and 3 ppm respectively was used. Measurement of surface roughness of a silicon wafer was carried out, and it was possible to carry out measurement of surface roughness far easily and precisely as compared to a case when measurement was made with a conventional type of device.

(Embodiment 2)

FIG. 2 is a drawing illustrating the second embodiment of the present invention. In this embodiment, the measuring section is covered with the vessel (box) 201, and a gas outlet portion of the tube body is provided at a position away from a surface of a sample. The box 201 is a plastic one. With this device, it is possible to carry out measurement introducing a large quantity of gas, and a so measurement can be carried out after air in the entire measurement system is substituted with gas introduced thereto, which is a difference from the first embodiment.

In this embodiment, vibration of an object to be measured and a prove did not occur, and more accurate measurement of surface roughness could be made as compared to the embodiment 1.

(Embodiment 3)

FIG. 9-3 is a drawing illustrating the third embodiment of the present invention. In this embodiment, an exhausting means is provided n the vessel, and the entire measurement system can be vacuumed. In this embodiment measurement is carried out flowing gas to be introduced thereto in a depressurized state, or after introduced gas is flown in a depressurized or a vacuum state, or the measurement system is vacuumed and the gas is introduced in a depressurized state or under the atmospheric pressure, which is a difference from the embodiments 1, and 2.

Measurement of the surface roughness of a piezoelectric element was carried out with this device inside of the vessel depressurized. Change of characteristics of the piezoelectric element before and after measurement was investigated, but deterioration of the characteristics was not observed.

(Embodiment 4)

In this embodiment, a mixed gas of argon and nitrogen including oxygen and vapor at concentrations of 8 ppm and 0.5 ppm respectively was used as the material gas.

The other points are the same as those in Embodiment 1.

In this embodiment, more accurate measurement of surface roughness than in Embodiment 1 could be carried out.

Figures 1, 10:
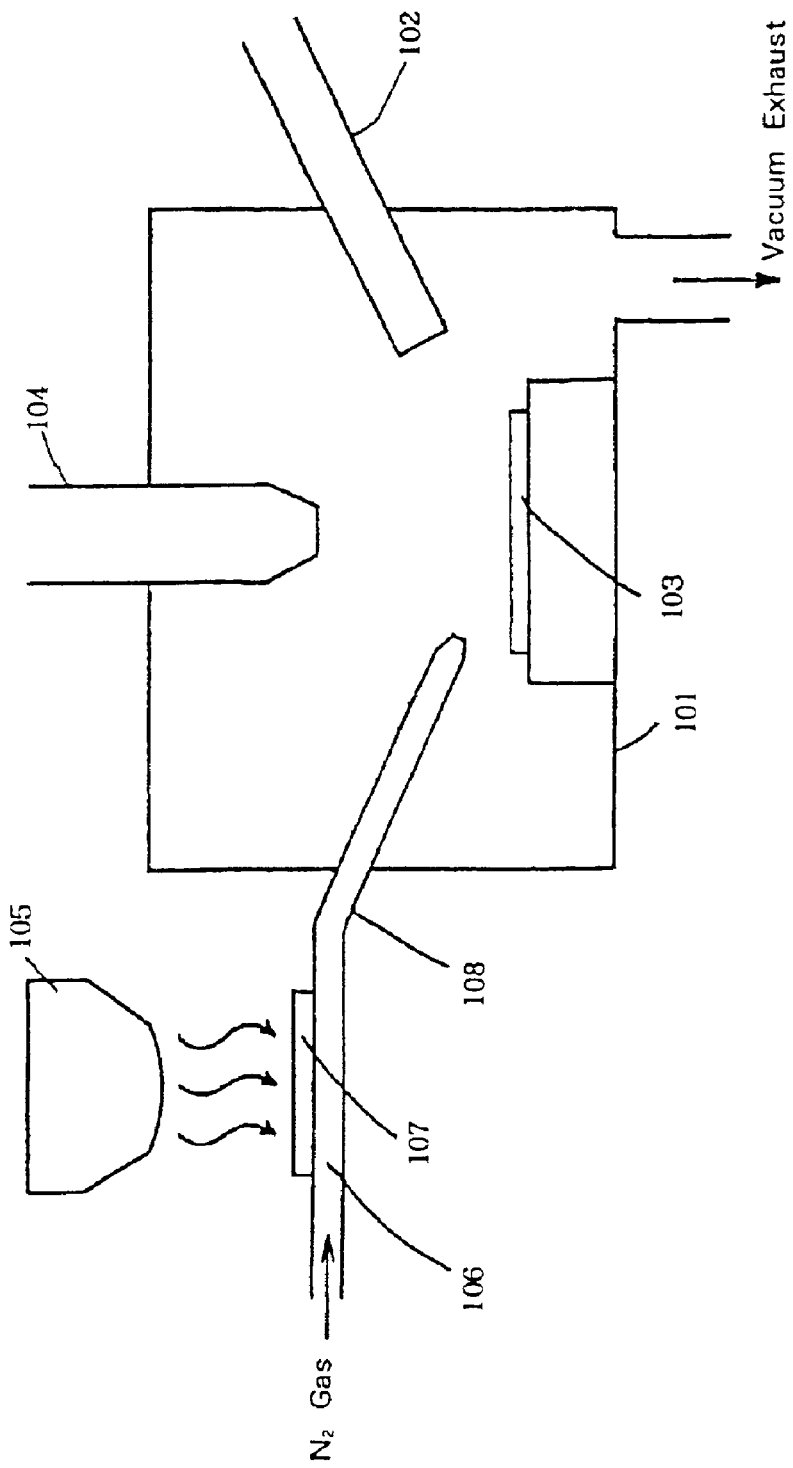
Figures 2, 10:
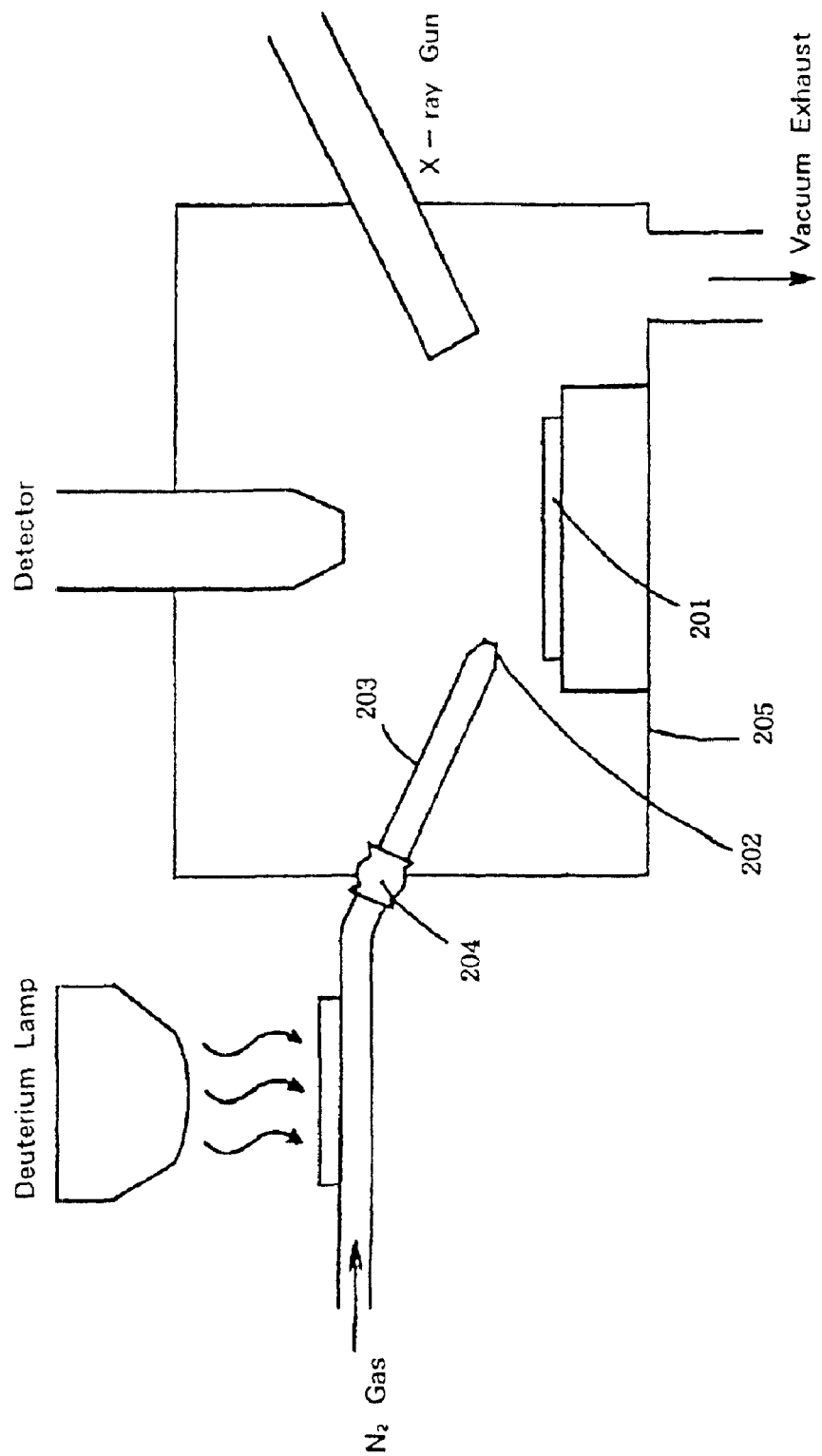
Figures 3, 10:
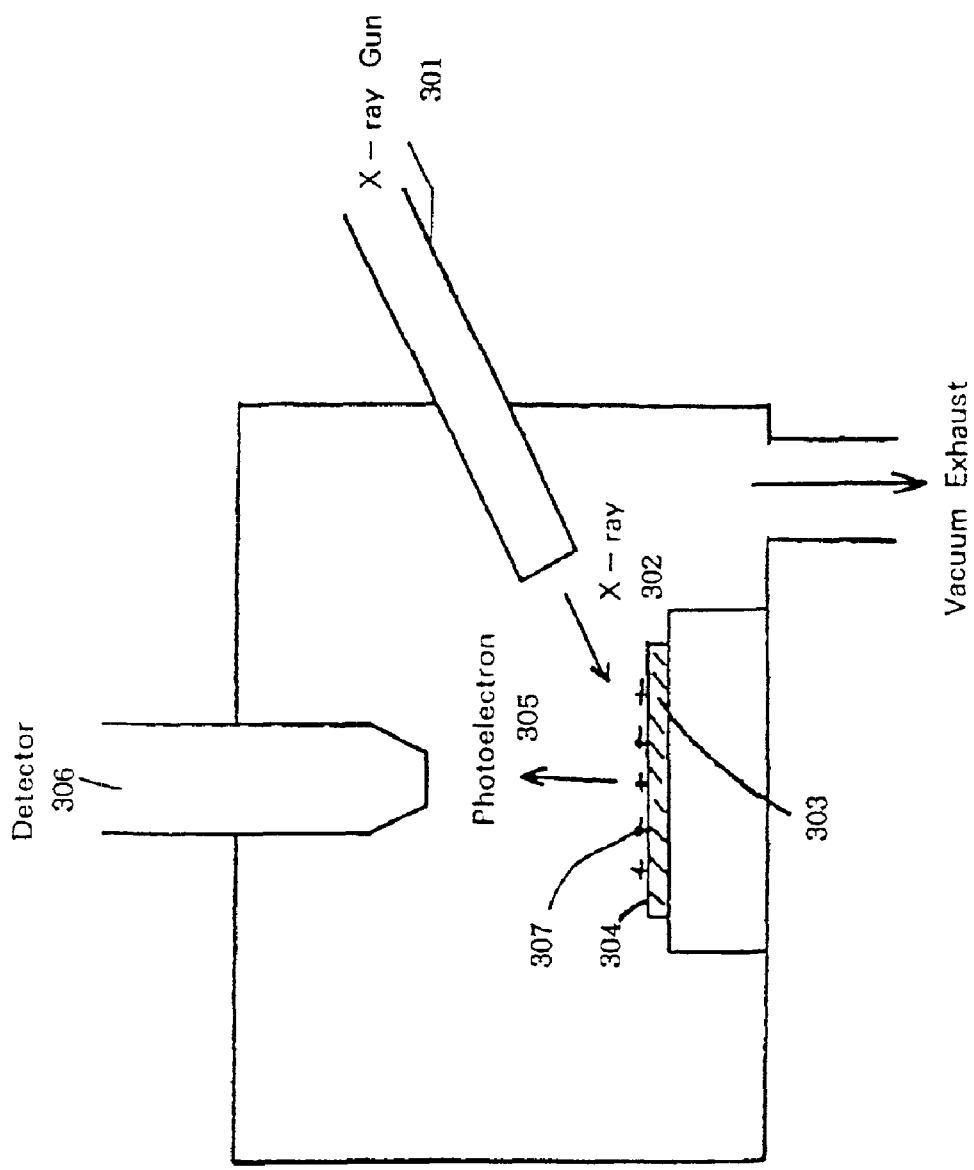

Next description is made for the first embodiment of the present invention with reference to FIG. 10-1. This device enables elemental analysis and observation of chemical bond in a sample by irradiating X-ray swept from the X-ray gun 102 onto a surface of the sample 103 such as $SiO_2$ obtained by oxidizing Si in a vessel 101 depressurized by a vacuum exhaust system having an exhaust capability of, for instance, 1000 l/sec in a depressurized state and observing photoelectrons coming out from the sample's surface with the detector 104. Principle of operation of this device was the same as that described in relation to the prior art, so detailed description thereof is not provided herein. Feature of this device consists in that said device has a means for irradiating ultra-violet rays from the deuterium lamp 105 to $N_2$ gas and blowing the $N_2$ gas to the sample's surface. The ultra-violet rays are irradiated through the synthetic quartz window 107 to $N_2$ gas flowing at a flow rate of 1 cc/min under normal pressure, and the $N_2$ gas subjected to irradiation of ultra-violet rays passed through the gas piping 108 with the internal surface coated with an oxidized passive state film having a thickness of around 100 Å and is blown to the sample's surface placed in a depressurized state. Because of this irradiation of ultra-violet rays, a portion of the gas is electrolytically dissociated to $N_2^-$ ions and electrons $e^-$.

Thus, when observing a non-conductive sample such as $SiO_2$, by blowing $N_2$ gas subjected to irradiation of ultra-violet rays to the sample, electric charge stored in a surface of the sample due to irradiation of X-ray is effectively removed by $N_2^-$ ions generated due to irradiation of ultra-violet rays, and for this reason it is possible to substantially improve reliability in measurement accuracy of an X-ray electrospectrometer, which has been very difficult in the prior art.

In order to efficiently carry out electrolytic dissociation of $N_2$ gas by means of irradiation of ultra-violet rays, pressure of the $N_2$ gas in the ultra-violet rays irradiating section 106 is set to around 1 atmospheric pressure. The synthetic quartz window 107 provided in the ultra-violet rays irradiating section well transmits ultra-violet rays having a wavelength of, for instance, 360 nm or below, and any other material may be used on the condition that the material transmits ultra-violet rays. Also electrolytically dissociated $N_2^-$ ions and electrons $e^-$ are blown in their electrolytically dissociated state to the sample, it is necessary that at least of the internal surface of the piping 108 between the ultra-violet rays irradiating section 106 and the sample 103 is coated with an insulating material, and although a stainless passive state film was used in this embodiment, other insulating material as a fluoride passive state film or Teflon® (PTFE) may be used for that purpose.

Also $N_2$ was used as the gas to be subjected to irradiation of ultra-violet rays, but Ar gas or a mixed gas of $N_2$ and Ar may be used in place of $N_2$ gas for that purpose. Also it has been turned out that the same effect can be achieved also by using inert gas such as Xe or Kr.

As air exhaust is carried out by an exhaust system having an exhausting capability to exhaust $N_2$ gas flowing at a flow rate of 1 cc/min under 1 atmospheric pressure at the rate of 1000 l/sec, the pressure inside the device 101 is reduced to $3\times10^{-5}$ Torr, but under this degree of pressure it is fully possible to observe a surface of a sample. Also the flow rate of the $N_2$ gas is decided according to a balance between the exhausting capability of the vacuum exhaust system and the pressure inside the available device 101, so that the flow rate can freely be set within a range allowable according to the parameters.

FIG. 10-2 shows another example of the device shown in FIG. 10-1. In this embodiment, a position of the injection port 202 for $N_2$ gas blown to the sample 201 can freely be moved with, for instance, the connecting section, direction of which can freely be changed, and with this feature it is possible to locate the $N_2$ gas injection port to a position where the injection port 202 does not impede a sample carried into or out from the device 205 and then move it to a position adjacent to the sample when carrying out observation, and it is possible to efficiently prevent a sample from being electrified. The remaining portions of the configuration are the same as those described in relation to FIG. 10-1, so description thereof is omitted herein.

It should be noted that, although the device used in the embodiment was XPS, this invention can also be applied to an Auger electron spectroscopy, an X-ray diffraction device, and a total reflection fluorescent X-ray device, and it is possible to efficiently prevent a sample from being electrified with a small quantity of gas when carrying out observation of the sample's surface.

Figures 1, 11:
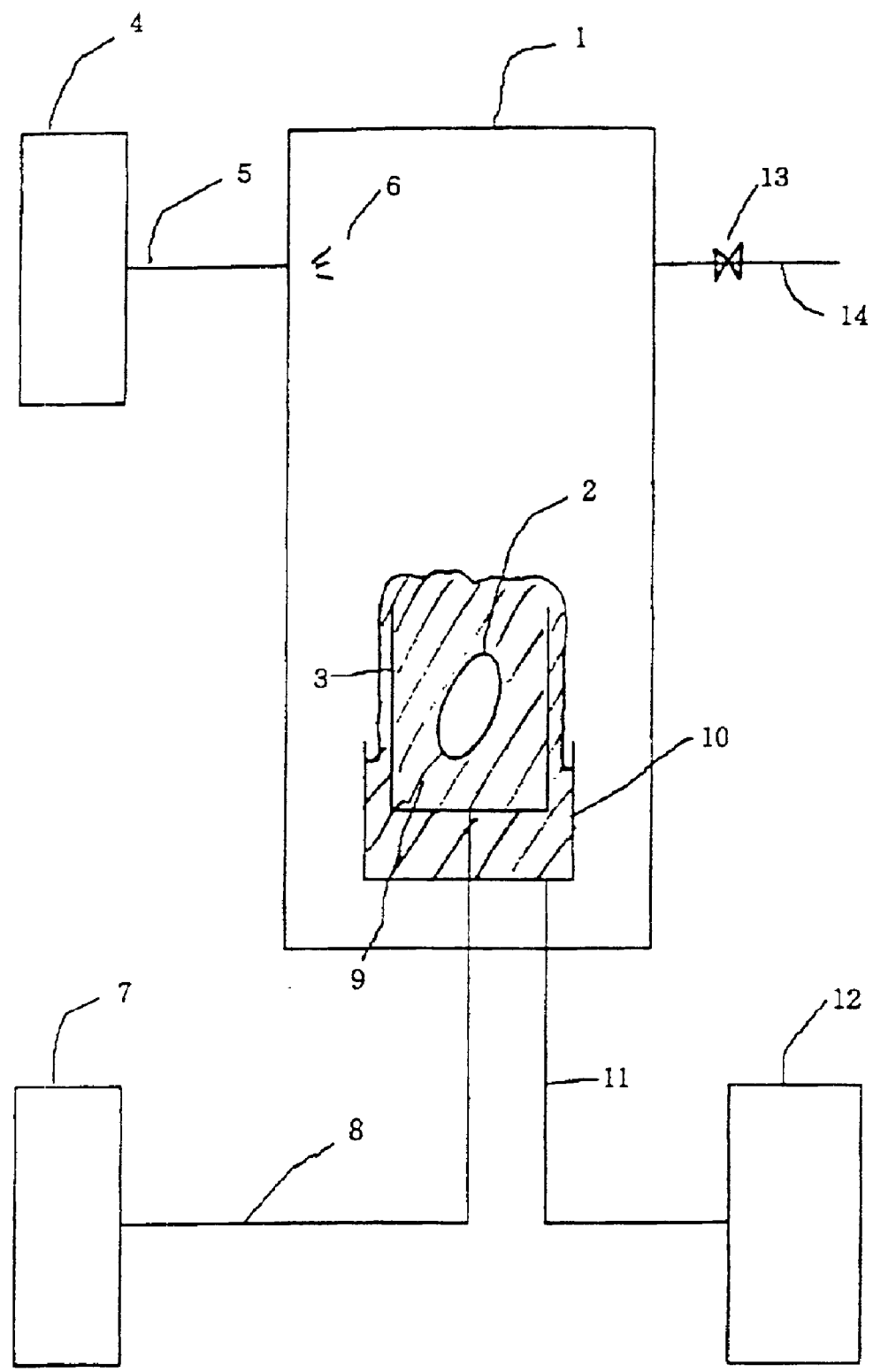

FIG. 11-1 is a drawing illustrating an embodiment of the present invention.

In this embodiment, a cleaning vessel 3 for cleaning a semiconductor 2 which is an object to be processed is provided inside a light-shuttering vessel which shutters light from outside and in which atmosphere therein can be substituted with another appropriate gas.

To the light-shuttering vessel 1 described above is supplied through the nitrogen gas supply piping 5 connected from the inert gas (such as nitrogen gas) supply unit 4 to the aforesaid nitrogen gas supply unit 4 nitrogen gas 6.

On the other hand, to the cleaning vessel placed in the light-shuttering vessel is supplied via the ultra pure water supply piping 8 connected from the ultra pure supply unit 7 having a function to remove oxygen dissolved in water to the ultra pure water supply unit 7 ultra pure water from which dissolved oxygen has been removed.

Furthermore, the ultra pure water after used for cleaning the semiconductor 2 is sent via the waste water receiving vessel 10 and the water feed piping 11 to the waste water processing device 12.

Also the nitrogen gas substituted with the atmosphere in the light-shuttering vessel is discharged via the gas exhaust valve 13 and the gas exhaust piping to the outside.

The device according to the present embodiment has the configuration as described above, so when the semiconductor 2 as an object to be processed is cleaned with ultra pure water from which dissolved oxygen was removed, light is never irradiated to the semiconductor from the outside, and for this reason the semiconductor 2 is never excited by energy of light, and as a result cleaning can be carried out without causing deposition of photoelectron coming out from the surface of the semiconductor or impurities from holes.

Also as this embodiment has the configuration as described above, when cleaning the semiconductor 2 as an object to be processed with ultra pure water 9 from which dissolved oxygen was removed, oxygen gas is not dissolved from the atmosphere in the light-shuttering vessel 1 into the ultra pure water, and for this reason a surface of the semiconductor as an object to be process is never oxidized. As a result, cleaning can be carried out without causing denaturing of a surface of a semiconductor such as growth of a natural oxide film.

Table 4 shows a result of measurement of metal deposited on each surface of 5 sheets of silicon wafer (n-type 100) after cleaning with the device shown in FIG. 11-1 as well as a thickness of natural oxide film grown on the surface of the wafers in a case where irradiation of light was carried out and in a case where the light irradiation was not carried out, and also when the atmosphere was substituted with nitrogen gas, and when not.

Volume of the light-shuttering vessel 1 was 20 l, the flow rate of nitrogen gas supplied to the light-shuttering vessel 1 was 20 l/min, the concentration of oxygen in the nitrogen was 1 ppb, and the concentration of vapor in the nitrogen gas was less than 1 ppb. Also volume of the cleaning vessel 3 was 0.5 l, the flow rate of ultra pure water supplied to the cleaning vessel 3 was 3 l/min. Concentration of oxygen dissolved in the ultra pure water was 10 ppb, concentration of copper ions ($Cu^{2-}$) in ultra pure water was 1 ppt, and concentration of ferric ions ($Fe^{2-}$) in the ultra pure water was 1 ppt. The time used for cleaning with ultra pure water was 60 minutes.

TABLE 4

|  |  | Light irradiated | | Light not irradiated | |
| --- | --- | --- | --- | --- | --- |
|  |  | Substituted with $N_2$ | Not substituted with $N_2$ | Substituted with $N_2$ | Not substituted with $N_2$ |
| Concentration of metal on wafer (atoms $cm^2$) | Cu | 52 * $10^{10}$ | 5.4 * $10^{10}$ | 1 * $10^{10}$ or less | 1 * $10^{10}$ or less |
|  | Fe | 1 * $10^{10}$ | 4.8 * $10^{10}$ | 1 * $10^{10}$ or less | 4.7 * $10^{10}$ or less |
| Thickness of oxide film on wafer surface (nm) |  | 0.1 or less | 0.29 | 0.1 or less | 0.27 |

As shown in Table 4, when light was irradiated to a semiconductor as an object to be processed like in the conventional type of semiconductor cleaning method and the semiconductor was cleaned without substituting atmosphere with inert gas (such as nitrogen gas), impurities such as copper and iron were detected on the surface of the cleaned silicon wafer, and also formation of a natural oxide film was observed. On the other hand, when atmosphere for cleaning was fully substituted with inert gas (such as nitrogen gas) with the atmosphere for cleaning and then a semiconductor was cleaned under the condition that light to the semiconductor as an object to be processed was shut off according to the present invention, impurities such as copper and iron were not detected on the cleaned semiconductor, nor was observed formation of a natural oxide film.

Also it was recognized that, even if light to a semiconductor as an object to be processed is interrupted, unless atmosphere for cleaning is fully substituted with inert gas (such as nitrogen gas), a natural oxide film grows on the silicon wafer's surface and iron more easily oxidized than silicon is deposited on the surface.

The above result indicates that it has become possible to clean a semiconductor without causing deposition of electrons coming out from the surface of the semiconductor or impurities from holes on the surface of the semiconductor as an object to be processed and also without causing denaturing of the semiconductor's surface such as growth of a natural oxide film by using the cleaner according to the present invention.

In this embodiment light to an object to be processed was interrupted using a vessel 1 which could be protected against irradiation of light, but light shuttering may be carried cut by shuttering light in the room for cleaning as a whole, and also other type of light shuttering means may be used. Also this embodiment was described assuming use of nitrogen gas, but argon gas, which is inactive, line nitrogen gas, to an object to be processed, may be used, and the same effect can be achieved by using other inert gas. Furthermore description of this embodiment above assumes a process of cleaning with ultra pure water, but also it is possible to effectively prevent deposition of impurities and formation of a natural oxide film by shuttering light and drying a cleaned semiconductor in inert atmosphere also in the drying process after cleaning with ultra pure water. It is needless to say that it is possible to more effectively prevent deposition of impurities and formation of a natural oxide film by means of shuttering light and drying a cleaned semiconductor in inert atmosphere also in a process other than a process to clean a semiconductor.

(Embodiment 1)

Figures 1, 12:
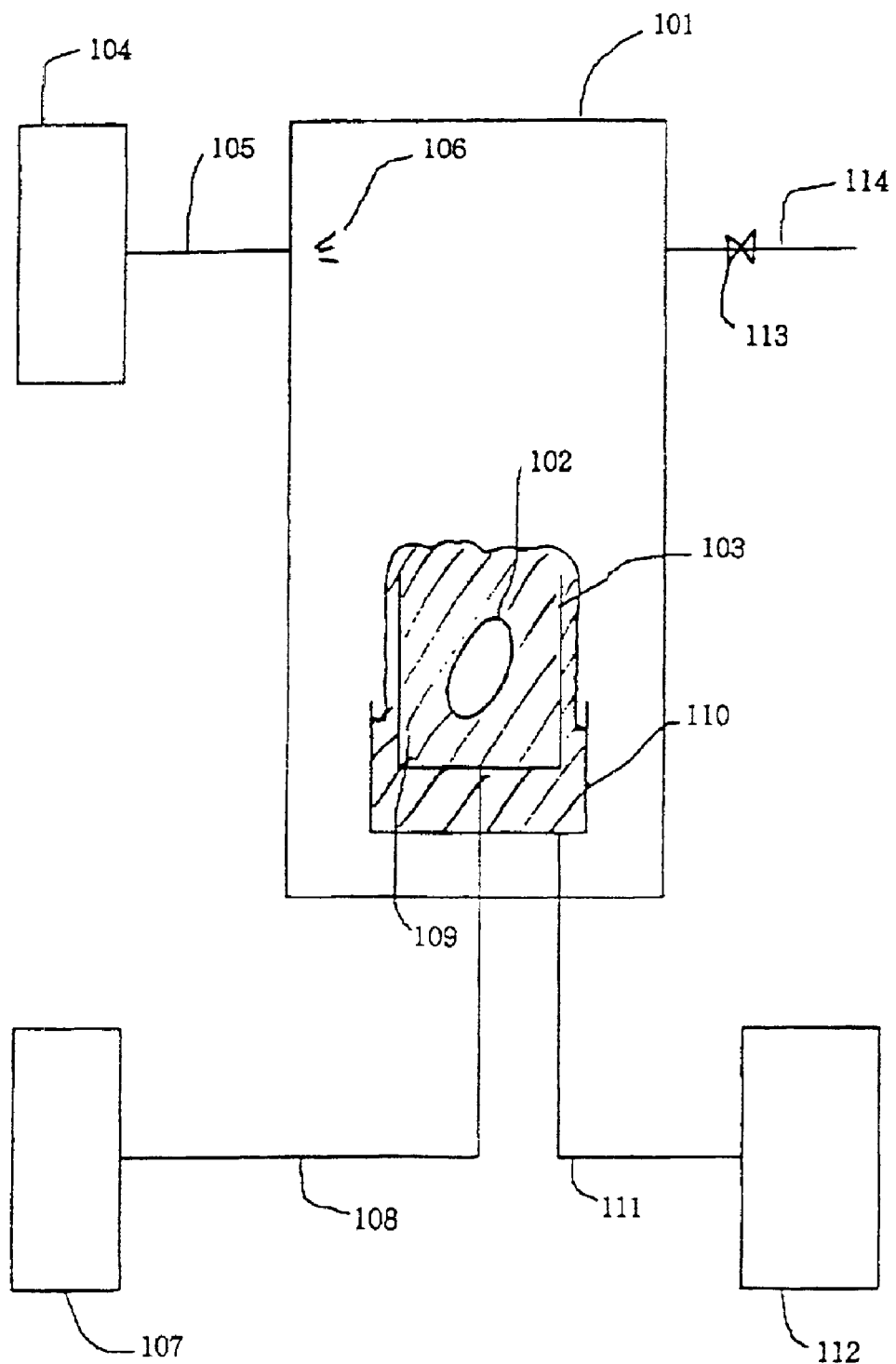
Figures 2, 12:
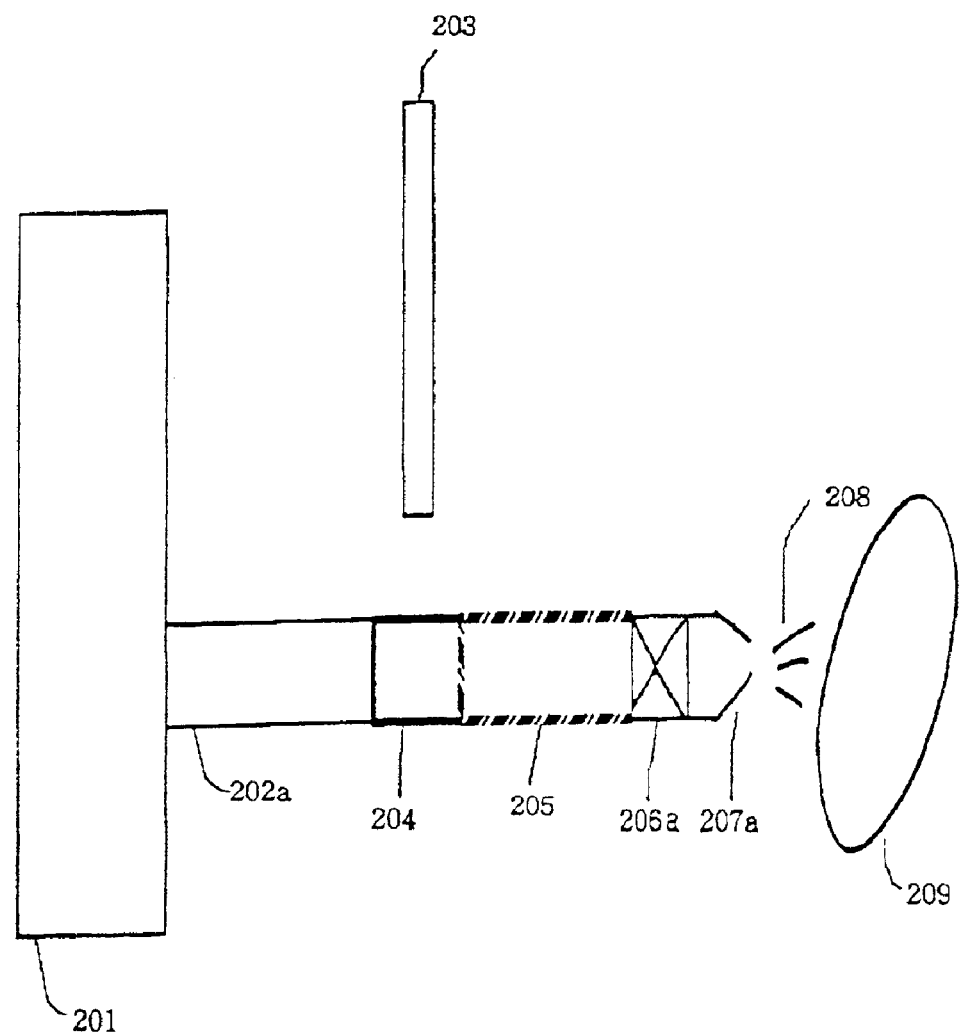
Figures 3, 12:
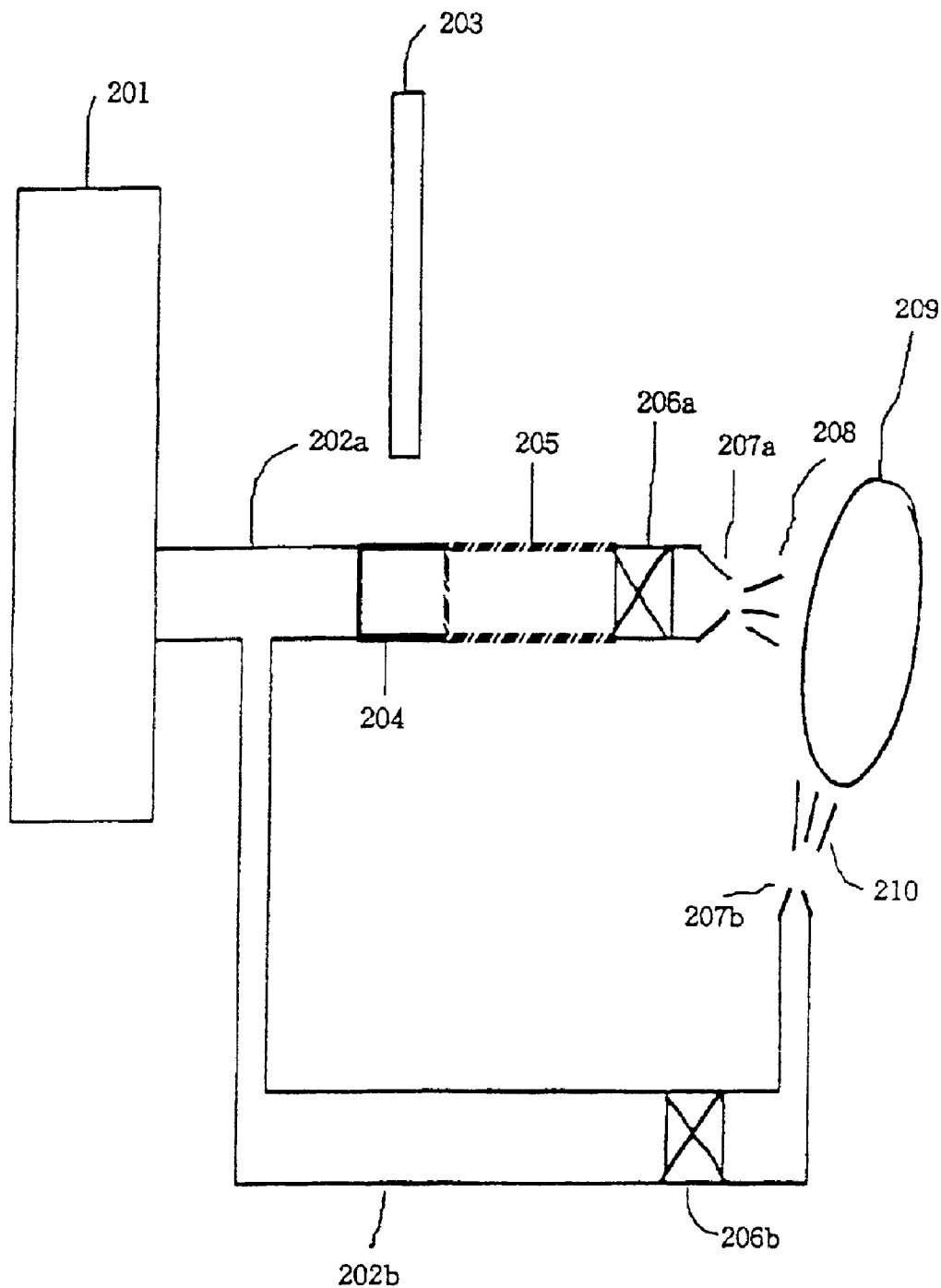
Figures 4, 12:
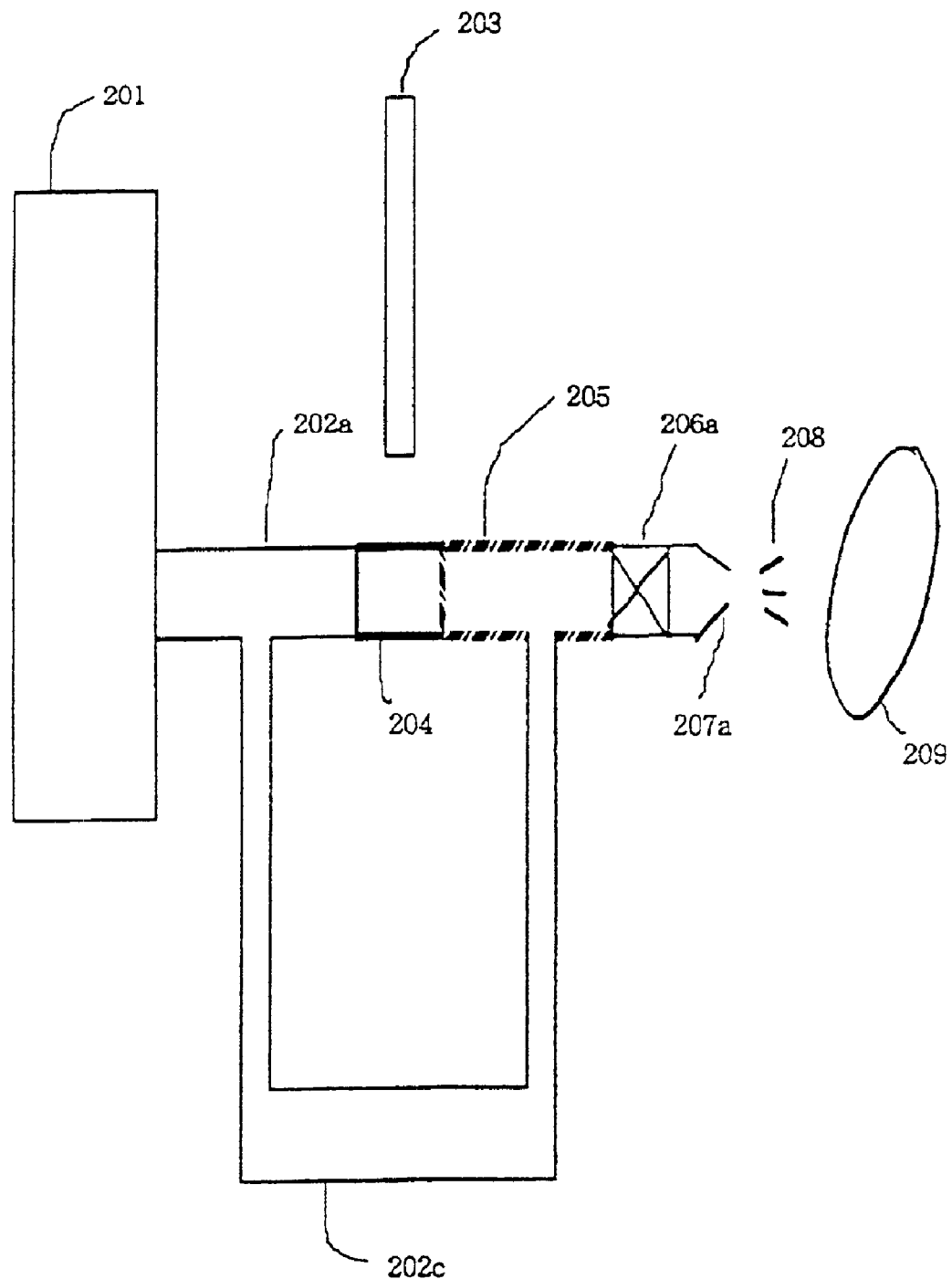

FIG. 12-1 is a drawing illustrating the first embodiment of the present invention.

The cleaning vessel 103 for cleaning the semiconductor 102 as an object to be processed is placed inside the light-shuttering vessel which interrupts light from outside and in which atmosphere therein can be substituted with other gas.

Into the foregoing light-shuttering vessel 101 is supplied nitrogen gas 106 from the inert gas (such as nitrogen gas) supply unit 104 via the nitrogen gas supply piping 105 connected to the nitrogen gas supply unit 104.

On the other hand, the ultra pure water 109, from which dissolved oxygen was removed, is supplied through the ultra pure water supply piping 108 connected from the ultra pure water supply unit 107 having a function to remove oxygen dissolved in water to the foregoing ultra pure water supply unit 107 to the cleaning vessel placed in the light-shuttering vessel described above.

Furthermore, the ultra pure water used for cleaning the semiconductor 102 is sent via the water liquid receiving vessel 110 and the water liquid piping 111 to the water liquid processing device 112 and processed therein.

Also the nitrogen gas 106 substituted with atmosphere in the light-shuttering vessel is discharged through the gas exhaust valve 113 and the gas exhaust piping 114.

As the device according to this embodiment has the configuration as described above, when the semiconductor 102 as an object to be processed is cleaned with ultra pure water 109 from which dissolved oxygen has been removed, light from outside is not irradiated to the semiconductor, and or this reason the semiconductor 2 is not excited by energy of light, and as a result cleaning can be carried out without causing deposition of electrons coming out from a surface of a semiconductor or deposition of impurities originated from holes.

As the device according to the present invention has the configuration as described above, when a semiconductor 2 as an object to be processed is cleaned with ultra pure water from which dissolved oxygen was removed, oxygen gas is not dissolved in the ultra pure water 109 from atmosphere for cleaning in the light-shuttering vessel 101, and for this reason a surface of the semiconductor 102, which is an object to be processed, is not oxidized. As a result, it is possible to clean a semiconductor without causing denaturing of the semiconductor such as growth of a natural oxide film.

Table 5 shows a result of measurement of a quantity of metal deposited on a silicon wafer as well as a thickness of a natural oxide film after 5 sheets of silicon wafer (n-type 100) are cleaned with the device according to the device shown in FIG. 12-2, said data being classified according to cased where irradiation of light is executed and not executed, and also according to cases where atmosphere is substituted with or not substituted with nitrogen gas.

Volume of the light-shuttering vessel 101 was 20 l, a flow rate of nitrogen gas supplied to the light-shuttering vessel 101 was set to 20 l/min, concentration of oxygen in the nitrogen gas was less than 1 ppb, and that of vapor in the nitrogen gas was less than 1 ppb. Also volume of the cleaning vessel 103 was 0.5 l, a flow rate of the ultra pure water supplied to the cleaning vessel 103 was 3 l/min, concentration of dissolved oxygen in the ultra pure water was 10 ppb, concentration of copper ions ($Cu^{2-}$) in the ultra pure water was 1 ppt, and that of ferric ions ($Fe^{2-}$) in the ultra pure water was 1 ppt. Also the time for cleaning was 60 minutes.

TABLE 5

| | | Light irradiated | | Light not irradiated | |
|---|---|---|---|---|---|
| | | Substituted with $N_2$ | Not substituted with $N_2$ | Substituted with $N_2$ | Not substituted with $N_2$ |
| Concentration of metal on wafer (atoms cm$^2$) | Cu | $5.2 * 10^{10}$ | $5.4 * 10^{10}$ | $1 * 10^{10}$ or less | $1 * 10^{10}$ or less |
| | Fe | $1 * 10^{10}$ or less | $4.8 * 10^{10}$ | $1 * 10^{10}$ or less | $4.7 * 10^{10}$ |
| Thickness of oxide film on wafer surface (nm) | | 0.1 or less | 0.29 | 0.1 or less | 0.27 |

As shown in Table 5, when light was irradiated to a semiconductor as an object to be processed line in the conventional type of semiconductor cleaning method and the semiconductor was cleaned without substituting atmosphere with inert gas (such as nitrogen gas), metallic impurities such as copper or iron were detected on the silicon wafer after cleaning, and also growth of a natural oxide film was observed. On the other hand, when a semiconductor was cleaned shuttering light to the semiconductor as an object to be processed and after fully substituting atmosphere for cleaning with inert gas (such as nitrogen gas), any impurity such as copper or iron was not detected, and also growth of a natural oxide film was not observed. Also it was recognized that, even if light to a semiconductor as an object to be processed is interrupted, unless atmosphere for cleaning is fully substituted with inert gas (such as nitrogen gas), growth of a natural oxide film as well as deposition of iron particles more easily oxidized by oxygen than silicon is observed on the silicon's wafer.

The above result indicates that, with the cleaner according to this embodiment of the present invention, it is possible to clean a semiconductor as an object to be processed without causing deposition of electrons coming out from a surface of the semiconductor and impurities originated from holes, and also without causing denaturing of the semiconductor's surface such as formation of a natural oxide film.

In this embodiment light to an object to be processed was interrupted by using a vessel which can interrupt light, but light to the cleaning chamber as a whole may be interrupted, and also other type of light shuttering means may be used. Also this embodiment was described assuming use of nitrogen gas, but also argon gas, which is inert, like the nitrogen gas, to an object to be processed, may be used, and in addition the same effect can be achieved by using other inert gas. Furthermore the above description of this embodiment assumes cleaning with ultra pure water, but it is possible to effectively prevent deposition of impurities or growth of a natural oxide film also by drying a cleaned semiconductor in inert atmosphere under the condition that light thereto is interrupted in a drying process after the cleaning process. It is needless to say that it is possible to effectively prevent deposition of impurities as well as formation of a natural oxide film by cleaning s semiconductor in inert atmosphere under the condition where light is interrupted in other processes for cleaning semiconductors.

(Embodiment 2)

FIG. 12-2 is a drawing illustrating the second embodiment of the present invention.

To the nitrogen gas generator 201 (gas supply means) for evaporating liquid nitrogen and generating nitrogen gas is connected the nitrogen gas supply piping 202a for supplying the generated nitrogen gas.

To the downstream side of the nitrogen gas supply piping 202a is connected the ultra-violet irradiating section 204 made of synthetic quartz to irradiate ultra-violet rays generated from the ultra-violet ray generator (such as a deuterium lamp), which is an irradiating means, to the nitrogen gas.

Then to the downstream side from the ultra-violet rays irradiating section 204 is connected the ionized gas supply piping 205 made of insulating material (such as a piping coated with, for instance, fluorine resin).

Furthermore to the downstream side therefrom is connected via the valve 206a the gas injection nozzle 207a. The injected gas is blown to the object 209 opposing the gas injection nozzle 207a.

The device according to the present invention has the configuration as described above, so that, when nitrogen gas generated in the nitrogen gas generator 201 is introduced into the ultra-violet rays irradiating section 204 and the ultra-violet rays generator 203 is started, ultra-violet rays are irradiated to the nitrogen gas, and the nitrogen gas is electrolytically dissociated to nitrogen gas ions $N_2^-$ and electrons $e^-$ in the ultra-violet rays irradiating section 204.

Furthermore the ions generated as described above are injected via the ionized gas supply piping 205, valve 206a and gas injection nozzle 207a and blown to the object 209 to be dried. In this case, as the internal surface of the ionized gas supply piping 205 is coated with insulating material, the nitrogen gas ions $N_2^-$ and electrons $e^-$ generated by means of irradiation of ultra-violet rays, and effectively work for removal of electric charge of the object 209 to be dried.

Table 6 shows a result of measurement of surface voltage of each silicon wafer before and after drying when 5 sheets of silicon wafer were dried with the device according to the device shown in FIG. 12-2, in cases where ultra-violet rays were irradiated and not irradiated.

The silicon wafer used in this testing was of n-type Si (100) having a diameter of 33 mm, and the silicon wafer was cleaned with such solutions as a mixed solution of sulfuric acid and hydrogen peroxide, a mixed solution of ammonia and hydrogen peroxide, and also a mixed solution of fluoric axis and hydrogen peroxide, and was subjected to overflow rinse with ultra pure water for 10 minutes just before used in the testing. In the drier, the silicon wafer as an object to be dried was set on a wafer fixing tool made of PFA (perfluorcalcoxy resin).

A flow rate of nitrogen gas injected from the gas injection nozzle 207a was set to 100 <</min, the time for injection was 2 minutes, and the clearance between the nozzle and a wafer was 50 nm. A concentration of moisture in the used nitrogen gas was less than 1 ppb, and that of oxygen was less than 1 ppb.

A 500 W deuterium lamp was used as the ultra-violet rays generator 203, and a space between the deuterium lamp and the ultra-violet rays irradiating section 204 was purged with nitrogen gas.

A visible difference is observed in surface voltage of a silicon wafer as an object to be dried between a case where ultra-violet rays are irradiated to nitrogen gas flowing into the ultra-violet rays irradiating section 204 (when the ultra-violet rays generator was started) and a case where ultra-violet rays were not irradiated to nitrogen gas (when the ultra-violet generator 203 was not started). The measurement was carried out with a surface voltmeter.

TABLE 6

| | (1) Ultra-violet ray irradiated | | (2) Ultra-violet ray not irradiated | |
| --- | --- | --- | --- | --- |
| | Before drying | After drying | Before drying | After drying |
| Surface Voltage (kV) | 4.5–4.9 | 0.012–0.031 | 4.4–4.9 | 5 or more |

Namely as shown in Table 6, when ultra-violet was not irradiated as in the conventional type of drying method, the surface voltage of silicon in a range from 4.4 to 4.9 kV measured just after cleaning increased to 5 kV or more after drying by means of blowing nitrogen gas thereto. On the other hand, when ultra-violet rays were irradiated according to the present invention, the surface voltage of the silicon just after cleaning was in a range from 4.5 to 4.9 kV, but the surface voltage dropped to 0.031 kV or less after drying by blowing nitrogen gas subjected to irradiation of ultra-violet rays thereto. Namely it can be understood that drying by blowing nitrogen gas subjected to irradiation of ultra-violet rays are effective in removing static electricity, and does not generate static electricity during the drying process. Also when a silicon wafer was dried with nitrogen gas subjected to irradiation of ultra-violet rays, moisture on the silicon wafer was completely removed, and no impure particle was deposited on the silicon wafer. The above result indicates that it is possible to dry an object without leaving a liquid to be removed at all, without causing deposition of any impurity other than the liquid to be dried off, and also without generating static electricity by using the drier according the present invention.

In this embodiment nitrogen gas was used as the specified gas to be supplied from the gas supply means, but also argon gas, which is inactive, like the nitrogen gas, to the object 209 to be dried, may be used, and the same effect can be achieved also by using other gas. Furthermore description of the present embodiment assumes a case where a flow rate of the gas is set to 100 l/min, but other flow rate is allowable. However when taking into considerations the drying efficiency, it is preferable to dry an object at a flow rate of 50 to 150 l/min. Also it is preferable that a concentration of moisture in the used gas is less than 1 ppm and that of oxygen less than 10 ppm.

Also in the present invention as both positive and negative ions are generated by electrolytically dissociating gas, also static electricity can be removed even from an object having a negative surface voltage as the PFA tool. In addition, the above description of this embodiment assumes use of a deuterium lamp as the ultra-violet rays generator 203, but any light source may be used on the condition that the light has high energy enough to electrolytically dissociate gas used for that purpose, and for instance, the same effect can be achieved by using a low voltage mercury lamp.

Also the above description of this embodiment assume a case where gas is supplied under normal temperature, but the drying efficiency can be raised by using the first heating means making use of electric power for heating gas (up to, for instance, 200° C.). Also the drying efficiency may be raised by using a second heating means making use of, for instance, infrared ray.

FIG. 12-2 is a drawing illustrating the third embodiment of the present invention.

In this embodiment, nitrogen gas is directly blown to the object 209 to be dried through the injection nozzle 207b branched from the nitrogen gas supply piping 202a in the second embodiment above in the upstream side from the ultra-violet rays irradiating section. The remaining portions in this configuration are the same as those in the second embodiment, so that detailed description thereof is not provided herein.

The device according to this embodiment has the configuration as described above, it is possible to execute main drying by blowing a large quantity of gas from the injection nozzle 207b to the wafer 209 and remove static electricity in the wafer 209 using the nozzle 207a supplementally, if required.

Also ions generated as described above are blown to the object 9 to be dried, it is possible to dry the object 209 without causing generation of static electricity like in the second embodiment.

Table 7 shows a result of measurement of surface voltage in silicon wafers when the silicon wafers were dried with the device shown in FIG. 12-3.

The silicon wafers were of the same type as that in the second embodiment, and were subjected to the same preprocessing, the same overflow rising with ultra pure water as those in the second embodiment before start of testing. Also the silicon wafer as an object to be dried was set on a wafer fixing tool made of PFA like in the second embodiment.

A flow rate of nitrogen gas injected from the gas injection nozzle 207a was set to 10 l/min, the injection time was 2 minutes, and the clearance between the nozzle and the wafer was 50 mm. Also a flow rate of nitrogen gas injected from another gas injection nozzle 207b was set to 90 l/min, the injection time was 2 minutes, and the clearance between the nozzle and the wafer was 50 mm.

A 500 W deuterium lamp was used as the ultra-violet rays generator 203, and the space between the deuterium lamp and the ultra-violet Irradiating section 204 was purged with nitrogen gas. A concentration of moisture in the used nitrogen gas was less than 1 ppb, while that of oxygen was less than 1 ppb.

TABLE 7

|  | (1) Ultra-violet ray irradiated | | (2) Ultra-violet ray not irradiated | |
| --- | --- | --- | --- | --- |
|  | Before drying | After drying | Before drying | After drying |
| Surface Voltage (kV) | 4.5–4.8 | 0.012–0.028 | 4.6–4.9 | 5 or more |

As shown in Table 7, when ultra-violet rays were not irradiated like in the conventional type of drying method, surface voltage of silicon wafers measured just after cleaning was in a range from 4.5 to 4.9 kV, while that measure after drying by means of nitrogen gas injection was higher than 5 kV. On the other hand, when surface voltage of silicon wafers measured just after cleaning was in a range from 4.5 to 4.8 kV in a case where ultra-violet rays were irradiated according to the present invention, and that measured after drying with nitrogen gas subjected to irradiation of ultra-violet rays were 0.028 kV or less. Namely like in the second embodiment, drying according to this embodiment is excellent in removing static electricity, and it is possible to completely remove moisture on an object to be dried without generating static electricity during drying and also without causing absorption of impurities.

On the basic of the result described above, it may be said that it is possible also in this embodiment to dry an object to be dried removing static electricity therefrom without leaving a liquid to be dried away or any particle deposited thereon like in the second embodiment.

FIG. 12-4 is a drawing illustrating the fourth embodiment of the present invention.

In this embodiment, the branch piping 202c branched from the nitrogen gas supply piping 202a shown in the second embodiment in the upstream side from the ultra-violet rays irradiating section 204 is connected and joined to the ionized gas supply piping 205. The remaining portions of the configuration are the same as those in the second embodiment.

As the device according to this embodiment as the configuration as described above, it is possible like in the third embodiment to divide gas to a portion available for removal of static electricity and another portion available mainly for drying and also to more efficiently execute removal of static electricity as well as drying when the two portions are joined again.

Table 8 shows a result of measurement of surface voltage in silicon wafers when the silicon wafer were dried with the device shown in FIG. 12-4.

In this embodiment, a flow rate of nitrogen gas flowing into the ultra-violet irradiating section 204 was set to 10 l/min, and a flow rate of nitrogen gas supplied through another nitrogen gas supply piping 20c branching from the nitrogen gas supply piping 202a into the ionized gas supply piping 205 was set to 90 l/min.

For this reason, a flow rate of gas injected from the gas injection nozzle 207a was 100 l/min, the injection time was 2 minutes, and the clearance between the nozzle and the wafer was 50 mm.

TABLE 8

|  | (1) Ultra-violet ray irradiated | | (2) Ultra-violet ray not irradiated | |
| --- | --- | --- | --- | --- |
|  | Before drying | After drying | Before drying | After drying |
| Surface Voltage (kV) | 4.3–4.8 | 0.014–0.030 | 4.6–4.9 | 5 or more |

With the invention, it is possible to form an oxide film which is excellent in the insulating capability and has a high reliability on a surface of a substrate. The method according to the present invention and having the feature as described above make it possible to realize an ultra fine semiconductor device.

Also semiconductor devices having excellent characteristics can be obtained by using an oxide film according to the present invention as various insulating films (such as a gate insulating film) for MOS transistor. Furthermore it is possible to reduce a thickness of an insulating film in various types of device, and it is also possible to form the oxide film according to the present invention into a tunnel insulating film.

With the invention, the gas drier according to the invention for blowing a specified gas to an object to be dried has an irradiating means for irradiating ultra-violet rays to at least a portion of the gas, and for this reason it is possible to provide a gas drier which can realize a drier which eliminates deposition of particles on an object to be dried without leaving a liquid to be dried at all on the object, without causing any denaturing of the surface of the object to be dried such as growth of a natural oxide film, and also without generating static electricity.

With the invention, at least a portion of the foregoing gas is directed to an object to be dried through a piping body with at least the internal surface coated with Insulating material, it is possible to efficiently blow electrolytically dissociated gas to the object to be dried.

With the invention, inert gas which is inactive at least to the object to be dried is sued as the specified gas described above, it is possible to more efficiently prevent denaturing of a surface of an object to be dried such a growth of a natural oxide film thereon.

With the invention, nitrogen gas easily available in its high purity form is used as the inert gas, it is possible to prevent cost increase.

With the invention, argon gas which can easily be dissociated electrolytically is used as the inert gas, the gas is effective to any type of object to be dried because of its inactivity.

With the invention, a concentration of oxygen in the specified gas is less than 10 ppm and that of moisture is less than 1 ppm, so that ultra-violet rays irradiated to the gas are not used in a reaction to generate ozone and the efficiency in drying an object to be dried becomes advantageously higher.

With the invention, ultra-violet rays are irradiated through a transmissive member made of synthetic quartz having a high ultra-violet ray transmission to the specified gas, so that ultra-violet rays generated from the ultra-violet ray generator are effectively irradiated to the specified gas, and also the gas is efficiently ionized.

With the invention, the specified gas is heated by the first heating means, so that the drying efficiency when the gas is flown onto an object to be dried becomes higher, which is more advantageous.

With the invention, the specified gas is heated by the second heating means, so that the drying efficiency when the gas is flown onto an object to be dried becomes higher, which is more advantageous.

With the invention, it is possible to prevent a sample from being electrified in a process for a ultra high density integration, which in turn makes it possible to realize ultra high density ultra high processing speed LSIs.

With the invention, even if an object to be processed is electrified during transfer through a vessel, the electric charge is neutralized, and it is possible to prevent deposition of particles on the object to be processed and also to prevent yield in the processing from dropping.

With the invention, it is possible to supply electrolytically dissociated gas at a high efficiency to an object to be processed.

With the invention, electric charge in an object to be heated or inner core tube can easily be neutralized, so that, when applied to a thermally oxidizing furnace treatment apparatus, it is possible to form an excellent oxide film having a high reliability on a solid surface. For this reason, typically it is possible to realize a high quality semiconductor manufacturing process and also to produce an ultra fine semiconductor device.

Also when the device according to the present invention is used as a heat treatment apparatus for various types of semiconductor substrate (such as a silicon wafer) or a thin film (such as a CVD thin film), it is possible to obtain a semiconductor device having excellent characteristics.

With the invention, the electrically charged particle flow irradiating device according to the invention has a means for irradiating ultra-violet rays to gas introduced into the device, so that it is possible to prevent a sample from being electrified during surface analysis or ultra high density integration process thereof, and for this reason it is possible to realize high resolution surface analysis or ultra high density/ultra high processing speed LSIs.

With the invention, it is possible to efficiently use ions or electrons generated due to irradiation of ultra-violet rays for neutralization of electric charge, in an object to be subjected to irradiation of ultra-violet rays.

With the invention, the electrically charged particle flow irradiating device according to the invention can be applied to typical SEM or EB, which can contribute to substantial development of semiconductor manufacturing process.

With the invention, as a light projecting means for irradiating ultra-violet rays to gas introduced into a depressurizable vessel, it is easy to generate plasma, and also it is possible to prevent deposition of particles generated in the vessel while the plasma is being generated, so that it is possible to manufacture high processing speed LSIs as well as to realize improvement in reliability and yield thereof.

With the invention, it is possible to realize an electrostatic absorber which can execute absorption and desorption accurately in safety manner, and also the electrostatic absorber according to the present invention is based on a simple construction, and can be utilized in a wide range of industrial field including general transfer devices, printing machines, and industrial robots, but especially with the present invention it is possible to provide an electrostatic absorber which can be applied to a process for manufacturing such devices as high performance semiconductor devices.

With the invention, it is possible to easily and accurately measure the interatomic force even if an object to be measures is made of dielectric materials.

With the invention, it is possible to prevent a sample from being electrified during a process of surface analysis or ultra high density integration, and for this reason it is possible to carry out precise elemental analysis or analysis of chemical bond between atoms as well as to realize ultra high density/ultra high speed LSIs.

With the invention, the device according to the present invention for cleaning or drying an object to be processed has a section, where at least an object to be processed contact a chemical liquid or ultra pure water used for cleaning, having a function to interrupt light, so that the object to be processed such as a semiconductor is not excited by energy of light, and for this reason it is possible to effectively remove impurities on a surface of the object to be processed such as a semiconductor without causing deposition of electrons coming out from the surface of the object to be processed due to irradiation of light or other impurities from holes.

Furthermore with the invention, the device for cleaning or drying an object to be processed according to the present invention has a vessel in which atmosphere can be substituted with other gas as well as a function to supply inert gas into said vessel and a function to supply ultra pure water containing dissolvedoxygen at a reduced level also into said vessel, so that it is possible to obtain a cleaner which can effectively remove impurities on a surface of the object to be processed without causing denaturing of the object to be processed such as growth of a natural oxide film on the surface.

With the invention, as a section, where at least an object to be processed contacts a chemical liquid or ultra pure water used for cleaning, is provided in a vessel in which said atmosphere can be substituted with other gas, the invention is more effective for obtaining a cleaner which can effectively remove impurities on a surface of the object to be processed without causing denaturing of the object to be processed such as growth of a natural oxide film on the surface thereof.

With the invention, as a section for finally cleaning an object to be processed with ultra pure water and drying ultra pure water deposited on the surface thereof is provided in a vessel in which atmosphere can be substituted with other gas, it is possible to obtain a more effective cleaner which can effectively remove impurities deposited on a surface of the object to be processed without causing denaturing of the object to be processed such as growth of a natural oxide on the surface thereof.

With the invention, as gas inert gas is nitrogen gas, so that running cost can substantially be reduced.

With the invention, as said inert gas is argon gas which is cheap and easily available like nitrogen gas, the running cost can substantially be reduced.

With the invention, as a concentration of oxygen in said inert gas is less than 1 ppm and that of dissolved oxygen in the ultra pure water containing said dissolved oxygen at a reduced level is less than 50 ppb, it is possible to obtain a more effective cleaner which can effectively remove impurities on a surface of the object to be processed without causing denaturing of the object to be processed such as growth of an oxide film on the surface thereof.

With the invention, as said light-shuttering means has a function to interrupt light having energy of 1.1 eV or more, so that an object to be processed is not excited by energy of light, and as a result it is possible to obtain a cleaner which can effectively remove impurities deposited on a surface of the object to be processed without causing deposition of electrons due to irradiation of light or impurities from holes on the surface thereof.

With the invention, said light-shuttering means has a function to interrupt light having energy of 3.4 eV or more, so that it is effective. Also with the invention, said light-shuttering means has a function to interrupt light having energy of 6.2 eV or more, so that it is more effective.

With the invention, the device according to the invention for cleaning or drying an object to be processed has a function to interrupt light in a section where at least the object to be processed contacts a chemical liquid or ultra pure water used for cleaning, so that the object to be processed is not excited by energy of light, and as a result it is possible to obtain a cleaner which can effectively remove impurities deposited on the surface of the object to be processed without causing deposition of electrons generated due to irradiation of light or impurities from holes on the surface thereof.

Furthermore the device according to the invention has a vessel in which atmosphere can be substituted with other gas as well as a function to supply inert gas into said vessel, so that it is possible to obtain a cleaner which can effectively remove impurities deposited on an object to be processed without causing denaturing of the object to be processed such as growth of a natural oxide film on the surface thereof.

In addition, the device according to the invention has a drying means for drying an object by blowing gas and an irradiating means for irradiating ultra-violet rays to at least a portion of said gas, so that it is possible to obtain a drier which can dry an object without leaving any liquid to be dried on the object to be dried at all, without causing denaturing of the object such as growth of a natural oxide on the surface thereof, without generating static electricity, and also without causing deposition of impurities.

With the invention, as a means for supplying ultra pure water containing dissolved oxygen at a reduced level is provided, It is possible to clean the surface reducing a denatured layer such as a one-layered oxide film.

With the invention, as a section where at least an object to be processed contacts a chemical liquid or ultra pure water used for cleaning is provided in a vessel in which said atmosphere can be substituted with other gas, it is possible to obtain a cleaner which can effectively remove impurities deposited on the surface of the object to be processed without causing denaturing of the object to be processed such as growth of a natural oxide film.

With the invention, as a section for finally cleaning an object to be processed with ultra pure water and drying the ultra pure water deposited on said object is provided in said vessel in which atmosphere can be substituted with other gas, it is possible to obtain a cleaner which can effectively remove impurities deposited or the surface of the object to be processed without causing denaturing of the object to be processed such as growth of a natural oxide film on the surface thereof.

With the invention, at least a portion of said gas is directed through a tube body with at least the internal surface made or insulating material to an object to be dried so that it is possible to efficiently blow electrolytically dissociated gas to the object to be dried.

With the invention, as said gas is nitrogen gas which is easily available, it is possible to evade cost increase.

With the invention, as said gas is argon gas which can easily be dissociated electrolytically, the gas is inactive to any type of object to be dried.

With the invention, as a concentration of oxygen in said gas is less than 10 ppm and that of moisture is less than 1 ppm, so that irradiated ultra-violet rays are not used in a reaction for generating ozone, and for this reason the efficiency in drying an object becomes higher, which is more preferable.

With the invention, as irradiation of ultra-violet rays are carried out through a transmissive member made of synthetic quartz having a high ultra-violet ray transmission to said gas, ultra-violet rays generated from the ultra-violet rays generator is effectively irradiated to said specified gas, and for this reason the gas is efficiently ionized.

With the invention, said light-shuttering means has a function to interrupt light having energy of 1.1 eV or more, so that an object to be processed is not excited by light energy, and as a result it is possible to obtain a cleaner which can effectively remove impurities deposited on the surface of the object to be processed without causing deposition of electrons generated due to irradiation of light or other impurities from holes on the surface thereof.

With the invention, as said light-shuttering means has a function to interrupt light having energy of 3.4 eV or more, said means is more effective. Also with the invention, as the aforesaid light-shuttering means has a function to interrupt light having energy of 6.2 ev or more, the means is more effective.

With the invention, said specified gas is heated by a first heating mears, so that the drying efficiency when gas is flown to an object to be dried becomes higher, which is more preferable.

With the invention, said object to be dried is heated by a second heating means, so that the drying efficiency when gas is flown to the object to be dried becomes higher, which is more preferable

What is claimed is:

1. A method of forming an oxide film comprising:
   a first step to form a first oxide film on a surface of a substrate body by contacting at least one of oxygen or, molecules including oxygen, or a mixture of oxygen and molecules including oxygen and inert gas each in a gas phase, or a solution containing oxygen and molecules including oxygen to the surface of the substrate body on which on oxide film is to be formed;
   a second step of heating the surface of the substrate body and the oxide film in one of a gas phase of an inert gas or in vacuum; and
   a third step to form a second oxide film having a thickness larger than said first oxide film formed on the substrate body by strengthening bonding between atoms constituting the surface of the substrate and oxygen in said first oxide film by means of thermally processing the surface of said substrate body and said first oxide film under a temperature higher than that in said first step in at least one of oxygen, molecules including oxygen, or a mixture of oxygen and molecules including oxygen and inert gas, each being in a gas phase.

2. A method of forming an oxide film according to claim 1, wherein at least one of said first step and said third step are carried out in an atmosphere of at least one of oxygen, molecules including oxygen, a mixture of oxygen and molecules including oxygen and inert gas each in gas phase, or by irradiating light having energy of 1.5 eV or more toward the surface of said substrate body.

3. A method of forming an oxide film according to claim 2, wherein at least one of said first step and said third step are carried out in an atmosphere of at least one of oxygen, a mixture of molecules including oxygen and inert gas, each in gas phase, or by irradiating light having energy of 6.2 eV or more toward the surface of said substrate body.

4. A method of forming an oxide film according to claim 1, wherein said first step is carried out by contacting said solution to a catalyst which promotes decomposition of at least one of oxygen or molecules including oxygen contained in said solution.

5. A method of forming an oxide film according to claim 1, wherein said molecules including oxygen are of at least one type or more selected from a group comprising ozone, moisture, hydrogen peroxide, dinitrogen monoxide, nitrogen monoxide, and nitrogen dioxide.

6. A method of forming an oxide film according to claim 1, wherein said inert gas is nitrogen, argon, or a mixture thereof.

7. A method of forming an oxide film according to claim 1, wherein the temperature of the substrate body in said first step is in a range from 0 to 600° C.

8. A method of forming an oxide film according to claim 7, wherein the temperature of the substrate body in said first step is in a range from 0 to 500° C.

9. A method of forming an oxide film according to claim 8, wherein the temperature of the substrate body in said first step is in a range from 0 to 300° C.

10. A method of forming an oxide film according to claim 9, wherein the temperature of the solution in said first step is in a range from 0 to 100° C.

11. A method of forming an oxide film according to claim 1, wherein the temperature for heat treatment in said third step is 1200° C. or less.

12. A method of forming an oxide film according to claim 11, wherein the temperature for heat treatment in said third step is in a range from 500 to 1150° C.

13. A method of forming an oxide film according to claim 12, wherein the temperature for heat treatment in said third step is in a range from 800 to 1150° C.

14. A method of forming an oxide film according to claim 1, wherein the total quantity of oxygen, molecules including oxygen, or a mixture of oxygen and molecules including oxygen in gas phase of inert gas in at least one of said first step and said third step is less than 1 ppm.

15. A method of forming an oxide film according to claim 1, wherein the total partial pressure of oxygen, molecules including oxygen, or a mixture of oxygen and molecules including oxygen in vacuum in at least one of said first step and said third step is less than $7.6 \times 10^{-4}$ Torr or less.

16. A method of forming an oxide film according to claim 1, wherein the surface of the substrate body, on which an oxide film is to be formed, comprises a semiconductor.

17. A method of forming an oxide film according to claim 16, wherein the semiconductor is made of silicon.

18. A method of forming an oxide film according to claim 1, wherein a surface of the substrate body, on which an oxide film is to be formed, comprises metal, alloy or metallic silicide.

* * * * *